(12) United States Patent
Fillingim et al.

(10) Patent No.: US 8,429,436 B2
(45) Date of Patent: Apr. 23, 2013

(54) APPARATUS, SYSTEM, AND METHOD FOR POWER REDUCTION IN A STORAGE DEVICE

(75) Inventors: Jeremy Fillingim, Salt Lake City, UT (US); John Strasser, Syracuse, UT (US); Jonathan Thatcher, Liberty Lake, UT (US)

(73) Assignee: Fusion-io, Inc., Salt Lake City, UT (US)

( * ) Notice: Subject to any disclaimer, the term of this patent is extended or adjusted under 35 U.S.C. 154(b) by 312 days.

(21) Appl. No.: 12/878,987

(22) Filed: Sep. 9, 2010

(65) Prior Publication Data
US 2011/0060927 A1 Mar. 10, 2011

Related U.S. Application Data

(60) Provisional application No. 61/240,991, filed on Sep. 9, 2009, provisional application No. 61/245,622, filed on Sep. 24, 2009, provisional application No. 61/368,564, filed on Jul. 28, 2010.

(51) Int. Cl.
*G06F 1/26* (2006.01)
*G06F 9/28* (2006.01)

(52) U.S. Cl.
USPC ........... 713/320; 713/300; 713/324; 711/100; 711/105; 711/154

(58) Field of Classification Search .................. 713/300, 713/320, 324; 711/100, 105, 154
See application file for complete search history.

(56) References Cited

U.S. PATENT DOCUMENTS

| | | |
|---|---|---|
| 4,980,861 A | 12/1990 | Herdt et al. |
| 5,799,200 A | 8/1998 | Brant et al. |
| 6,278,633 B1 | 8/2001 | Wong et al. |
| 6,336,174 B1 | 1/2002 | Li et al. |
| 6,404,647 B1 | 6/2002 | Minne' |
| 6,412,080 B1 | 6/2002 | Fleming et al. |
| 6,515,928 B2 | 2/2003 | Sato et al. |
| 6,552,955 B1 | 4/2003 | Miki |
| 6,608,793 B2 | 8/2003 | Park et al. |
| 6,633,956 B1 | 10/2003 | Mitani |
| 6,735,546 B2 | 5/2004 | Scheuerlein |
| 6,751,155 B2 | 6/2004 | Gorobets |
| 6,760,806 B2 | 7/2004 | Jeon |

(Continued)

FOREIGN PATENT DOCUMENTS

| | | |
|---|---|---|
| GB | 0123416.0 | 9/2001 |
| WO | 2010053756 | 5/2010 |

OTHER PUBLICATIONS

PCT/US2010/048321, International Search Report, Apr. 28, 2011.
PCT/US2010/048320, International Search Report, Apr. 28, 2011.

(Continued)

*Primary Examiner* — Vincent Tran
(74) *Attorney, Agent, or Firm* — Jeffrey T. Holman

(57) ABSTRACT

An apparatus, system, and method are disclosed for managing power consumption in a data storage device. An audit module monitors a power consumption rate of the data storage device relative to a power consumption target. A throttle module adjusts execution of one or more operations on the data storage device in response to the power consumption rate of the data storage device failing to satisfy the power consumption target. A verification module verifies whether the power consumption rate of the data storage device satisfies the power consumption target in response to adjusting the execution of the one or more operations.

22 Claims, 14 Drawing Sheets

U.S. PATENT DOCUMENTS

| | | | |
|---|---|---|---|
| 6,845,053 B2 | 1/2005 | Chevallier | |
| 6,849,480 B1 | 2/2005 | Low et al. | |
| 6,887,058 B2 | 5/2005 | Fujiwara | |
| 7,042,664 B2 | 5/2006 | Gill et al. | |
| 7,057,936 B2 | 6/2006 | Yaegashi et al. | |
| 7,064,994 B1 * | 6/2006 | Wu | 365/211 |
| 7,167,944 B1 | 1/2007 | Estakhri | |
| 7,177,197 B2 | 2/2007 | Cernea | |
| 7,215,580 B2 | 5/2007 | Gorobets | |
| 7,227,777 B2 | 6/2007 | Roohparvar | |
| 7,257,129 B2 | 8/2007 | Lee et al. | |
| 7,263,591 B2 | 8/2007 | Estakhri et al. | |
| 7,340,558 B2 | 3/2008 | Lee et al. | |
| 7,340,581 B2 | 3/2008 | Gorobets et al. | |
| 7,424,593 B2 | 9/2008 | Estakhri et al. | |
| 7,441,090 B2 | 10/2008 | Estakhri et al. | |
| 7,460,432 B2 | 12/2008 | Warner | |
| 7,463,521 B2 | 12/2008 | Li | |
| 7,777,652 B2 | 8/2010 | Lee et al. | |
| 7,908,501 B2 | 3/2011 | Kim et al. | |
| 7,944,762 B2 | 5/2011 | Gorobets | |
| 8,001,334 B2 | 8/2011 | Lee | |
| 8,055,922 B2 * | 11/2011 | Brittain et al. | 713/320 |
| 2002/0066047 A1 * | 5/2002 | Olarig et al. | 713/323 |
| 2003/0126475 A1 * | 7/2003 | Bodas | 713/300 |
| 2005/0246558 A1 * | 11/2005 | Ku | 713/300 |
| 2006/0059326 A1 | 3/2006 | Aasheim et al. | |
| 2006/0106990 A1 | 5/2006 | Benhase et al. | |
| 2006/0149916 A1 | 7/2006 | Nase | |
| 2006/0184736 A1 | 8/2006 | Benhase et al. | |
| 2006/0230295 A1 | 10/2006 | Schumacher et al. | |
| 2006/0265624 A1 | 11/2006 | Moshayedi et al. | |
| 2007/0168698 A1 | 7/2007 | Coulson et al. | |
| 2007/0230253 A1 | 10/2007 | Kim | |
| 2007/0233938 A1 | 10/2007 | Cho et al. | |
| 2007/0234021 A1 | 10/2007 | Ruberg et al. | |
| 2007/0245094 A1 | 10/2007 | Lee et al. | |
| 2007/0274150 A1 | 11/2007 | Gorobets | |
| 2008/0052483 A1 | 2/2008 | Rangarajan et al. | |
| 2008/0059820 A1 | 3/2008 | Vaden et al. | |
| 2008/0080243 A1 | 4/2008 | Edahiro et al. | |
| 2008/0104344 A1 | 5/2008 | Shimozono et al. | |
| 2008/0117686 A1 | 5/2008 | Yamada | |
| 2008/0126686 A1 | 5/2008 | Sokolov et al. | |
| 2008/0266973 A1 | 10/2008 | Sekar et al. | |
| 2008/0301475 A1 * | 12/2008 | Felter et al. | 713/300 |
| 2009/0037778 A1 * | 2/2009 | Resnick | 714/48 |
| 2009/0091979 A1 | 4/2009 | Shalvi | |
| 2009/0091996 A1 | 4/2009 | Chen et al. | |
| 2009/0150621 A1 | 6/2009 | Lee | |
| 2010/0102999 A1 | 4/2010 | Lee et al. | |
| 2010/0106917 A1 | 4/2010 | Ruberg et al. | |
| 2010/0153680 A1 * | 6/2010 | Baum et al. | 711/173 |
| 2010/0257304 A1 | 10/2010 | Rajan et al. | |
| 2010/0262738 A1 | 10/2010 | Swing et al. | |
| 2010/0262740 A1 | 10/2010 | Borchers et al. | |
| 2010/0262757 A1 | 10/2010 | Sprinkle et al. | |
| 2010/0262758 A1 | 10/2010 | Swing et al. | |
| 2010/0262759 A1 | 10/2010 | Borchers et al. | |
| 2010/0262760 A1 | 10/2010 | Swing et al. | |
| 2010/0262761 A1 | 10/2010 | Borchers et al. | |
| 2010/0262762 A1 | 10/2010 | Borchers et al. | |
| 2010/0262766 A1 | 10/2010 | Sprinkle et al. | |
| 2010/0262767 A1 | 10/2010 | Borchers et al. | |
| 2010/0262773 A1 | 10/2010 | Borchers et al. | |
| 2010/0262894 A1 | 10/2010 | Swing et al. | |
| 2010/0262979 A1 | 10/2010 | Borchers et al. | |
| 2010/0268974 A1 * | 10/2010 | Floyd et al. | 713/340 |
| 2010/0332871 A1 * | 12/2010 | Allalouf et al. | 713/320 |
| 2011/0208911 A1 * | 8/2011 | Taguchi et al. | 711/114 |

OTHER PUBLICATIONS

Leventhal, Adam, Flash Storage Memory, Communications of the ACM, vol. 51, No. 7, Jul. 2008.

Notice of Allowance, U.S. Appl. No. 12/878,981, Jun. 25, 2012.

\* cited by examiner

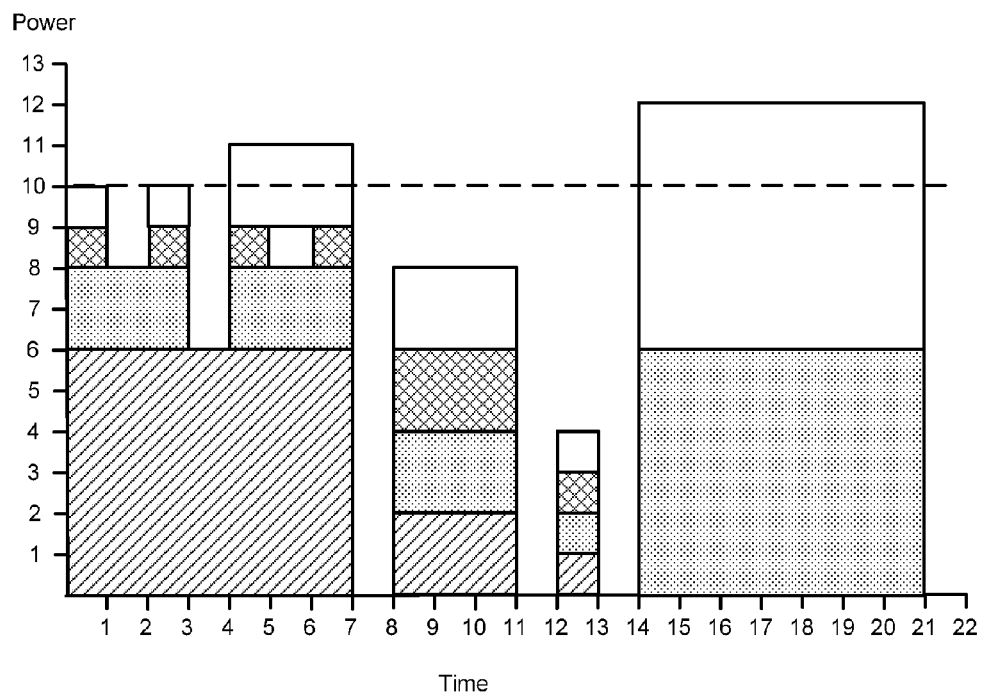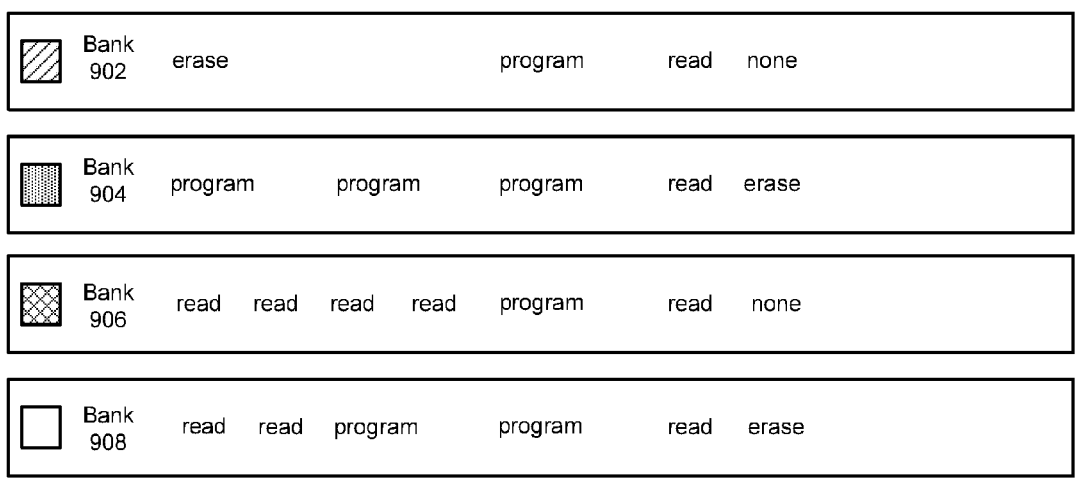
Fig. 9

|  |  |  |  |  |  |  | Quantum |
|---|---|---|---|---|---|---|---|
|  |  |  |  |  |  |  | Quantum |
|  |  |  |  |  |  |  | 1 |

Read
1012

| Quantum |  |  |  |  |  |  |  |
|---|---|---|---|---|---|---|---|
| Quantum |  |  |  |  |  |  |  |
| Quantum |  |  |  |  |  |  |  |
| Quantum | Quantum | Quantum |  |  |  |  | Quantum |
| Quantum | Quantum | Quantum |  |  |  |  | Quantum |
| Quantum | Quantum | Quantum |  |  |  |  | Quantum |
| Quantum | Quantum | Quantum |  |  |  |  | Quantum |
| Quantum | Quantum | Quantum | Quantum | Quantum |  |  | Quantum |
| Quantum | Quantum | Quantum | Quantum | Quantum |  |  | Quantum |
| Quantum | Quantum | Quantum | Quantum | Quantum |  |  | Quantum |
| Quantum | Quantum | Quantum | Quantum | Quantum | Quantum | Quantum | Quantum |
| Quantum | Quantum | Quantum | Quantum | Quantum | Quantum | Quantum | Quantum |
| 1 | 2 | 3 | 4 | 5 | 6 | 7 | 8 |

Erase
1010

Fig. 10

APPARATUS, SYSTEM, AND METHOD FOR POWER REDUCTION IN A STORAGE DEVICE

CROSS-REFERENCES TO RELATED APPLICATIONS

This application claims priority to U.S. Provisional Patent Application No. 61/240,991 entitled "APPARATUS, SYSTEM, AND METHOD FOR POWER REDUCTION IN A SOLID-STATE STORAGE DEVICE" and filed on Sep. 9, 2009 for Lance L. Smith, et al., to U.S. Provisional Patent Application No. 61/245,622 entitled "APPARATUS, SYSTEM, AND METHOD FOR POWER REDUCTION IN A SOLID-STATE STORAGE DEVICE" and filed on Sep. 24, 2009 for Lance L. Smith, et al., and to U.S. Provisional Patent Application No. 61/368,564 entitled "APPARATUS, SYSTEM, AND METHOD FOR WRITING DATA TO STORAGE MEDIA IN A SINGLE ATOMIC OPERATION" and filed on Jul. 28, 2010 for David Flynn, et al., each of which are incorporated herein by reference.

BACKGROUND

1. Field of the Invention

This invention relates to reducing power usage in solid state storage devices and more particularly relates to ensuring that power consumption does not exceed specified parameters.

2. Description of the Related Art

Power usage matters a great deal in computing devices, and in a number of different contexts. In one context, most devices have specified power use thresholds that should not be crossed, or the device may be damaged. Certain systems may be physically configured to use multiple devices, but be unable to supply power to those devices under all conditions without doing damage.

For example, many computing systems (such as servers, laptops, desktops, etc) provide a Peripheral Component Interface (PCI) or PCI-express (PCI-e) that complies with a PCI specification. The PCI specification prescribes a minimum amount of power that the system must provide. Many systems offer a number of PCI slots for various components, but are designed with the assumption that no user will fully occupy the slots with devices that all consume the maximum amount of power permitted under the PCI specification. If a user were to insert multiple devices into the PCI slots that consume maximum power, the system may not function properly; either the devices may not receive the power they need, or the system may provide more power than it is designed to supply, risking serious damage to the devices and/or the system as a whole.

In other situations, reducing power can be a valuable way to improve battery life; batteries generally have not kept pace with the increasing power requirements of computing systems such as laptops, mobile phones, and others. In certain situations, a user may want to reduce the performance of the device in order to save power. In addition, certain components may provide functions that are very important to the user at a particular time, while others are not. For example, a good wireless connection may matter more to a user on the Internet than performance of storage on the device.

In short, users may need certain components to operate at less than their full potential in order to save power. The reasons the power savings are needed may vary, as described above.

SUMMARY

From the foregoing discussion, it should be apparent that a need exists for an apparatus, system, and method that manages power consumption for a storage device. Beneficially, such an apparatus, system, and method may also manage a thermal state for a storage device.

The present invention has been developed in response to the present state of the art, and in particular, in response to the problems and needs in the art that have not yet been fully solved by currently available power management techniques. Accordingly, the present invention has been developed to provide an apparatus, system, and method for managing power consumption that overcome many or all of the above-discussed shortcomings in the art.

A method of the present invention is presented for managing power consumption in a data storage device. In one embodiment, the method includes monitoring a power consumption rate of a data storage device relative to a power consumption target. The method, in another embodiment, includes adjusting execution of one or more operations on the data storage device in response to the power consumption rate of the data storage device failing to satisfy the power consumption target. The method, in a further embodiment, includes verifying whether the power consumption rate of the data storage device satisfies the power consumption target in response to adjusting the execution of the one or more operations.

The method, in one embodiment, includes readjusting execution of one or more subsequent operations on the data storage device in response to verifying that the power consumption rate fails to satisfy the power consumption target in response to adjusting the execution of the one or more operations. The power consumption target, in one embodiment, includes a power consumption ceiling defining an allowed upper bound for the power consumption rate of the data storage device. In one embodiment, the power consumption fails to satisfy the power consumption target when the power consumption rate approaches the power consumption ceiling.

In a further embodiment, the method includes monitoring a temperature for the data storage device relative to a thermal ceiling. In another embodiment, the method includes adjusting execution of the one or more operations on the data storage device in response to the temperature approaching the thermal ceiling. In one embodiment, the method includes verifying whether the temperature is moving away from the thermal ceiling in response to adjusting the execution of the one or more operations. The method, in another embodiment, includes combining the adjustment of execution of the one or more operations in response to the power consumption rate with the adjustment of execution of the one or more operations in response to the temperature into a single adjustment.

Adjusting execution of the one or more operations, in one embodiment, includes reducing a frequency with which the one or more operations execute on the data storage device. Reducing the frequency with which the one or more operations execute, in a further embodiment, includes setting a timer value specifying a frequency with which hardware of the data storage device polls to verify that an operation has completed. In one embodiment, the data storage device is a nonvolatile solid-state storage device and the timer value is a tPROG time specifying a period of time between submitting a program command to a memory area of the data storage device and submitting a status command to the same memory area of the data storage device to verify that execution of the program command has completed. In another embodiment, reducing the frequency with which the one or more operations execute includes setting a timer value specifying a frequency with which the one or more operations are submitted to the data storage device for execution.

The power consumption target, in one embodiment, includes a number of quanta that define an amount of energy to be used during a period of time. The one or more operations on the data storage device, in a further embodiment, are assigned quanta based on an amount of energy used to perform an operation. Adjusting the execution of the one or more operations, in one embodiment, includes scheduling the one or more operations based on the assigned quanta. Each operation of the one or more operations, in one embodiment, is divided into time periods and each time period of the operation is assigned one or more quanta based on an amount of energy used to perform the operation during the time period.

Adjusting execution of the one or more operations, in one embodiment, includes selecting operations from one or more queues of operations to be executed. Selecting the operations, in one embodiment, is performed such that an amount of energy used to execute the selected operations satisfies the power consumption target.

A method of the present invention is also presented for managing a thermal state of a data storage device. In one embodiment, the method includes monitoring a temperature for the data storage device relative to a thermal ceiling. In another embodiment, the method includes adjusting execution of the one or more operations on the data storage device in response to the temperature approaching the thermal ceiling. In a further embodiment, the method includes verifying whether the temperature is moving away from the thermal ceiling in response to adjusting the execution of the one or more operations.

In another embodiment, the method includes readjusting execution of one or more subsequent operations on the data storage device. Readjusting execution of subsequent operations, in one embodiment, is in response to verifying that the temperature fails to move away from the thermal ceiling in response to adjusting the execution of the one or more operations.

The method, in a further embodiment, includes monitoring a power consumption rate of the data storage device relative to a power consumption target. The method, in one embodiment, includes adjusting execution of one or more operations on the data storage device in response to the power consumption rate of the data storage device failing to satisfy the power consumption target. In one embodiment, the method includes verifying whether the power consumption rate of the data storage device satisfies the power consumption target in response to adjusting the execution of the one or more operations. The method, in another embodiment, includes combining the adjustment of execution of the one or more operations in response to the temperature with the adjustment of execution of the one or more operations in response to the power consumption rate into a single adjustment.

Another method of the present invention is also presented for managing power consumption in a data storage device. In one embodiment, the method includes receiving a set of concurrent operations for execution on the data storage device, the concurrent operations each having an associated operation type. The method, in another embodiment, includes determining a type for at least two operations in the set of concurrent operations. In a further embodiment, the method includes scheduling two or more concurrent operations from the set of concurrent operations based on the type of each operation. Scheduling the concurrent operations, in one embodiment, is done such that a power consumption rate for the data storage device does not exceed a power consumption ceiling during concurrent execution of the two or more concurrent operations.

Scheduling the two or more concurrent operations, in one embodiment, includes scheduling a predefined number of operations of a predefined type for concurrent execution on the data storage device. In one embodiment, scheduling the two or more concurrent operations further includes delaying, for at least a predefined duration, execution of one or more concurrent operations of a predefined type in response to concurrently executing the predefined number of operations.

The predefined duration, in one embodiment, is less than an execution time for the predefined type of operation so that execution of the one or more operations overlaps execution of the predefined number of operations. In a further embodiment, no more than the predefined number of operations of the predefined type of operation begin execution on the data storage device at a time. The predefined type of operation, in one embodiment, includes an erase operation type on the data storage device. Execution of an operation of the erase operation type, in certain embodiments, consumes more power during the predefined duration than after the predefined duration.

A system of the present invention is also presented to manage power consumption in a plurality of data storage devices. The system may be embodied, in various embodiments, by a plurality of data storage devices, one or more audit modules, one or more throttle modules, and one or more verification modules.

The plurality of data storage devices, in one embodiment, receives electric power from a power source. The one or more audit modules, in one embodiment, are configured to monitor a power consumption rate of at least one of the plurality of data storage devices relative to a power consumption target. In a further embodiment, the one or more throttle modules are configured to adjust execution of operations on the plurality of data storage devices in response to the power consumption rate of the at least one of the plurality of data storage devices failing to satisfy the power consumption target. The one or more verification modules, in one embodiment, are configured to verify whether the power consumption rate of the at least one of the plurality of data storage devices satisfies the power consumption target in response to adjusting the execution of the operations.

In a further embodiment, the one or more throttle modules adjust execution of the operations substantially identically for each of the plurality of data storage devices in response to the power consumption rate of a single one of the plurality of data storage devices failing to satisfy the power consumption target. In another embodiment, the power consumption target is a system power consumption target for the plurality of data storage devices and the one or more throttle modules adjust execution of the operations on each of the plurality of data storage devices dynamically so that a total power consumption rate of the plurality of data storage devices satisfies the system power consumption target.

The one or more audit modules, in one embodiment, are further configured to monitor temperatures of the plurality of data storage devices relative to a thermal ceiling. The one or more throttle modules, in one embodiment, are further configured to adjust execution of the operations on a data storage device from the plurality of data storage devices in response to the temperature of the data storage device from the plurality of data storage devices approaching the thermal ceiling. The one or more verification modules, in one embodiment, are further configured to verify whether the temperature of the data storage device from the plurality of data storage devices is moving away from the thermal ceiling in response to adjusting the execution of the operations.

The one or more throttle modules, in a further embodiment, adjust execution of the operations substantially identically for each of the plurality of data storage devices in response to the power consumption rate of the at least one of the plurality of data storage devices failing to satisfy the power consumption target. In another embodiment, the one or more throttle modules adjust execution of the one or more operations independently for each individual data storage device of the plurality of data storage devices in response to the temperature of the corresponding individual data storage device approaching the thermal ceiling.

A system of the present invention is also presented to manage thermal states for a plurality of data storage devices. The system may be embodied, in various embodiments, by a plurality of data storage devices, one or more audit modules, one or more throttle modules, and one or more verification modules.

The one or more audit modules, in one embodiment, are configured to monitor a temperature of at least one of the plurality of data storage devices relative to a thermal ceiling. The one or more throttle modules, in one embodiment, are configured to adjust execution of operations on the plurality of data storage devices in response to the temperature of the at least one of the plurality of data storage devices approaching the thermal ceiling. The one or more verification modules, in one embodiment, are configured to verify whether the temperature of the at least one of the plurality of data storage devices is moving away from the thermal ceiling in response to adjusting the execution of the operations.

The one or more audit modules, in one embodiment, are further configured to monitor a power consumption rate of one or more of the plurality of data storage devices relative to a power consumption target. In another embodiment, the one or more throttle modules are further configured to adjust execution of the operations on the plurality of data storage devices in response to the power consumption rate of the one or more of the plurality of data storage devices failing to satisfy the power consumption target. The one or more verification modules, in one embodiment, are further configured to verify whether the power consumption rate of the one or more of the plurality of data storage devices satisfies the power consumption target in response to adjusting the execution of the operations.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which:

FIG. 9 is a diagram illustrating an approach to scheduling operations for improved power management;

FIG. 10 is a diagram illustrating an approach to describing operations in terms of energy and time;

DETAILED DESCRIPTION

Figure 1:
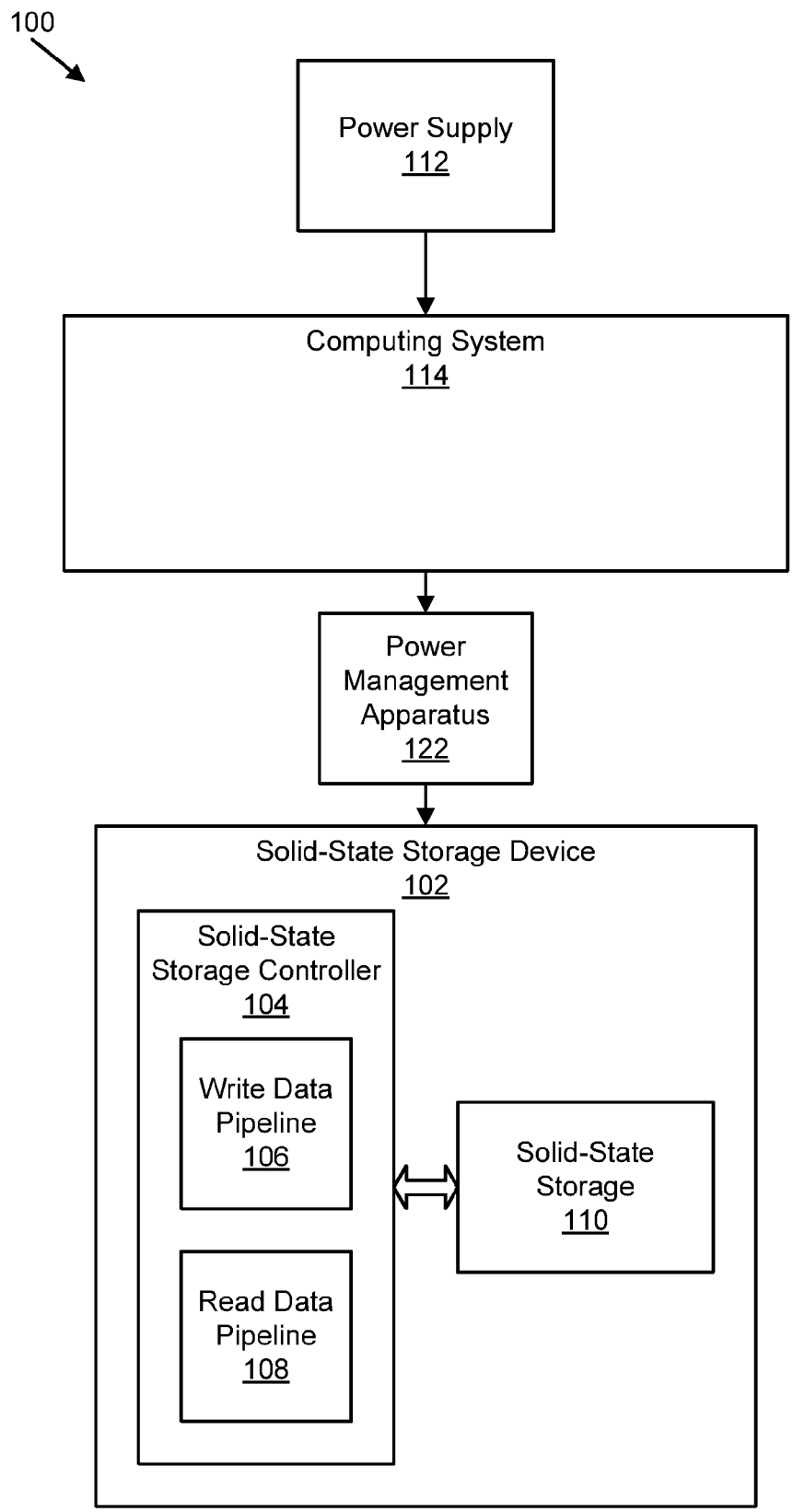
FIG. 1 is a schematic block diagram illustrating one embodiment of a system including a storage device with a power management apparatus.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention. These features and advantages of the present invention will become more fully apparent from the following description and appended claims, or may be learned by the practice of the invention as set forth hereinafter.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus. A computer readable medium may be embodied by a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

System for Reducing Storage Device Power Consumption

FIG. 1 depicts one embodiment of a system 100 for reducing power consumption in a storage device 102. In certain situations, it is beneficial to have a storage device 102 operate at less than full power due to constraints imposed by the system 100. In the depicted embodiment, the system 100 includes a power supply 112, a computing system 114, a power management apparatus 122, and a storage device 102. The computing system 114 may be a computer such as a server, laptop, desktop, a mobile device, or other computing device known in the art. The computing system 114 typically includes components such as memory, processors, buses, and other components as known to those of skill in the art.

The computing system 114 stores data in the storage device 102 and communicates data with the storage device 102 via a communications connection. The storage device 102 may be internal to the computing system 114 or external to the computing system 114. The communications connection may be a bus, a network, or other manner of connection allowing the transfer of data between the computing system 114 and the storage device 102. In one embodiment, the storage device 102 is connected to the computing system 114 by a PCI connection such as PCI express ("PCI-e"). The storage device 102 may be a card that plugs into a PCI-e connection on the computing system 114.

The power supply 112, in the depicted embodiment, provides electrical power to the computing system 114 and, through it, the storage device 102 and other components of the computing system 114. The power supply 110 may receive power from a standard electrical connection and transform the power received into one or more voltages that can be used by the computing system 114. The power supply 110 may be a battery or other power source used in computing systems 114. The power supply 110 may be internal or external to the computing system 114. Those of skill in the art, in view of this disclosure, will appreciate that there are a variety of different configurations and types of power supplies 110.

The storage device 102, in the depicted embodiment, receives electric power from the power supply 112 that provides the storage device 112 with power to perform data storage operations such as reads, writes, erases, etc. The storage device 102, in the depicted embodiment, receives the power from the power supply 112 over a power connection with the computing system 114. In certain embodiments, a power connection and the communications connection discussed above are part of the same physical connection between the computing system 114 and the storage device 102. For example, the storage device 102 may receive power over PCI, PCI-e, serial advanced technology attachment ("serial ATA" or "SATA"), parallel ATA ("PATA"), small computer system interface ("SCSI"), IEE 1394 ("FireWire"), Fiber Channel, universal serial bus ("USB"), PCIe-AS, or another connection with the computing system 114. In one embodiment, the computing system 114 distributes power from the power supply 112 through one or more slots, ports, or the like of a motherboard.

In other embodiments, the storage device 112 may connect to the power supply 112 directly, independently of a computing system 114. For example, the power supply 112 may be a power converter (often called a power brick), a power supply unit ("PSU") for the storage device 102, or the like. Those of skill in the art will appreciate, in view of this disclosure, that there are various ways by which a storage device 102 may receive power, and the variety of devices that can act as the power supply 112 for the storage device 102.

The storage device 102 provides nonvolatile storage for the computing system 114. FIG. 1 shows the storage device 102 as a nonvolatile solid-state storage device 102 comprising a solid-state storage controller 104, a write data pipeline 106, a read data pipeline 108, and nonvolatile solid-state storage media 110. The storage device 102 may contain additional components that are not shown in order to provide a simpler view of the storage device 102.

The solid-state storage media 110 stores data such that the data is retained even when the storage device 102 is not powered. Examples of solid-state storage media 110 include flash memory, nano random access memory ("NRAM"), magneto-resistive RAM ("MRAM"), dynamic RAM ("DRAM"), phase change RAM ("PRAM"), Racetrack memory, Memristor memory, and nanocrystal wire-based memory, silicon-oxide based sub-10 nanometer process memory, graphene memory, Silicon-Oxide-Nitride-Oxide-Silicon ("SONOS"), Resistive random-access memory ("RRAM"), programmable metallization cell ("PMC"), conductive-bridging RAM ("CBRAM"), and the like. While, in the depicted embodiment, the storage device 102 includes solid-state storage media 110, in other embodiments, the storage device 102 may include magnetic media such as hard disks, tape, and the like, optical media, or other nonvolatile data storage media. The storage device 102 also includes a storage controller 104 that coordinates the storage and retrieval of data in the solid-state storage media 110. The storage controller 104 may use one or more indexes to locate and retrieve data, and perform other operations on data stored in the storage device 102. For example, the storage controller 104 may include a groomer for performing data grooming operations such as garbage collection.

As shown, the storage device 102, in certain embodiments, implements a write data pipeline 106 and a read data pipeline 108, an example of which is described in greater detail below. The write data pipeline 106 may perform certain operations on data as the data is transferred from the computing system 114 into the solid-state storage media 110. These operations may include, for example, error correction code (ECC) generation, encryption, compression, and others. The read data pipeline 108 may perform similar and potentially inverse operations on data that is being read out of solid-state storage media 110 and sent to the computing system 114.

In one embodiment, the computing system 114 includes one or more other components in addition to the storage device 102, such as additional storage devices, graphics processors, network cards, and the like that also receive power from the power supply 112. Those of skill in the art, in view of this disclosure, will appreciate the different types of components that may be in a computing system 114. The components may be internal or external to the computing system 114. In one embodiment, some of the components may be PCI or PCI-e cards that connect to the computing system 114 and receive power through the computing system 114.

The system 100, in the depicted embodiment, also includes a power management apparatus 122. In certain embodiments, the power management apparatus 122 may be implemented as part of the storage controller 104. In further embodiments, the power management apparatus 122 may be, for instance, implemented as part of a software driver of the computing system 114, implemented in firmware for the storage device 102, or the like. In other embodiments, the power management apparatus 122 may be implemented partially in a software driver and partially in the storage controller 104, or the like.

As noted above, the computing system 114 may be configured to accept more components, such as storage devices 102, than the computing system 114 can provide power for under all conditions. The computing system 114 may not be able to provide sufficient power to a storage device 102 operating at or near full performance, or providing sufficient power may damage the computing system 114 and/or the power supply 112, especially if other components are also drawing power.

Other situations may arise in which it is important to tailor the performance of the storage device 102 or other computer components based on power considerations. In certain embodiments, the power management apparatus 122 manages a variety of states that correspond to various power conditions. One possible state is a power disruption state where the available power is reduced to an amount that can be provided by a secondary power supply, or the like. In this state, the power management apparatus 122 may perform power disruption or power failure management.

The power management apparatus 122, in one embodiment, monitors a power consumption rate of the storage device 102 relative to a power consumption target. In a further embodiment, the power management apparatus 122 adjusts execution of operations on the storage device 102 based on the power consumption rate. Adjusting execution of operations, such as throttling or slowing execution of operations, in one embodiment, reduces the power consumption rate of the storage device 102. In one embodiment, the power management apparatus 122 verifies whether the power consumption rate of the storage device 102 satisfies the power consumption target in response to adjusting execution of operations on the storage device 102. In another embodiment, the power management apparatus 122 manages and schedules execution of operations on the storage device 102 to stay within the power consumption target.

The power management apparatus 122, in one embodiment, references operations parameters, such as the power consumption target, that specify performance limitations on the storage device 102 and/or on other components. The performance limitations are related to power consumption of the storage device 102, or of other components. The parameters may be designed, coded, hard corded, and/or programmed directly into the power management apparatus 122, or may be sent to the power management apparatus 122 by the computing system 114 or by another power management apparatus 122. In one embodiment, the system 100 includes a plurality of power management apparatuses 122 for different components. In certain embodiments, the different power management apparatuses 122 share information with each other; in other embodiments, each power management apparatus 122 acts independently. One embodiment of a system with a plurality of power management apparatuses 122 is described below with regard to FIG. 5.

In certain embodiments, the power management apparatus 122 may dynamically adjust the power allocation for the storage device 102. The computing system 114 may dedicate more or less power to the storage device 102 at a particular time; for example, in the event that another component is a graphics card, there may be considerably less power available to the storage device 102 during graphics intensive operations. Similarly, more power may be available to the storage device 102 when the computing system 114 is not performing intensive graphics operations. The computing system 114 may thus dynamically change the allocation of power and send appropriate parameters to the power management apparatus 122. In certain embodiments, the computing system 114 includes software, firmware, hardware, or some combination thereof that is specifically tailored to determine how much power is available in the computing system 114.

The computing system 114, in one embodiment, may send a power consumption target and/or other power management information to the power management apparatus 122 over a communications channel, such as a PCI-e bus, a data network, or the like. In one embodiment, the power management apparatus 122 supports a protocol, an application programming interface ("API"), or the like for setting a power consumption target. The power consumption target, in one embodiment, is user configurable or selectable, through an interface on the computing system 114, an interface of the storage device 102, or the like.

In other embodiments, the power management apparatus 122 sets a power management plan or parameters without receiving parameters from the computing system 114. The power management apparatus 122 may dynamically adjust the power allocation to different elements within the storage device 110. For example, in one embodiment, the storage device 102 is a solid state storage device with multiple dual in-line memory modules ("DIMMs"). The power management apparatus 122 may have (or set) a particular power limit (such as 25 watts), which may also be referred to as a power budget, a power consumption target, or a power consumption ceiling, for the entire storage device 102 and may dynamically allocate power to remain within the constraints of the power budget. Thus, one DIMM performing a number of energy intensive operations may be allocated 20 watts while another DIMM is allocated 5 watts until the energy intensive operations are complete.

The power consumption target, as used herein, is the amount of power that a power supply system is configured to make available, and/or provide to the storage device 102 and/or other components supplied by the power supply system. In certain embodiments, the power consumption target is a power consumption ceiling, a maximum allowed upper bound for the power consumption rate of the storage device 102. In other embodiments, while the power consumption target is a maximum amount, the power supply 112 may permit uses of power over the maximum amount so long as the average power use falls below a power consumption target. In certain embodiments, the power consumption target is a single power value. In other embodiments, the power consumption target includes a baseline power, but allows for bursts and provides power restrictions on bursting. For example, these restrictions might include magnitude, duration, rise time, fall time, and the like. In a further embodiment, the power consumption target is a range of allowable power consumption rates, or the like. The power consumption target, in one embodiment, is defined as a value or range of values having a standard power metric unit, such as the watt ("W").

A power consumption rate of the storage device 102 or of another component, in various embodiments, may satisfy a power consumption target by falling away from the power consumption target, by being outside of a predefined range around the power consumption target, by being inside a predefined range around the power consumption target, and/or by having another predefined relationship with the power consumption target. Conversely, a power consumption rate, in various embodiments, may fail to satisfy a power consumption target by approaching the power consumption target, by exceeding the power consumption target, by being outside of a predefined range around the power consumption target, by being inside a predefined range around the power consumption target, and/or by having another predefined relationship with the power consumption target. One of skill in the art, in view of this disclosure, will recognize many possible types of power consumption targets, and corresponding ways that a power consumption rate can satisfy or fail to satisfy the different types of power consumption targets.

The computing system 114 may dynamically change the power consumption target for the storage device 102 in response to changes in the power supply 110. The power consumption target may also be dynamically allocated in response to changes in workload, as discussed in greater detail below. For example, if the power supply 110 is connected to a source such as an electrical outlet, the computing system 114 may specify one power consumption target. If the power supply 110 is disconnected from the source, such that the power supply 110 is operating on battery power, the computing system 114 may decrease the power consumption target for the storage device 102. In one embodiment, the computing system 114 may dynamically change the power consumption target for the storage device 102 as the battery life decreases. In certain embodiments with multiple components, the power consumption targets for the components are not adjusted downward equally as battery life decreases; for example, the power consumption target for a component providing an active wireless connection may remain stable or be reduced at a slower rate than that of the storage device 102, or the like.

In one embodiment, the power management apparatus 122 provides thermal management for the storage device 102. The power management apparatus 122, in one embodiment, monitors a temperature for the storage device 102 relative to a thermal ceiling or other thermal threshold. The power management apparatus 122, in one embodiment, adjusts execution of operations on the storage device 102 in response to the temperature of the storage device 102 approaching the thermal ceiling. In one embodiment, the power management apparatus 122 combines thermal adjustments to execution of the operations with power adjustments to execution of the operations into a single combined adjustment. In a further embodiment, the power management apparatus 122 verifies that the temperature of the storage device 102 is moving away from the thermal ceiling in response to adjusting execution of the operations.

Solid-State Storage Device

Figure 2:
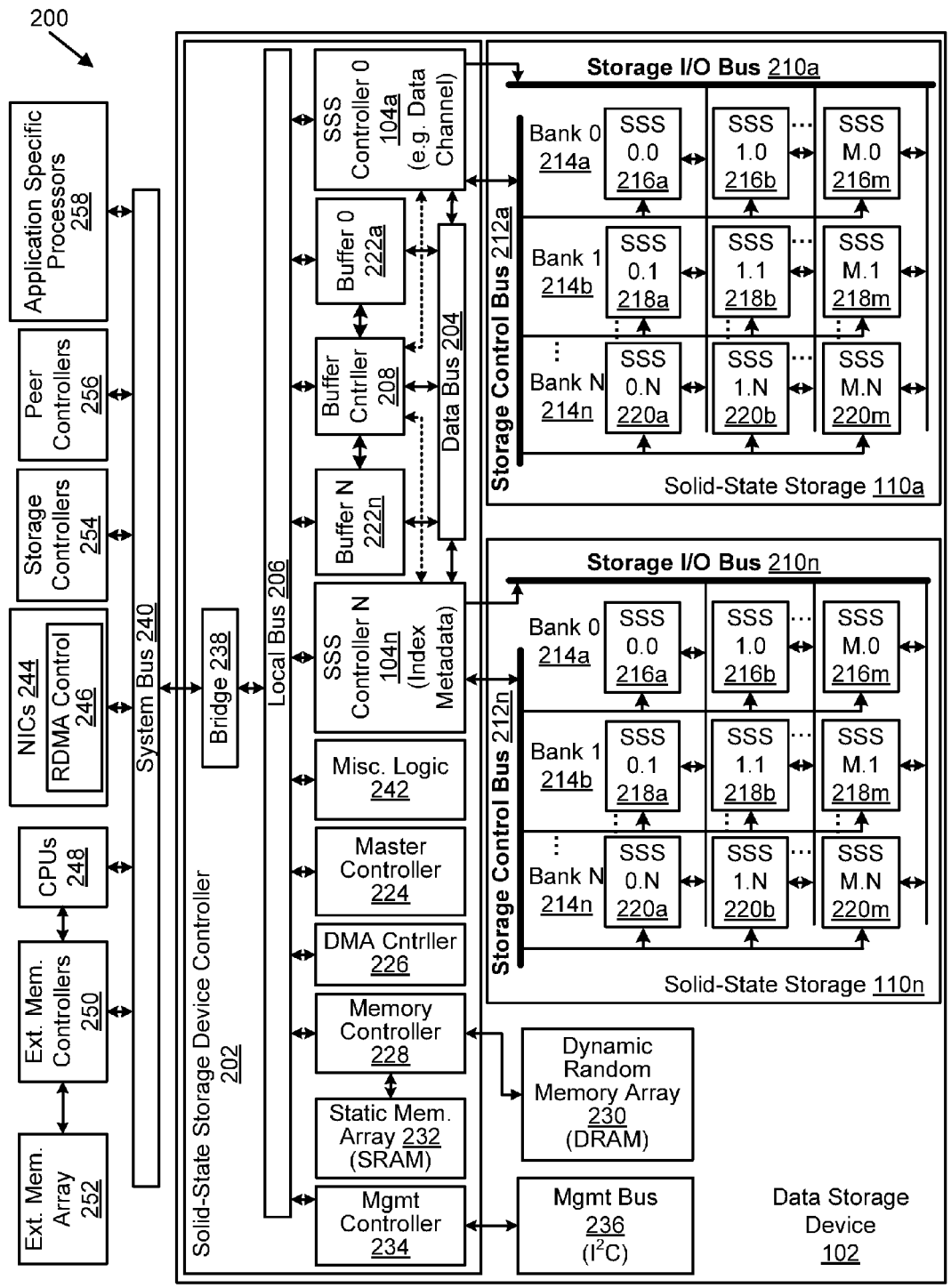
FIG. 2 is a schematic block diagram illustrating one embodiment of a solid-state storage device controller for a data storage device.

FIG. 2 is a schematic block diagram illustrating one embodiment 200 of a solid-state storage device controller 202 that includes a write data pipeline 106 and a read data pipeline 108 in a solid-state storage device 102 in accordance with the present invention. The solid-state storage device controller 202 may include a number of solid-state storage controllers 0-N 104a-n, each controlling solid-state storage media 110. In the depicted embodiment, two solid-state controllers are shown: solid-state controller 0 104a and solid-state storage controller N 104n, and each controls solid-state storage media 110a-n. In the depicted embodiment, solid-state storage controller 0 104a controls a data channel so that the attached solid-state storage media 110a stores data. Solid-state storage controller N 104n controls an index metadata channel associated with the stored data and the associated solid-state storage media 110n stores index metadata. In an alternate embodiment, the solid-state storage device controller 202 includes a single solid-state controller 104a with a single solid-state storage media 110a. In another embodiment, there are a plurality of solid-state storage controllers 104a-n and associated solid-state storage media 110a-n. In one embodiment, one or more solid state controllers 104a-104n-1, coupled to their associated solid-state storage media 110a-110n-1, control data while at least one solid-state storage controller 104n, coupled to its associated solid-state storage media 110n, controls index metadata.

In one embodiment, at least one solid-state controller 104 is field-programmable gate array ("FPGA") and controller functions are programmed into the FPGA. In a particular embodiment, the FPGA is a Xilinx® FPGA. In another embodiment, the solid-state storage controller 104 comprises components specifically designed as a solid-state storage controller 104, such as an application-specific integrated circuit ("ASIC") or custom logic solution. Each solid-state storage controller 104 typically includes a write data pipeline 106 and a read data pipeline 108, which are describe further in relation to FIG. 3. In another embodiment, at least one solid-state storage controller 104 is made up of a combination FPGA, ASIC, and custom logic components.

Solid-State Storage

The solid state storage media 110 is an array of non-volatile solid-state storage elements 216, 218, 220, arranged in banks 214, and accessed in parallel through a bi-directional storage input/output ("I/O") bus 210. The storage I/O bus 210, in one embodiment, is capable of unidirectional communication at any one time. For example, when data is being written to the solid-state storage media 110, data cannot be read from the solid-state storage media 110. In another embodiment, data can flow both directions simultaneously. However bi-directional, as used herein with respect to a data bus, refers to a data pathway that can have data flowing in only one direction at a time, but when data flowing one direction on the bi-directional data bus is stopped, data can flow in the opposite direction on the bi-directional data bus.

A solid-state storage element (e.g. SSS 0.0 216a) is typically configured as a chip (a package of one or more dies) or a die on a circuit board. As depicted, a solid-state storage element (e.g. 216a) operates independently or semi-independently of other solid-state storage elements (e.g. 218a) even if these several elements are packaged together in a chip package, a stack of chip packages, or some other package element. As depicted, a row of solid-state storage elements 216a, 216b, 216m is designated as a bank 214. As depicted, there may be "n" banks 214a-n and "m" solid-state storage elements 216a-m, 218a-m, 220a-m per bank in an array of n×m solid-state storage elements 216, 218, 220 in a solid-state storage media 110. Of course different embodiments may include different values for n and m. In one embodiment, a solid-state storage media 110a includes twenty solid-state storage elements 216, 218, 220 per bank 214 with eight banks 214. In one embodiment, the solid-state storage media 110a includes twenty four solid-state storage elements 216, 218, 220 per bank 214 with eight banks 214. In addition to the n×m storage elements 216, 218, 220, one or more additional columns (P) may also be addressed and operated in parallel with other solid-state storage elements 216a, 216b, 216m for one or more rows. The added P columns in one embodiment, store parity data for the portions of an ECC chunk (i.e. an ECC codeword) that span m storage elements for a particular bank. In one embodiment, each solid-state storage element 216, 218, 220 is comprised of single-level cell ("SLC") devices. In another embodiment, each solid-state storage element 216, 218, 220 is comprised of multi-level cell ("MLC") devices.

In one embodiment, solid-state storage elements that share a common storage I/O bus 210a (e.g. 216b, 218b, 220b) are packaged together. In one embodiment, a solid-state storage element 216, 218, 220 may have one or more dies per chip with one or more chips stacked vertically and each die may be accessed independently. In another embodiment, a solid-state storage element (e.g. SSS 0.0 216a) may have one or more virtual dies per die and one or more dies per chip and one or more chips stacked vertically and each virtual die may be accessed independently. In another embodiment, a solid-state storage element SSS 0.0 216a may have one or more virtual dies per die and one or more dies per chip with some or all of the one or more dies stacked vertically and each virtual die may be accessed independently.

In one embodiment, two dies are stacked vertically with four stacks per group to form eight storage elements (e.g. SSS 0.0-SSS 8.0) 216a-220a, each in a separate bank 214a-n. In another embodiment, 24 storage elements (e.g. SSS 0.0-SSS 0.24) 216 form a logical bank 214a so that each of the eight logical banks has 24 storage elements (e.g. SSS 0.0-SSS 8.24) 216, 218, 220. Data is sent to the solid-state storage media 110 over the storage I/O bus 210 to all storage elements of a particular group of storage elements (SSS 0.0-SSS 8.0) 216a, 218a, 220a. The storage control bus 212a is used to select a particular bank (e.g. Bank 0 214a) so that the data received over the storage I/O bus 210 connected to all banks 214 is written just to the selected bank 214a.

In a one embodiment, the storage I/O bus 210 is comprised of one or more independent I/O buses ("IIOBa-m" comprising 210a.a-m, 210n.a-m) wherein the solid-state storage elements within each column share one of the independent I/O buses that accesses each solid-state storage element 216, 218, 220 in parallel so that all banks 214 are accessed simultaneously. For example, one channel of the storage I/O bus 210 may access a first solid-state storage element 216a, 218a, 220a of each bank 214a-n simultaneously. A second channel of the storage I/O bus 210 may access a second solid-state storage element 216b, 218b, 220b of each bank 214a-n simultaneously. Each row of solid-state storage element 216a, 216b, 216m is accessed simultaneously. In one embodiment, where solid-state storage elements 216, 218, 220 are multi-level (physically stacked), all physical levels of the solid-state storage elements 216, 218, 220 are accessed simultaneously. As used herein, "simultaneously" also includes near simultaneous access where devices are accessed at slightly different intervals to avoid switching noise. Simultaneously is used in this context to be distinguished from a sequential or serial access wherein commands and/or data are sent individually one after the other.

Typically, banks 214*a-n* are independently selected using the storage control bus 212. In one embodiment, a bank 214 is selected using a chip enable or chip select. Where both chip select and chip enable are available, the storage control bus 212 may select one level of a multi-level solid-state storage element 216, 218, 220. In other embodiments, other commands are used by the storage control bus 212 to individually select one level of a multi-level solid-state storage element 216, 218, 220. Solid-state storage elements 216, 218, 220 may also be selected through a combination of control and of address information transmitted on storage I/O bus 210 and the storage control bus 212.

In one embodiment, each solid-state storage element 216, 218, 220 is partitioned into erase blocks and each erase block is partitioned into pages. An erase block on a solid-state storage element 216, 218 220 may be called a physical erase block or "PEB." A typical page is 2000 bytes ("2 kB"). In one example, a solid-state storage element (e.g. SSS 0.0) includes two registers and can program two pages so that a two-register solid-state storage element 216, 218, 220 has a capacity of 4 kB. A bank 214 of 20 solid-state storage elements 216*a*, 216*b*, 216*m* would then have an 80 kB capacity of pages accessed with the same address going out the channels of the storage I/O bus 210.

This group of pages in a bank 214 of solid-state storage elements 216*a*, 216*b*, 216*m* of 80 kB may be called a logical page or virtual page. Similarly, an erase block of each storage element 216*a-m* of a bank 214*a* may be grouped to form a logical erase block or a virtual erase block. In one embodiment, an erase block of pages within a solid-state storage element 216, 218, 220 is erased when an erase command is received within a solid-state storage element 216, 218, 220. Whereas the size and number of erase blocks, pages, planes, or other logical and physical divisions within a solid-state storage element 216, 218, 220 are expected to change over time with advancements in technology, it is to be expected that many embodiments consistent with new configurations are possible and are consistent with the general description herein.

Typically, when a packet is written to a particular location within a solid-state storage element 216, 218, 220, wherein the packet is intended to be written to a location within a particular page which is specific to a particular physical erase block of a particular storage element of a particular bank, a physical address is sent on the storage I/O bus 210 and followed by the packet. The physical address contains enough information for the solid-state storage element 216, 218, 220 to direct the packet to the designated location within the page. Since all storage elements in a column of storage elements (e.g. SSS 0.0-SSS N.0 216*a*, 218*a*, 220*a*) are accessed simultaneously by the appropriate bus within the storage I/O bus 210*a.a*, to reach the proper page and to avoid writing the data packet to similarly addressed pages in the column of storage elements (SSS 0.0-SSS N.0 216*a*, 218*a*, 220*a*), the bank 214*a* that includes the solid-state storage element SSS 0.0 216*a* with the correct page where the data packet is to be written is simultaneously selected by the storage control bus 212.

Similarly, satisfying a read command on the storage I/O bus 210 requires a simultaneous signal on the storage control bus 212 to select a single bank 214*a* and the appropriate page within that bank 214*a*. In one embodiment, a read command reads an entire page, and because there are multiple solid-state storage elements 216*a*, 216*b*, 216*m* in parallel in a bank 214, an entire logical page is read with a read command. However, the read command may be broken into subcommands, as will be explained below with respect to bank interleave. A logical page may also be accessed in a write operation.

An erase block erase command may be sent out to erase an erase block over the storage I/O bus 210 with a particular erase block address to erase a particular erase block. Typically, an erase block erase command may be sent over the parallel paths of the storage I/O bus 210 to erase a logical erase block, each with a particular erase block address to erase a particular erase block. Simultaneously a particular bank (e.g. Bank 0 214*a*) is selected over the storage control bus 212 to prevent erasure of similarly addressed erase blocks in all of the banks (Banks 1-N 214*b-n*). Alternatively, no particular bank (e.g. Bank 0 214*a*) is selected over the storage control bus 212 to enable erasure of similarly addressed erase blocks in all of the banks (Banks 1-N 214*b-n*) simultaneously. Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, packets are written sequentially to the solid-state storage media 110. For example, packets are streamed to the storage write buffers of a bank 214*a* of storage elements 216 and when the buffers are full, the packets are programmed to a designated logical page. Packets then refill the storage write buffers and, when full, the packets are written to the next logical page. The next logical page may be in the same bank 214*a* or another bank (e.g. 214*b*). This process continues, logical page after logical page, typically until a logical erase block is filled. In another embodiment, the streaming may continue across logical erase block boundaries with the process continuing, logical erase block after logical erase block.

In a read, modify, write operation, data packets associated with requested data are located and read in a read operation. Data segments of the modified requested data that have been modified are not written to the location from which they are read. Instead, the modified data segments are again converted to data packets and then written sequentially to the next available location in the logical page currently being written. The index entries for the respective data packets are modified to point to the packets that contain the modified data segments. The entry or entries in the index for data packets associated with the same requested data that have not been modified will include pointers to original location of the unmodified data packets. Thus, if the original requested data is maintained, for example to maintain a previous version of the requested data, the original requested data will have pointers in the index to all data packets as originally written. The new requested data will have pointers in the index to some of the original data packets and pointers to the modified data packets in the logical page that is currently being written.

In a copy operation, the index includes an entry for the original requested data mapped to a number of packets stored in the solid-state storage media 110. When a copy is made, a new copy of the requested data is created and a new entry is created in the index mapping the new copy of the requested data to the original packets. The new copy of the requested data is also written to the solid-state storage media 110 with its location mapped to the new entry in the index. The new copy of the requested data packets may be used to identify the packets within the original requested data that are referenced in case changes have been made in the original requested data that have not been propagated to the copy of the requested data and the index is lost or corrupted.

Beneficially, sequentially writing packets facilitates a more even use of the solid-state storage media 110 and allows the solid-storage device controller 202 to monitor storage hot spots and level usage of the various logical pages in the solid-state storage media 110. Sequentially writing packets also facilitates a powerful, efficient garbage collection system, which is described in detail below. One of skill in the art will recognize other benefits of sequential storage of data packets.

Solid-State Storage Device Controller

In various embodiments, the solid-state storage device controller 202 also includes a data bus 204, a local bus 206, a buffer controller 208, buffers 0-N 222a-n, a master controller 224, a direct memory access ("DMA") controller 226, a memory controller 228, a dynamic memory array 230, a static random memory array 232, a management controller 234, a management bus 236, a bridge 238 to a system bus 240, and miscellaneous logic 242, which are described below. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258, which are described below. The components 244-258 connected to the system bus 240 may be located in the computing system 114 or may be other devices.

Typically the solid-state storage controller(s) 104 communicate data to the solid-state storage media 110 over a storage I/O bus 210. In a typical embodiment where the solid-state storage is arranged in banks 214 and each bank 214 includes multiple storage elements 216a, 216b, 216m accessed in parallel, the storage I/O bus 210 is an array of busses, one for each column of storage elements 216, 218, 220 spanning the banks 214. As used herein, the term "storage I/O bus" may refer to one storage I/O bus 210 or an array of data independent busses 204. In one embodiment, each storage I/O bus 210 accessing a column of storage elements (e.g. 216a, 218a, 220a) may include a logical-to-physical mapping for storage divisions (e.g. erase blocks) accessed in a column of storage elements 216a, 218a, 220a. This mapping (or bad block remapping) allows a logical address mapped to a physical address of a storage division to be remapped to a different storage division if the first storage division fails, partially fails, is inaccessible, or has some other problem.

Data may also be communicated to the solid-state storage controller(s) 104 from a requesting device 155 through the system bus 240, bridge 238, local bus 206, buffer(s) 222, and finally over a data bus 204. The data bus 204 typically is connected to one or more buffers 222a-n controlled with a buffer controller 208. The buffer controller 208 typically controls transfer of data from the local bus 206 to the buffers 222 and through the data bus 204 to the pipeline input buffer 306 and output buffer 330. The buffer controller 208 typically controls how data arriving from a requesting device can be temporarily stored in a buffer 222 and then transferred onto a data bus 204, or vice versa, to account for different clock domains, to prevent data collisions, etc. The buffer controller 208 typically works in conjunction with the master controller 224 to coordinate data flow. As data arrives, the data will arrive on the system bus 240, be transferred to the local bus 206 through a bridge 238.

Typically the data is transferred from the local bus 206 to one or more data buffers 222 as directed by the master controller 224 and the buffer controller 208. The data then flows out of the buffer(s) 222 to the data bus 204, through a solid-state controller 104, and on to the solid-state storage media 110 such as NAND flash or other storage media. In one embodiment, data and associated out-of-band metadata ("metadata") arriving with the data is communicated using one or more data channels comprising one or more solid-state storage controllers 104a-104n-1 and associated solid-state storage media 110a-110n-1 while at least one channel (solid-state storage controller 104n, solid-state storage media 110n) is dedicated to in-band metadata, such as index information and other metadata generated internally to the solid-state storage device 102.

The local bus 206 is typically a bidirectional bus or set of busses that allows for communication of data and commands between devices internal to the solid-state storage device controller 202 and between devices internal to the solid-state storage device 102 and devices 244-258 connected to the system bus 240. The bridge 238 facilitates communication between the local bus 206 and system bus 240. One of skill in the art will recognize other embodiments such as ring structures or switched star configurations and functions of buses 240, 206, 204, 210 and bridges 238.

The system bus 240 is typically a bus of a computing system 114 or other device in which the solid-state storage device 102 is installed or connected. In one embodiment, the system bus 240 may be a PCI-e bus, a Serial Advanced Technology Attachment ("serial ATA") bus, parallel ATA, or the like. In another embodiment, the system bus 240 is an external bus such as small computer system interface ("SCSI"), FireWire, Fiber Channel, USB, PCIe-AS, or the like. The solid-state storage device 102 may be packaged to fit internally to a device or as an externally connected device.

The solid-state storage device controller 202 includes a master controller 224 that controls higher-level functions within the solid-state storage device 102. The master controller 224, in various embodiments, controls data flow by interpreting object requests and other requests, directs creation of indexes to map object identifiers associated with data to physical locations of associated data, coordinating DMA requests, etc. Many of the functions described herein are controlled wholly or in part by the master controller 224.

In one embodiment, the master controller 224 uses embedded controller(s). In another embodiment, the master controller 224 uses local memory such as a dynamic memory array 230 (dynamic random access memory "DRAM"), a static memory array 232 (static random access memory "SRAM"), etc. In one embodiment, the local memory is controlled using the master controller 224. In another embodiment, the master controller 224 accesses the local memory via a memory controller 228. In another embodiment, the master controller 224 runs a Linux server and may support various common server interfaces, such as the World Wide Web, hyper-text markup language ("HTML"), etc. In another embodiment, the master controller 224 uses a nano-processor. The master controller 224 may be constructed using programmable or standard logic, or any combination of controller types listed above. One skilled in the art will recognize many embodiments for the master controller 224.

In one embodiment, where the storage device/solid-state storage device controller 202 manages multiple data storage devices/solid-state storage media 110a-n, the master controller 224 divides the work load among internal controllers, such as the solid-state storage controllers 104a-n. For example, the master controller 224 may divide an object to be written to the data storage devices (e.g. solid-state storage media 110a-n) so that a portion of the object is stored on each of the attached data storage devices. This feature is a performance enhancement allowing quicker storage and access to an object. In one embodiment, the master controller 224 is implemented using an FPGA. In another embodiment, the firmware within the master controller 224 may be updated through the management bus 236, the system bus 240 over a network connected to a NIC 244 or other device connected to the system bus 240.

In one embodiment, the master controller 224, which manages objects, emulates block storage such that a computing system 114 or other device connected to the storage device/solid-state storage device 102 views the storage device/solid-state storage device 102 as a block storage device and sends data to specific physical addresses in the storage device/solid-state storage device 102. The master controller 224 then divides up the blocks and stores the data blocks as it would objects. The master controller 224 then maps the blocks and physical address sent with the block to the actual locations determined by the master controller 224. The mapping is stored in the object index. Typically, for block emulation, a block device application program interface ("API") is provided in a driver in a computer such as the computing system 114, or other device wishing to use the storage device/solid-state storage device 102 as a block storage device.

In another embodiment, the master controller 224 coordinates with NIC controllers 244 and embedded RDMA controllers 246 to deliver just-in-time RDMA transfers of data and command sets. NIC controller 244 may be hidden behind a non-transparent port to enable the use of custom drivers. Also, a driver on a computing system 114 may have access to the computer network 116 through an I/O memory driver using a standard stack API and operating in conjunction with NICs 244.

In one embodiment, the master controller 224 is also a redundant array of independent drive ("RAID") controller. Where the data storage device/solid-state storage device 102 is networked with one or more other data storage devices/solid-state storage devices 102, the master controller 224 may be a RAID controller for single tier RAID, multi-tier RAID, progressive RAID, etc. The master controller 224 also allows some objects to be stored in a RAID array and other objects to be stored without RAID. In another embodiment, the master controller 224 may be a distributed RAID controller element. In another embodiment, the master controller 224 may comprise many RAID, distributed RAID, and other functions as described elsewhere. In one embodiment, the master controller 224 controls storage of data in a RAID-like structure where parity information is stored in one or more storage elements 216, 218, 220 of a logical page where the parity information protects data stored in the other storage elements 216, 218, 220 of the same logical page.

In one embodiment, the master controller 224 coordinates with single or redundant network managers (e.g. switches) to establish routing, to balance bandwidth utilization, failover, etc. In another embodiment, the master controller 224 coordinates with integrated application specific logic (via local bus 206) and associated driver software. In another embodiment, the master controller 224 coordinates with attached application specific processors 258 or logic (via the external system bus 240) and associated driver software. In another embodiment, the master controller 224 coordinates with remote application specific logic (via the computer network 116) and associated driver software. In another embodiment, the master controller 224 coordinates with the local bus 206 or external bus attached hard disk drive ("HDD") storage controller.

In one embodiment, the master controller 224 communicates with one or more storage controllers 254 where the storage device/solid-state storage device 102 may appear as a storage device connected through a SCSI bus, Internet SCSI ("iSCSI"), fiber channel, etc. Meanwhile the storage device/solid-state storage device 102 may autonomously manage objects and may appear as an object file system or distributed object file system. The master controller 224 may also be accessed by peer controllers 256 and/or application specific processors 258.

In another embodiment, the master controller 224 coordinates with an autonomous integrated management controller to periodically validate FPGA code and/or controller software, validate FPGA code while running (reset) and/or validate controller software during power on (reset), support external reset requests, support reset requests due to watchdog timeouts, and support voltage, current, power, temperature, and other environmental measurements and setting of threshold interrupts. In another embodiment, the master controller 224 manages garbage collection to free erase blocks for reuse. In another embodiment, the master controller 224 manages wear leveling. In another embodiment, the master controller 224 allows the data storage device/solid-state storage device 102 to be partitioned into multiple logical devices and allows partition-based media encryption. In yet another embodiment, the master controller 224 supports a solid-state storage controller 104 with advanced, multi-bit ECC correction. One of skill in the art will recognize other features and functions of a master controller 224 in a storage controller 202, or more specifically in a solid-state storage device 102.

In one embodiment, the solid-state storage device controller 202 includes a memory controller 228 which controls a dynamic random memory array 230 and/or a static random memory array 232. As stated above, the memory controller 228 may be independent or integrated with the master controller 224. The memory controller 228 typically controls volatile memory of some type, such as DRAM (dynamic random memory array 230) and SRAM (static random memory array 232). In other examples, the memory controller 228 also controls other memory types such as electrically erasable programmable read only memory ("EEPROM"), etc. In other embodiments, the memory controller 228 controls two or more memory types and the memory controller 228 may include more than one controller. Typically, the memory controller 228 controls as much SRAM 232 as is feasible and by DRAM 230 to supplement the SRAM 232.

In one embodiment, the object index is stored in memory 230, 232 and then periodically off-loaded to a channel of the solid-state storage media 110n or other non-volatile memory. One of skill in the art will recognize other uses and configurations of the memory controller 228, dynamic memory array 230, and static memory array 232.

In one embodiment, the solid-state storage device controller 202 includes a DMA controller 226 that controls DMA operations between the storage device/solid-state storage device 102 and one or more external memory controllers 250 and associated external memory arrays 252 and CPUs 248. Note that the external memory controllers 250 and external memory arrays 252 are called external because they are external to the storage device/solid-state storage device 102. In addition the DMA controller 226 may also control RDMA operations with requesting devices through a NIC 244 and associated RDMA controller 246.

In one embodiment, the solid-state storage device controller 202 includes a management controller 234 connected to a management bus 236. Typically the management controller 234 manages environmental metrics and status of the storage device/solid-state storage device 102. The management controller 234 may monitor device temperature, fan speed, power supply settings, etc. over the management bus 236. The management controller 234 may support the reading and programming of erasable programmable read only memory ("EEPROM") for storage of FPGA code and controller software. Typically the management bus 236 is connected to the various components within the storage device/solid-state storage device 102. The management controller 234 may communicate alerts, interrupts, etc. over the local bus 206 or may include a separate connection to a system bus 240 or other bus. In one embodiment the management bus 236 is an Inter-Integrated Circuit ("I2C") bus. One of skill in the art will recognize other related functions and uses of a management controller 234 connected to components of the storage device/solid-state storage device 102 by a management bus 236.

In one embodiment, the solid-state storage device controller 202 includes miscellaneous logic 242 that may be customized for a specific application. Typically where the solid-state device controller 202 or master controller 224 is/are configured using a FPGA or other configurable controller, custom logic may be included based on a particular application, customer requirement, storage requirement, etc.

Data Pipeline

Figure 3:
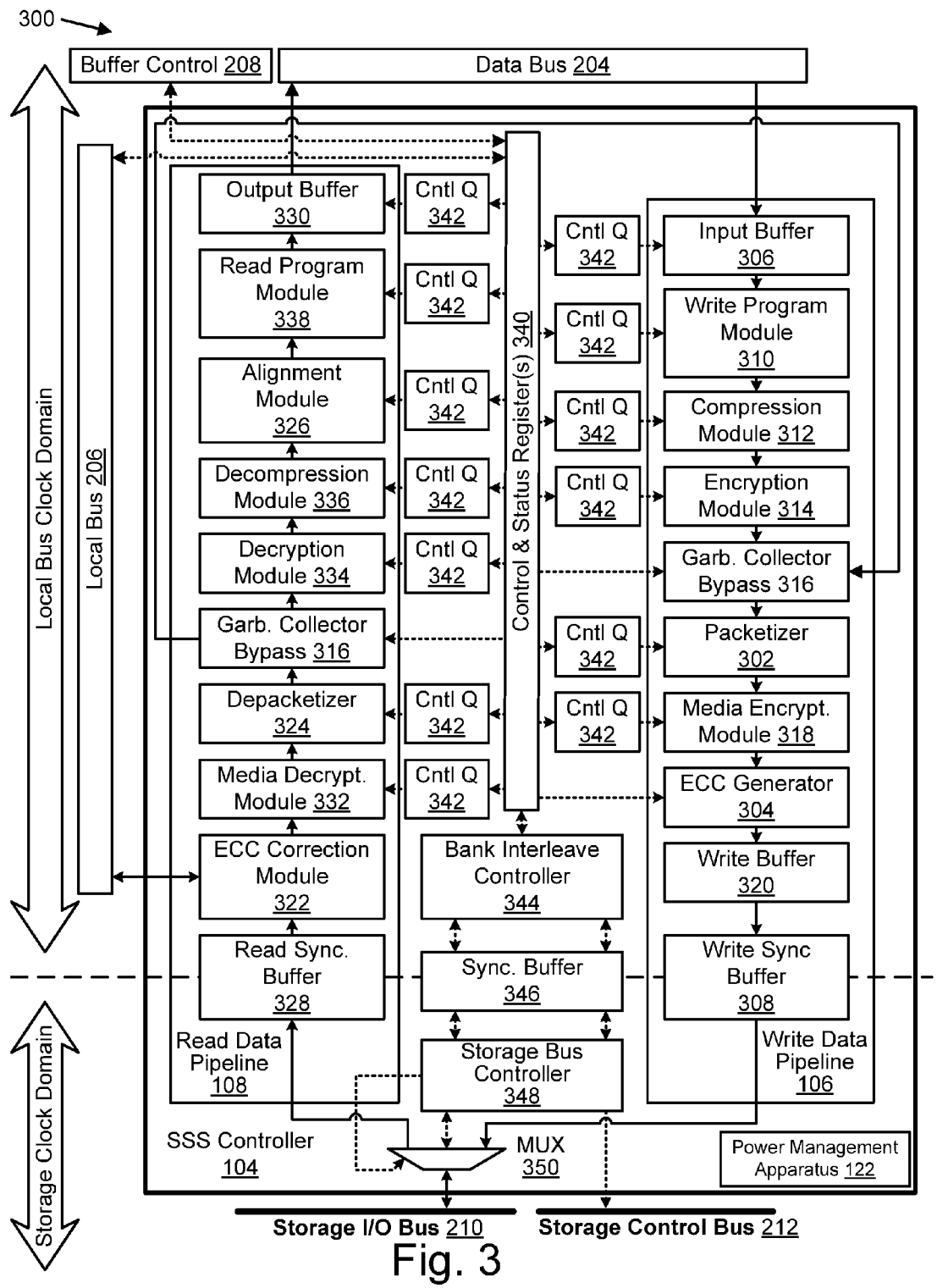
FIG. 3 is a schematic block diagram illustrating one embodiment of a solid-state storage controller with a write data pipeline and a read data pipeline in a data storage device.

FIG. 3 is a schematic block diagram illustrating one embodiment 300 of a solid-state storage controller 104 with a write data pipeline 106 and a read data pipeline 108 in a solid-state storage device 102 in accordance with the present invention. The embodiment 300 includes a data bus 204, a local bus 206, and buffer control 208, which are substantially similar to those described in relation to the solid-state storage device controller 202 of FIG. 2. The write data pipeline 106 includes a packetizer 302 and an error-correcting code ("ECC") generator 304. In other embodiments, the write data pipeline 106 includes an input buffer 306, a write synchronization buffer 308, a write program module 310, a compression module 312, an encryption module 314, a garbage collector bypass 316 (with a portion within the read data pipeline 108), a media encryption module 318, and a write buffer 320. The read data pipeline 108 includes a read synchronization buffer 328, an ECC correction module 322, a depacketizer 324, an alignment module 326, and an output buffer 330. In other embodiments, the read data pipeline 108 may include a media decryption module 332, a portion of the garbage collector bypass 316, a decryption module 334, a decompression module 336, and a read program module 338. The solid-state storage controller 104 may also include control and status registers 340 and control queues 342, a bank interleave controller 344, a synchronization buffer 346, a storage bus controller 348, and a multiplexer ("MUX") 350. The components of the solid-state controller 104 and associated write data pipeline 106 and read data pipeline 108 are described below. In other embodiments, synchronous solid-state storage media 110 may be used and synchronization buffers 308 328 may be eliminated.

Write Data Pipeline

The write data pipeline 106 includes a packetizer 302 that receives a data or metadata segment to be written to the solid-state storage, either directly or indirectly through another write data pipeline 106 stage, and creates one or more packets sized for the solid-state storage media 110. The data or metadata segment is typically part of a data structure such as an object, but may also include an entire data structure. In another embodiment, the data segment is part of a block of data, but may also include an entire block of data. Typically, a set of data such as a data structure is received from a computer such as the computing system 114, or other computer or device and is transmitted to the solid-state storage device 102 in data segments streamed to the solid-state storage device 102. A data segment may also be known by another name, such as data parcel, but as referenced herein includes all or a portion of a data structure or data block.

Each data structure is stored as one or more packets. Each data structure may have one or more container packets. Each packet contains a header. The header may include a header type field. Type fields may include data, attribute, metadata, data segment delimiters (multi-packet), data structures, data linkages, and the like. The header may also include information regarding the size of the packet, such as the number of bytes of data included in the packet. The length of the packet may be established by the packet type. The header may include information that establishes the relationship of the packet to a data structure. An example might be the use of an offset in a data packet header to identify the location of the data segment within the data structure. One of skill in the art will recognize other information that may be included in a header added to data by a packetizer 302 and other information that may be added to a data packet.

Each packet includes a header and possibly data from the data or metadata segment. The header of each packet includes pertinent information to relate the packet to the data structure to which the packet belongs. For example, the header may include an object identifier or other data structure identifier and offset that indicates the data segment, object, data structure or data block from which the data packet was formed. The header may also include a logical address used by the storage bus controller 348 to store the packet. The header may also include information regarding the size of the packet, such as the number of bytes included in the packet. The header may also include a sequence number that identifies where the data segment belongs with respect to other packets within the data structure when reconstructing the data segment or data structure. The header may include a header type field. Type fields may include data, data structure attributes, metadata, data segment delimiters (multi-packet), data structure types, data structure linkages, and the like. One of skill in the art will recognize other information that may be included in a header added to data or metadata by a packetizer 302 and other information that may be added to a packet.

The write data pipeline 106 includes an ECC generator 304 that that generates one or more error-correcting codes ("ECC") for the one or more packets received from the packetizer 302. The ECC generator 304 typically uses an error correcting algorithm to generate ECC check bits which are stored with the one or more data packets. The ECC codes generated by the ECC generator 304 together with the one or more data packets associated with the ECC codes comprise an ECC chunk. The ECC data stored with the one or more data packets is used to detect and to correct errors introduced into the data through transmission and storage. In one embodiment, packets are streamed into the ECC generator 304 as un-encoded blocks of length N. A syndrome of length S is calculated, appended and output as an encoded block of length N+S. The value of N and S are dependent upon the characteristics of the ECC algorithm which is selected to achieve specific performance, efficiency, and robustness metrics. In one embodiment, there is no fixed relationship between the ECC blocks and the packets; the packet may comprise more than one ECC block; the ECC block may comprise more than one packet; and a first packet may end anywhere within the ECC block and a second packet may begin after the end of the first packet within the same ECC block. In one embodiment, ECC algorithms are not dynamically modified. In one embodiment, the ECC data stored with the data packets is robust enough to correct errors in more than two bits.

Beneficially, using a robust ECC algorithm allowing more than single bit correction or even double bit correction allows the life of the solid-state storage media 110 to be extended. For example, if flash memory is used as the storage medium in the solid-state storage media 110, the flash memory may be written approximately 100,000 times without error per erase cycle. This usage limit may be extended using a robust ECC algorithm. Having the ECC generator 304 and corresponding ECC correction module 322 onboard the solid-state storage device 102, the solid-state storage device 102 can internally correct errors and has a longer useful life than if a less robust ECC algorithm is used, such as single bit correction. However, in other embodiments the ECC generator 304 may use a less robust algorithm and may correct single-bit or double-bit errors. In another embodiment, the solid-state storage device 110 may comprise less reliable storage such as multi-level cell ("MLC") flash in order to increase capacity, which storage may not be sufficiently reliable without more robust ECC algorithms.

In one embodiment, the write pipeline 106 includes an input buffer 306 that receives a data segment to be written to the solid-state storage media 110 and stores the incoming data segments until the next stage of the write data pipeline 106, such as the packetizer 302 (or other stage for a more complex write data pipeline 106) is ready to process the next data segment. The input buffer 306 typically allows for discrepancies between the rate data segments are received and processed by the write data pipeline 106 using an appropriately sized data buffer. The input buffer 306 also allows the data bus 204 to transfer data to the write data pipeline 106 at rates greater than can be sustained by the write data pipeline 106 in order to improve efficiency of operation of the data bus 204. Typically when the write data pipeline 106 does not include an input buffer 306, a buffering function is performed elsewhere, such as in the solid-state storage device 102 but outside the write data pipeline 106, in the computing system 114, such as within a network interface card ("NIC"), or at another device, for example when using remote direct memory access ("RDMA").

In another embodiment, the write data pipeline 106 also includes a write synchronization buffer 308 that buffers packets received from the ECC generator 304 prior to writing the packets to the solid-state storage media 110. The write synchronization buffer 308 is located at a boundary between a local clock domain and a solid-state storage clock domain and provides buffering to account for the clock domain differences. In other embodiments, synchronous solid-state storage media 110 may be used and synchronization buffers 308 328 may be eliminated.

In one embodiment, the write data pipeline 106 also includes a media encryption module 318 that receives the one or more packets from the packetizer 302, either directly or indirectly, and encrypts the one or more packets using an encryption key unique to the solid-state storage device 102 prior to sending the packets to the ECC generator 304. Typically, the entire packet is encrypted, including the headers. In another embodiment, headers are not encrypted. In this document, encryption key is understood to mean a secret encryption key that is managed externally from a solid-state storage controller 104.

The media encryption module 318 and corresponding media decryption module 332 provide a level of security for data stored in the solid-state storage media 110. For example, where data is encrypted with the media encryption module 318, if the solid-state storage media 110 is connected to a different solid-state storage controller 104, solid-state storage device 102, or server, the contents of the solid-state storage media 110 typically could not be read without use of the same encryption key used during the write of the data to the solid-state storage media 110 without significant effort.

In a typical embodiment, the solid-state storage device 102 does not store the encryption key in non-volatile storage and allows no external access to the encryption key. The encryption key is provided to the solid-state storage controller 104 during initialization. The solid-state storage device 102 may use and store a non-secret cryptographic nonce that is used in conjunction with an encryption key. A different nonce may be stored with every packet. Data segments may be split between multiple packets with unique nonces for the purpose of improving protection by the encryption algorithm.

The encryption key may be received from a computing system 114, a server, key manager, or other device that manages the encryption key to be used by the solid-state storage controller 104. In another embodiment, the solid-state storage media 110 may have two or more partitions and the solid-state storage controller 104 behaves as though it was two or more solid-state storage controllers 104, each operating on a single partition within the solid-state storage media 110. In this embodiment, a unique media encryption key may be used with each partition.

In another embodiment, the write data pipeline 106 also includes an encryption module 314 that encrypts a data or metadata segment received from the input buffer 306, either directly or indirectly, prior sending the data segment to the packetizer 302, the data segment encrypted using an encryption key received in conjunction with the data segment. The encryption keys used by the encryption module 314 to encrypt data may not be common to all data stored within the solid-state storage device 102 but may vary on an per data structure basis and received in conjunction with receiving data segments as described below. For example, an encryption key for a data segment to be encrypted by the encryption module 314 may be received with the data segment or may be received as part of a command to write a data structure to which the data segment belongs. The solid-sate storage device 102 may use and store a non-secret cryptographic nonce in each data structure packet that is used in conjunction with the encryption key. A different nonce may be stored with every packet. Data segments may be split between multiple packets with unique nonces for the purpose of improving protection by the encryption algorithm.

The encryption key may be received from a computing system 114, another computer, key manager, or other device that holds the encryption key to be used to encrypt the data segment. In one embodiment, encryption keys are transferred to the solid-state storage controller 104 from one of a solid-state storage device 102, computing system 114, computer, or other external agent which has the ability to execute industry standard methods to securely transfer and protect private and public keys.

In one embodiment, the encryption module 314 encrypts a first packet with a first encryption key received in conjunction with the packet and encrypts a second packet with a second encryption key received in conjunction with the second packet. In another embodiment, the encryption module 314 encrypts a first packet with a first encryption key received in conjunction with the packet and passes a second data packet on to the next stage without encryption. Beneficially, the encryption module 314 included in the write data pipeline 106 of the solid-state storage device 102 allows data structure-by-data structure or segment-by-segment data encryption without a single file system or other external system to keep track of the different encryption keys used to store corresponding data structures or data segments. Each requesting device 155 or related key manager independently manages encryption keys used to encrypt only the data structures or data segments sent by the requesting device 155.

In one embodiment, the encryption module 314 may encrypt the one or more packets using an encryption key unique to the solid-state storage device 102. The encryption module 314 may perform this media encryption independently, or in addition to the encryption described above. Typically, the entire packet is encrypted, including the headers. In another embodiment, headers are not encrypted. The media encryption by the encryption module 314 provides a level of security for data stored in the solid-state storage media 110. For example, where data is encrypted with media encryption unique to the specific solid-state storage device 102, if the solid-state storage media 110 is connected to a different solid-state storage controller 104, solid-state storage device 102, or computing system 114, the contents of the solid-state storage media 110 typically could not be read without use of the same encryption key used during the write of the data to the solid-state storage media 110 without significant effort.

In another embodiment, the write data pipeline 106 includes a compression module 312 that compresses the data for metadata segment prior to sending the data segment to the packetizer 302. The compression module 312 typically compresses a data or metadata segment using a compression routine known to those of skill in the art to reduce the storage size of the segment. For example, if a data segment includes a string of 512 zeros, the compression module 312 may replace the 512 zeros with code or token indicating the 512 zeros where the code is much more compact than the space taken by the 512 zeros.

In one embodiment, the compression module 312 compresses a first segment with a first compression routine and passes along a second segment without compression. In another embodiment, the compression module 312 compresses a first segment with a first compression routine and compresses the second segment with a second compression routine. Having this flexibility within the solid-state storage device 102 is beneficial so that computing systems 114 or other devices writing data to the solid-state storage device 102 may each specify a compression routine or so that one can specify a compression routine while another specifies no compression. Selection of compression routines may also be selected according to default settings on a per data structure type or data structure class basis. For example, a first data structure of a specific data structure may be able to override default compression routine settings and a second data structure of the same data structure class and data structure type may use the default compression routine and a third data structure of the same data structure class and data structure type may use no compression.

In one embodiment, the write data pipeline 106 includes a garbage collector bypass 316 that receives data segments from the read data pipeline 108 as part of a data bypass in a garbage collection system. A garbage collection system typically marks packets that are no longer valid, typically because the packet is marked for deletion or has been modified and the modified data is stored in a different location. At some point, the garbage collection system determines that a particular section of storage may be recovered. This determination may be due to a lack of available storage capacity, the percentage of data marked as invalid reaching a threshold, a consolidation of valid data, an error detection rate for that section of storage reaching a threshold, or improving performance based on data distribution, etc. Numerous factors may be considered by a garbage collection algorithm to determine when a section of storage is to be recovered.

Once a section of storage has been marked for recovery, valid packets in the section typically must be relocated. The garbage collector bypass 316 allows packets to be read into the read data pipeline 108 and then transferred directly to the write data pipeline 106 without being routed out of the solid-state storage controller 104. In one embodiment, the garbage collector bypass 316 is part of an autonomous garbage collector system that operates within the solid-state storage device 102. This allows the solid-state storage device 102 to manage data so that data is systematically spread throughout the solid-state storage media 110 to improve performance, data reliability and to avoid overuse and underuse of any one location or area of the solid-state storage media 110 and to lengthen the useful life of the solid-state storage media 110.

The garbage collector bypass 316 coordinates insertion of segments into the write data pipeline 106 with other segments being written by computing systems 114 or other devices. In the depicted embodiment, the garbage collector bypass 316 is before the packetizer 302 in the write data pipeline 106 and after the depacketizer 324 in the read data pipeline 108, but may also be located elsewhere in the read and write data pipelines 106, 108. The garbage collector bypass 316 may be used during a flush of the write pipeline 108 to fill the remainder of the virtual page in order to improve the efficiency of storage within the solid-state storage media 110 and thereby reduce the frequency of garbage collection.

In one embodiment, the write data pipeline 106 includes a write buffer 320 that buffers data for efficient write operations. Typically, the write buffer 320 includes enough capacity for packets to fill at least one virtual page in the solid-state storage media 110. This allows a write operation to send an entire page of data to the solid-state storage media 110 without interruption. By sizing the write buffer 320 of the write data pipeline 106 and buffers within the read data pipeline 108 to be the same capacity or larger than a storage write buffer within the solid-state storage media 110, writing and reading data is more efficient since a single write command may be crafted to send a full virtual page of data to the solid-state storage media 110 instead of multiple commands.

While the write buffer 320 is being filled, the solid-state storage media 110 may be used for other read operations. This is advantageous because other solid-state devices with a smaller write buffer or no write buffer may tie up the solid-state storage when data is written to a storage write buffer and data flowing into the storage write buffer stalls. Read operations will be blocked until the entire storage write buffer is filled and programmed. Another approach for systems without a write buffer or a small write buffer is to flush the storage write buffer that is not full in order to enable reads. Again this is inefficient because multiple write/program cycles are required to fill a page.

For depicted embodiment with a write buffer 320 sized larger than a virtual page, a single write command, which includes numerous subcommands, can then be followed by a single program command to transfer the page of data from the storage write buffer in each solid-state storage element 216, 218, 220 to the designated page within each solid-state storage element 216, 218, 220. This technique has the benefits of eliminating partial page programming, which is known to reduce data reliability and durability and freeing up the destination bank for reads and other commands while the buffer fills.

In one embodiment, the write buffer 320 is a ping-pong buffer where one side of the buffer is filled and then designated for transfer at an appropriate time while the other side of the ping-pong buffer is being filled. In another embodiment, the write buffer 320 includes a first-in first-out ("FIFO")

register with a capacity of more than a virtual page of data segments. One of skill in the art will recognize other write buffer 320 configurations that allow a virtual page of data to be stored prior to writing the data to the solid-state storage media 110.

In another embodiment, the write buffer 320 is sized smaller than a virtual page so that less than a page of information could be written to a storage write buffer in the solid-state storage media 110. In the embodiment, to prevent a stall in the write data pipeline 106 from holding up read operations, data is queued using the garbage collection system that needs to be moved from one location to another as part of the garbage collection process. In case of a data stall in the write data pipeline 106, the data can be fed through the garbage collector bypass 316 to the write buffer 320 and then on to the storage write buffer in the solid-state storage media 110 to fill the pages of a virtual page prior to programming the data. In this way a data stall in the write data pipeline 106 would not stall reading from the solid-state storage device 102.

In another embodiment, the write data pipeline 106 includes a write program module 310 with one or more user-definable functions within the write data pipeline 106. The write program module 310 allows a user to customize the write data pipeline 106. A user may customize the write data pipeline 106 based on a particular data requirement or application. Where the solid-state storage controller 104 is an FPGA, the user may program the write data pipeline 106 with custom commands and functions relatively easily. A user may also use the write program module 310 to include custom functions with an ASIC, however, customizing an ASIC may be more difficult than with an FPGA. The write program module 310 may include buffers and bypass mechanisms to allow a first data segment to execute in the write program module 310 while a second data segment may continue through the write data pipeline 106. In another embodiment, the write program module 310 may include a processor core that can be programmed through software.

Note that the write program module 310 is shown between the input buffer 306 and the compression module 312, however, the write program module 310 could be anywhere in the write data pipeline 106 and may be distributed among the various stages 302-320. In addition, there may be multiple write program modules 310 distributed among the various states 302-320 that are programmed and operate independently. In addition, the order of the stages 302-320 may be altered. One of skill in the art will recognize workable alterations to the order of the stages 302-320 based on particular user requirements.

Read Data Pipeline

The read data pipeline 108 includes an ECC correction module 322 that determines if a data error exists in ECC blocks a requested packet received from the solid-state storage media 110 by using ECC stored with each ECC block of the requested packet. The ECC correction module 322 then corrects any errors in the requested packet if any error exists and the errors are correctable using the ECC. For example, if the ECC can detect an error in six bits but can only correct three bit errors, the ECC correction module 322 corrects ECC blocks of the requested packet with up to three bits in error. The ECC correction module 322 corrects the bits in error by changing the bits in error to the correct one or zero state so that the requested data packet is identical to when it was written to the solid-state storage media 110 and the ECC was generated for the packet.

If the ECC correction module 322 determines that the requested packets contains more bits in error than the ECC can correct, the ECC correction module 322 cannot correct the errors in the corrupted ECC blocks of the requested packet and sends an interrupt. In one embodiment, the ECC correction module 322 sends an interrupt with a message indicating that the requested packet is in error. The message may include information that the ECC correction module 322 cannot correct the errors or the inability of the ECC correction module 322 to correct the errors may be implied. In another embodiment, the ECC correction module 322 sends the corrupted ECC blocks of the requested packet with the interrupt and/or the message.

In one embodiment, a corrupted ECC block or portion of a corrupted ECC block of the requested packet that cannot be corrected by the ECC correction module 322 is read by the master controller 224, corrected, and returned to the ECC correction module 322 for further processing by the read data pipeline 108. In one embodiment, a corrupted ECC block or portion of a corrupted ECC block of the requested packet is sent to the device requesting the data. The requesting device 155 may correct the ECC block or replace the data using another copy, such as a backup or mirror copy, and then may use the replacement data of the requested data packet or return it to the read data pipeline 108. The requesting device 155 may use header information in the requested packet in error to identify data required to replace the corrupted requested packet or to replace the data structure to which the packet belongs. In another embodiment, the solid-state storage controller 104 stores data using some type of RAID and is able to recover the corrupted data. In another embodiment, the ECC correction module 322 sends an interrupt and/or message and the receiving device fails the read operation associated with the requested data packet. One of skill in the art will recognize other options and actions to be taken as a result of the ECC correction module 322 determining that one or more ECC blocks of the requested packet are corrupted and that the ECC correction module 322 cannot correct the errors.

The read data pipeline 108 includes a depacketizer 324 that receives ECC blocks of the requested packet from the ECC correction module 322, directly or indirectly, and checks and removes one or more packet headers. The depacketizer 324 may validate the packet headers by checking packet identifiers, data length, data location, etc. within the headers. In one embodiment, the header includes a hash code that can be used to validate that the packet delivered to the read data pipeline 108 is the requested packet. The depacketizer 324 also removes the headers from the requested packet added by the packetizer 302. The depacketizer 324 may directed to not operate on certain packets but pass these forward without modification. An example might be a container label that is requested during the course of a rebuild process where the header information is required for index reconstruction. Further examples include the transfer of packets of various types destined for use within the solid-state storage device 102. In another embodiment, the depacketizer 324 operation may be packet type dependent.

The read data pipeline 108 includes an alignment module 326 that receives data from the depacketizer 324 and removes unwanted data. In one embodiment, a read command sent to the solid-state storage media 110 retrieves a packet of data. A device requesting the data may not require all data within the retrieved packet and the alignment module 326 removes the unwanted data. If all data within a retrieved page is requested data, the alignment module 326 does not remove any data.

The alignment module 326 re-formats the data as data segments of a data structure in a form compatible with a device requesting the data segment prior to forwarding the data segment to the next stage. Typically, as data is processed by the read data pipeline 108, the size of data segments or packets changes at various stages. The alignment module 326 uses received data to format the data into data segments suitable to be sent to the requesting device 155 and joined to form a response. For example, data from a portion of a first data packet may be combined with data from a portion of a second data packet. If a data segment is larger than a data requested by the requesting device 155, the alignment module 326 may discard the unwanted data.

In one embodiment, the read data pipeline 108 includes a read synchronization buffer 328 that buffers one or more requested packets read from the solid-state storage media 110 prior to processing by the read data pipeline 108. The read synchronization buffer 328 is at the boundary between the solid-state storage clock domain and the local bus clock domain and provides buffering to account for the clock domain differences.

In another embodiment, the read data pipeline 108 includes an output buffer 330 that receives requested packets from the alignment module 326 and stores the packets prior to transmission to the requesting device 155. The output buffer 330 accounts for differences between when data segments are received from stages of the read data pipeline 108 and when the data segments are transmitted to other parts of the solid-state storage controller 104 or to the requesting device 155. The output buffer 330 also allows the data bus 204 to receive data from the read data pipeline 108 at rates greater than can be sustained by the read data pipeline 108 in order to improve efficiency of operation of the data bus 204.

In one embodiment, the read data pipeline 108 includes a media decryption module 332 that receives one or more encrypted requested packets from the ECC correction module 322 and decrypts the one or more requested packets using the encryption key unique to the solid-state storage device 102 prior to sending the one or more requested packets to the depacketizer 324. Typically the encryption key used to decrypt data by the media decryption module 332 is identical to the encryption key used by the media encryption module 318. In another embodiment, the solid-state storage media 110 may have two or more partitions and the solid-state storage controller 104 behaves as though it was two or more solid-state storage controllers 104 each operating on a single partition within the solid-state storage media 110. In this embodiment, a unique media encryption key may be used with each partition.

In another embodiment, the read data pipeline 108 includes a decryption module 334 that decrypts a data segment formatted by the depacketizer 324 prior to sending the data segment to the output buffer 330. The data segment may be decrypted using an encryption key received in conjunction with the read request that initiates retrieval of the requested packet received by the read synchronization buffer 328. The decryption module 334 may decrypt a first packet with an encryption key received in conjunction with the read request for the first packet and then may decrypt a second packet with a different encryption key or may pass the second packet on to the next stage of the read data pipeline 108 without decryption. When the packet was stored with a non-secret cryptographic nonce, the nonce is used in conjunction with an encryption key to decrypt the data packet. The encryption key may be received from a computing system 114, a client, key manager, or other device that manages the encryption key to be used by the solid-state storage controller 104.

In another embodiment, the read data pipeline 108 includes a decompression module 336 that decompresses a data segment formatted by the depacketizer 324. In one embodiment, the decompression module 336 uses compression information stored in one or both of the packet header and the container label to select a complementary routine to that used to compress the data by the compression module 312. In another embodiment, the decompression routine used by the decompression module 336 is dictated by the device requesting the data segment being decompressed. In another embodiment, the decompression module 336 selects a decompression routine according to default settings on a per data structure type or data structure class basis. A first packet of a first object may be able to override a default decompression routine and a second packet of a second data structure of the same data structure class and data structure type may use the default decompression routine and a third packet of a third data structure of the same data structure class and data structure type may use no decompression.

In another embodiment, the read data pipeline 108 includes a read program module 338 that includes one or more user-definable functions within the read data pipeline 108. The read program module 338 has similar characteristics to the write program module 310 and allows a user to provide custom functions to the read data pipeline 108. The read program module 338 may be located as shown in FIG. 3, may be located in another position within the read data pipeline 108, or may include multiple parts in multiple locations within the read data pipeline 108. Additionally, there may be multiple read program modules 338 within multiple locations within the read data pipeline 108 that operate independently. One of skill in the art will recognize other forms of a read program module 338 within a read data pipeline 108. As with the write data pipeline 106, the stages of the read data pipeline 108 may be rearranged and one of skill in the art will recognize other orders of stages within the read data pipeline 108.

The solid-state storage controller 104 includes control and status registers 340 and corresponding control queues 342. The control and status registers 340 and control queues 342 facilitate control and sequencing commands and subcommands associated with data processed in the write and read data pipelines 106, 108. For example, a data segment in the packetizer 302 may have one or more corresponding control commands or instructions in a control queue 342 associated with the ECC generator 304. As the data segment is packetized, some of the instructions or commands may be executed within the packetizer 302. Other commands or instructions may be passed to the next control queue 342 through the control and status registers 340 as the newly formed data packet created from the data segment is passed to the next stage.

Commands or instructions may be simultaneously loaded into the control queues 342 for a packet being forwarded to the write data pipeline 106 with each pipeline stage pulling the appropriate command or instruction as the respective packet is executed by that stage. Similarly, commands or instructions may be simultaneously loaded into the control queues 342 for a packet being requested from the read data pipeline 108 with each pipeline stage pulling the appropriate command or instruction as the respective packet is executed by that stage. One of skill in the art will recognize other features and functions of control and status registers 340 and control queues 342.

Figure 4:
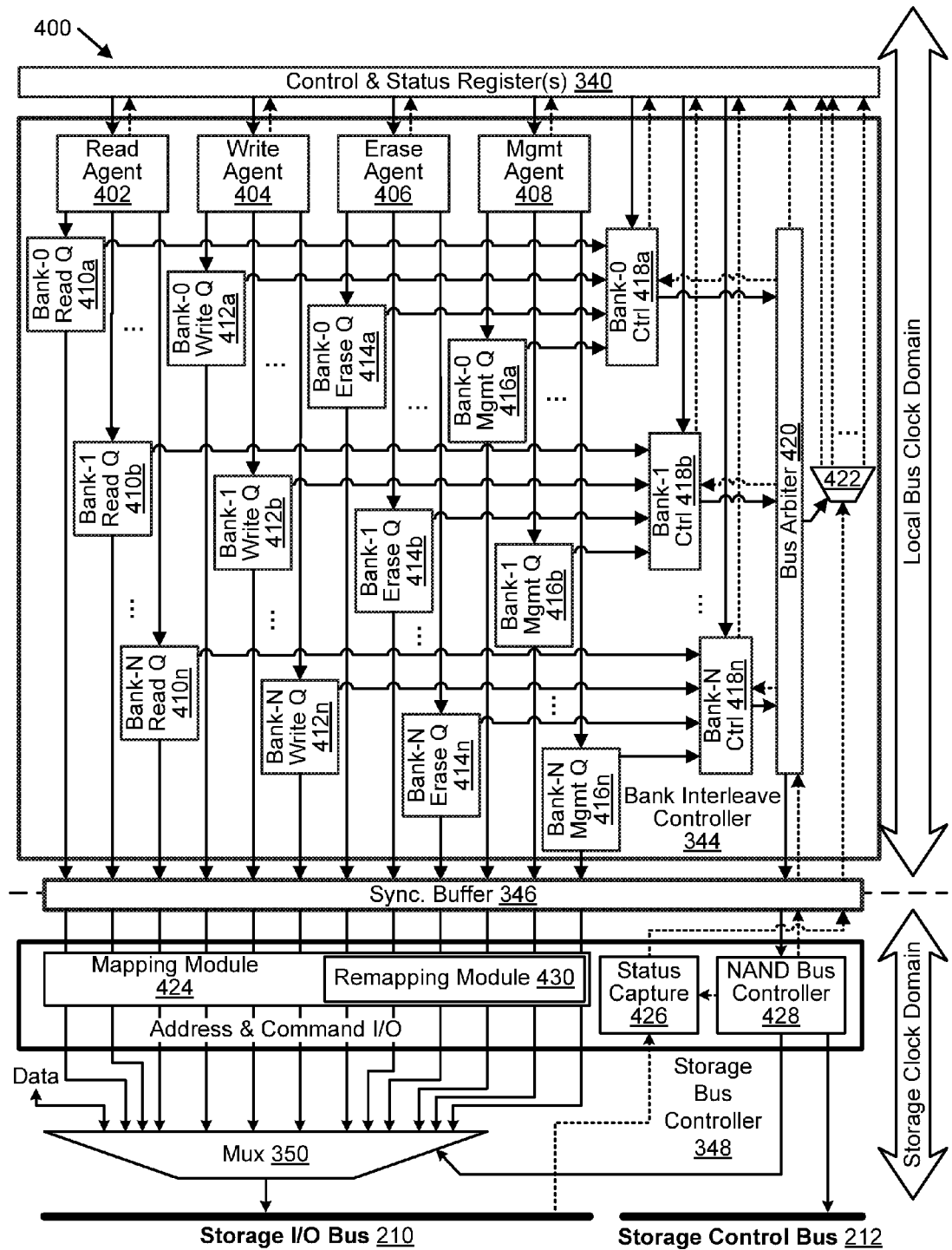
FIG. 4 is a schematic block diagram illustrating one embodiment of a bank interleave controller in a solid-state storage controller.

The solid-state storage controller 104 and or solid-state storage device 102 may also include a bank interleave controller 344, a synchronization buffer 346, a storage bus controller 348, and a multiplexer ("MUX") 350, which are described in relation to FIG. 4.

Bank Interleave

FIG. 4 is a schematic block diagram illustrating one embodiment 400 of a bank interleave controller 344 in the solid-state storage controller 104 in accordance with the present invention. The bank interleave controller 344 is connected to the control and status registers 340 and to the storage I/O bus 210 and storage control bus 212 through the MUX 350, storage bus controller 348, and synchronization buffer 346, which are described below. The bank interleave controller 344 includes a read agent 402, a write agent 404, an erase agent 406, a management agent 408, read queues 410a-n, write queues 412a-n, erase queues 414a-n, and management queues 416a-n for the banks 214 in the solid-state storage media 110, bank controllers 418a-n, a bus arbiter 420, and a status MUX 422, which are described below. The storage bus controller 348 includes a mapping module 424 with a remapping module 430, a status capture module 426, and a NAND bus controller 428, which are described below.

The bank interleave controller 344 directs one or more commands to two or more queues in the bank interleave controller 104 and coordinates among the banks 214 of the solid-state storage media 110 execution of the commands stored in the queues, such that a command of a first type executes on one bank 214a while a command of a second type executes on a second bank 214b. The one or more commands are separated by command type into the queues. Each bank 214 of the solid-state storage media 110 has a corresponding set of queues within the bank interleave controller 344 and each set of queues includes a queue for each command type.

The bank interleave controller 344 coordinates among the banks 214 of the solid-state storage media 110 execution of the commands stored in the queues. For example, a command of a first type executes on one bank 214a while a command of a second type executes on a second bank 214b. Typically the command types and queue types include read and write commands and queues 410, 412, but may also include other commands and queues that are storage media specific. For example, in the embodiment depicted in FIG. 4, erase and management queues 414, 416 are included and would be appropriate for flash memory, NRAM, MRAM, DRAM, PRAM, etc.

For other types of solid-state storage media 110, other types of commands and corresponding queues may be included without straying from the scope of the invention. The flexible nature of an FPGA solid-state storage controller 104 allows flexibility in storage media. If flash memory were changed to another solid-state storage type, the bank interleave controller 344, storage bus controller 348, and MUX 350 could be altered to accommodate the media type without significantly affecting the data pipelines 106, 108 and other solid-state storage controller 104 functions.

In the embodiment depicted in FIG. 4, the bank interleave controller 344 includes, for each bank 214, a read queue 410 for reading data from the solid-state storage media 110, a write queue 412 for write commands to the solid-state storage media 110, an erase queue 414 for erasing an erase block in the solid-state storage, an a management queue 416 for management commands. The bank interleave controller 344 also includes corresponding read, write, erase, and management agents 402, 404, 406, 408. In another embodiment, the control and status registers 340 and control queues 342 or similar components queue commands for data sent to the banks 214 of the solid-state storage media 110 without a bank interleave controller 344.

The agents 402, 404, 406, 408, in one embodiment, direct commands of the appropriate type destined for a particular bank 214a to the correct queue for the bank 214a. For example, the read agent 402 may receive a read command for bank-1 214b and directs the read command to the bank-1 read queue 410b. The write agent 404 may receive a write command to write data to a location in bank-0 214a of the solid-state storage media 110 and will then send the write command to the bank-0 write queue 412a. Similarly, the erase agent 406 may receive an erase command to erase an erase block in bank-1 214b and will then pass the erase command to the bank-1 erase queue 414b. The management agent 408 typically receives management commands, status requests, and the like, such as a reset command or a request to read a configuration register of a bank 214, such as bank-0 214a. The management agent 408 sends the management command to the bank-0 management queue 416a.

The agents 402, 404, 406, 408 typically also monitor status of the queues 410, 412, 414, 416 and send status, interrupt, or other messages when the queues 410, 412, 414, 416 are full, nearly full, non-functional, etc. In one embodiment, the agents 402, 404, 406, 408 receive commands and generate corresponding sub-commands. In one embodiment, the agents 402, 404, 406, 408 receive commands through the control & status registers 340 and generate corresponding sub-commands which are forwarded to the queues 410, 412, 414, 416. One of skill in the art will recognize other functions of the agents 402, 404, 406, 408.

The queues 410, 412, 414, 416 typically receive commands and store the commands until required to be sent to the solid-state storage banks 214. In a typical embodiment, the queues 410, 412, 414, 416 are first-in, first-out ("FIFO") registers or a similar component that operates as a FIFO. In another embodiment, the queues 410, 412, 414, 416 store commands in an order that matches data, order of importance, or other criteria.

The bank controllers 418 typically receive commands from the queues 410, 412, 414, 416 and generate appropriate sub-commands. For example, the bank-0 write queue 412a may receive a command to write a page of data packets to bank-0 214a. The bank-0 controller 418a may receive the write command at an appropriate time and may generate one or more write subcommands for each data packet stored in the write buffer 320 to be written to the page in bank-0 214a. For example, bank-0 controller 418a may generate commands to validate the status of bank 0 214a and the solid-state storage array 216, select the appropriate location for writing one or more data packets, clear the input buffers within the solid-state storage memory array 216, transfer the one or more data packets to the input buffers, program the input buffers into the selected location, verify that the data was correctly programmed, and if program failures occur do one or more of interrupting the master controller 224, retrying the write to the same physical location, and retrying the write to a different physical location. Additionally, in conjunction with example write command, the storage bus controller 348 will cause the one or more commands to multiplied to each of the each of the storage I/O buses 210a-n with the logical address of the command mapped to a first physical addresses for storage I/O bus 210a, and mapped to a second physical address for storage I/O bus 210b, and so forth as further described below.

Typically, bus arbiter 420 selects from among the bank controllers 418 and pulls subcommands from output queues within the bank controllers 418 and forwards these to the Storage Bus Controller 348 in a sequence that optimizes the performance of the banks 214. In another embodiment, the bus arbiter 420 may respond to a high level interrupt and modify the normal selection criteria. In another embodiment, the master controller 224 can control the bus arbiter 420 through the control and status registers 340. One of skill in the art will recognize other means by which the bus arbiter 420 may control and interleave the sequence of commands from the bank controllers 418 to the solid-state storage media 110.

The bus arbiter 420 typically coordinates selection of appropriate commands, and corresponding data when required for the command type, from the bank controllers 418 and sends the commands and data to the storage bus controller 348. The bus arbiter 420 typically also sends commands to the storage control bus 212 to select the appropriate bank 214. For the case of flash memory or other solid-state storage media 110 with an asynchronous, bi-directional serial storage I/O bus 210, only one command (control information) or set of data can be transmitted at a time. For example, when write commands or data are being transmitted to the solid-state storage media 110 on the storage I/O bus 210, read commands, data being read, erase commands, management commands, or other status commands cannot be transmitted on the storage I/O bus 210. For example, when data is being read from the storage I/O bus 210, data cannot be written to the solid-state storage media 110.

For example, during a write operation on bank-0 the bus arbiter 420 selects the bank-0 controller 418a which may have a write command or a series of write sub-commands on the top of its queue which cause the storage bus controller 348 to execute the following sequence. The bus arbiter 420 forwards the write command to the storage bus controller 348, which sets up a write command by selecting bank-0 214a through the storage control bus 212, sending a command to clear the input buffers of the solid-state storage elements 110 associated with the bank-0 214a, and sending a command to validate the status of the solid-state storage elements 216, 218, 220 associated with the bank-0 214a. The storage bus controller 348 then transmits a write subcommand on the storage I/O bus 210, which contains the physical addresses including the address of the logical erase block for each individual physical erase solid-stage storage element 216a-m as mapped from the logical erase block address. The storage bus controller 348 then muxes the write buffer 320 through the write synchronization buffer 308 to the storage I/O bus 210 through the MUX 350 and streams write data to the appropriate page. When the page is full, then storage bus controller 348 causes the solid-state storage elements 216a-m associated with the bank-0 214a to program the input buffer to the memory cells within the solid-state storage elements 216a-m. Finally, the storage bus controller 348 validates the status to ensure that page was correctly programmed.

A read operation is similar to the write example above. During a read operation, typically the bus arbiter 420, or other component of the bank interleave controller 344, receives data and corresponding status information and sends the data to the read data pipeline 108 while sending the status information on to the control and status registers 340. Typically, a read data command forwarded from bus arbiter 420 to the storage bus controller 348 will cause the MUX 350 to gate the read data on storage I/O bus 210 to the read data pipeline 108 and send status information to the appropriate control and status registers 340 through the status MUX 422.

The bus arbiter 420 coordinates the various command types and data access modes so that only an appropriate command type or corresponding data is on the bus at any given time. If the bus arbiter 420 has selected a write command, and write subcommands and corresponding data are being written to the solid-state storage media 110, the bus arbiter 420 will not allow other command types on the storage I/O bus 210. Beneficially, the bus arbiter 420 uses timing information, such as predicted command execution times, along with status information received concerning bank 214 status to coordinate execution of the various commands on the bus with the goal of minimizing or eliminating idle time of the busses.

The master controller 224 through the bus arbiter 420 typically uses expected completion times of the commands stored in the queues 410, 412, 414, 416, along with status information, so that when the subcommands associated with a command are executing on one bank 214a, other subcommands of other commands are executing on other banks 214b-n. When one command is fully executed on a bank 214a, the bus arbiter 420 directs another command to the bank 214a. The bus arbiter 420 may also coordinate commands stored in the queues 410, 412, 414, 416 with other commands that are not stored in the queues 410, 412, 414, 416.

For example, an erase command may be sent out to erase a group of erase blocks within the solid-state storage media 110. An erase command may take 10 to 1000 times more time to execute than a write or a read command or 10 to 100 times more time to execute than a program command. For N banks 214, the bank interleave controller 344 may split the erase command into N commands, each to erase a virtual erase block of a bank 214a. While Bank 0 214a is executing an erase command, the bus arbiter 420 may select other commands for execution on the other banks 214b-n. The bus arbiter 420 may also work with other components, such as the storage bus controller 348, the master controller 224, etc., to coordinate command execution among the buses. Coordinating execution of commands using the bus arbiter 420, bank controllers 418, queues 410, 412, 414, 416, and agents 402, 404, 406, 408 of the bank interleave controller 344 can dramatically increase performance over other solid-state storage systems without a bank interleave function.

In one embodiment, the solid-state controller 104 includes one bank interleave controller 344 that serves all of the storage elements 216, 218, 220 of the solid-state storage media 110. In another embodiment, the solid-state controller 104 includes a bank interleave controller 344 for each column of storage elements 216a-m, 218a-m, 220a-m. For example, one bank interleave controller 344 serves one column of storage elements SSS 0.0-SSS N.0 216a, 218a, . . . 220a, a second bank interleave controller 344 serves a second column of storage elements SSS 0.1-SSS N.1 216b, 218b, . . . 220b etc.

Storage-Specific Components

The solid-state storage controller 104 includes a synchronization buffer 346 that buffers commands and status messages sent and received from the solid-state storage media 110. The synchronization buffer 346 is located at the boundary between the solid-state storage clock domain and the local bus clock domain and provides buffering to account for the clock domain differences. The synchronization buffer 346, write synchronization buffer 308, and read synchronization buffer 328 may be independent or may act together to buffer data, commands, status messages, etc. In one embodiment, the synchronization buffer 346 is located where there are the fewest number of signals crossing the clock domains. One skilled in the art will recognize that synchronization between clock domains may be arbitrarily moved to other locations within the solid-state storage device 102 in order to optimize some aspect of design implementation.

The solid-state storage controller 104 includes a storage bus controller 348 that interprets and translates commands for data sent to and read from the solid-state storage media 110 and status messages received from the solid-state storage media 110 based on the type of solid-state storage media 110. For example, the storage bus controller 348 may have different timing requirements for different types of storage, storage with different performance characteristics, storage from different manufacturers, etc. The storage bus controller 348 also sends control commands to the storage control bus 212.

In one embodiment, the solid-state storage controller 104 includes a MUX 350 that comprises an array of multiplexers 350*a-n* where each multiplexer is dedicated to a row in the solid-state storage array 110. For example, multiplexer 350*a* is associated with solid-state storage elements 216*a*, 218*a*, 220*a*. MUX 350 routes the data from the write data pipeline 106 and commands from the storage bus controller 348 to the solid-state storage media 110 via the storage I/O bus 210 and routes data and status messages from the solid-state storage media 110 via the storage I/O bus 210 to the read data pipeline 108 and the control and status registers 340 through the storage bus controller 348, synchronization buffer 346, and bank interleave controller 344.

In one embodiment, the solid-state storage controller 104 includes a MUX 350 for each column of solid-state storage elements (e.g. SSS 0.0 216*a*, SSS 1.0 218*a*, SSS N.0 220*a*). A MUX 350 combines data from the write data pipeline 106 and commands sent to the solid-state storage media 110 via the storage I/O bus 210 and separates data to be processed by the read data pipeline 108 from commands. Packets stored in the write buffer 320 are directed on busses out of the write buffer 320 through a write synchronization buffer 308 for each column of solid-state storage elements (SSS 0.*x* to SSS N.*x* 216, 218, 220) to the MUX 350 for each column of solid-state storage elements (SSS 0.*x* to SSS N.*x* 216, 218, 220). The commands and read data are received by the MUXes 350 from the storage I/O bus 210. The MUXes 350 also direct status messages to the storage bus controller 348.

The storage bus controller 348 includes a mapping module 424. The mapping module 424 maps a logical address of an erase block to one or more physical addresses of an erase block. For example, a solid-state storage media 110 with an array of twenty storage elements (e.g. SSS 0.0 to SSS 0.M 216) per bank 214*a* may have a logical address for a particular erase block mapped to twenty physical addresses of the erase block, one physical address per storage element. Because the storage elements are accessed in parallel, erase blocks at the same position in each storage element in a column of storage elements 216*a*, 218*a*, 220*a* will share a physical address. To select one erase block (e.g. in storage element SSS 0.0 216*a*) instead of all erase blocks in the row (e.g. in storage elements SSS 0.0, 1.0, . . . N.0 216*a*, 218*a*, 220*a*), one bank (in this case Bank 0 214*a*) is selected.

This logical-to-physical mapping for erase blocks is beneficial because if one erase block becomes damaged or inaccessible, the mapping can be changed to map to another erase block. This mitigates the loss of losing an entire virtual erase block when one element's erase block is faulty. The remapping module 430 changes a mapping of a logical address of an erase block to one or more physical addresses of a virtual erase block (spread over the array of storage elements). For example, virtual erase block 1 may be mapped to erase block 1 of storage element SSS 0.0 216*a*, to erase block 1 of storage element SSS 0.1 216*b*, . . . , and to storage element 0.M 216*m*, virtual erase block 2 may be mapped to erase block 2 of storage element SSS 1.0 218*a*, to erase block 2 of storage element SSS 1.1 218*b*, . . . , and to storage element 1.M 218*m*, etc. Alternatively, virtual erase block 1 may be mapped to one erase block from each storage element in an array such that virtual erase block 1 includes erase block 1 of storage element SSS 0.0 216*a* to erase block 1 of storage element SSS 0.1 216*b* to storage element 0.M 216*m*, and erase block 1 of storage element SSS 1.0 218*a* to erase block 1 of storage element SSS 1.1 218*b*, . . . , and to storage element 1.M 218*m*, for each storage element in the array up to erase block 1 of storage element N.M 220*m*.

If erase block 1 of a storage element SSS 0.0 216*a* is damaged, experiencing errors due to wear, etc., or cannot be used for some reason, the remapping module 430 could change the logical-to-physical mapping for the logical address that pointed to erase block 1 of virtual erase block 1. If a spare erase block (call it erase block 221) of storage element SSS 0.0 216*a* is available and currently not mapped, the remapping module 430 could change the mapping of virtual erase block 1 to point to erase block 221 of storage element SSS 0.0 216*a*, while continuing to point to erase block 1 of storage element SSS 0.1 216*b*, erase block 1 of storage element SSS 0.2 (not shown) . . . , and to storage element 0.M 216*m*. The mapping module 424 or remapping module 430 could map erase blocks in a prescribed order (virtual erase block 1 to erase block 1 of the storage elements, virtual erase block 2 to erase block 2 of the storage elements, etc.) or may map erase blocks of the storage elements 216, 218, 220 in another order based on some other criteria.

In one embodiment, the erase blocks could be grouped by access time. Grouping by access time, meaning time to execute a command, such as programming (writing) data into pages of specific erase blocks, can level command completion so that a command executed across the erase blocks of a virtual erase block is not limited by the slowest erase block. In other embodiments, the erase blocks may be grouped by wear level, health, etc. One of skill in the art will recognize other factors to consider when mapping or remapping erase blocks.

In one embodiment, the storage bus controller 348 includes a status capture module 426 that receives status messages from the solid-state storage media 110 and sends the status messages to the status MUX 422. In another embodiment, when the solid-state storage media 110 is flash memory, the storage bus controller 348 includes a NAND bus controller 428. The NAND bus controller 428 directs commands from the read and write data pipelines 106, 108 to the correct location in the solid-state storage media 110, coordinates timing of command execution based on characteristics of the flash memory, etc. If the solid-state storage media 110 is another solid-state storage type, the NAND bus controller 428 would be replaced by a bus controller specific to the storage type. One of skill in the art will recognize other functions of a NAND bus controller 428.

Reducing Storage Device Power Consumption

Figure 5:
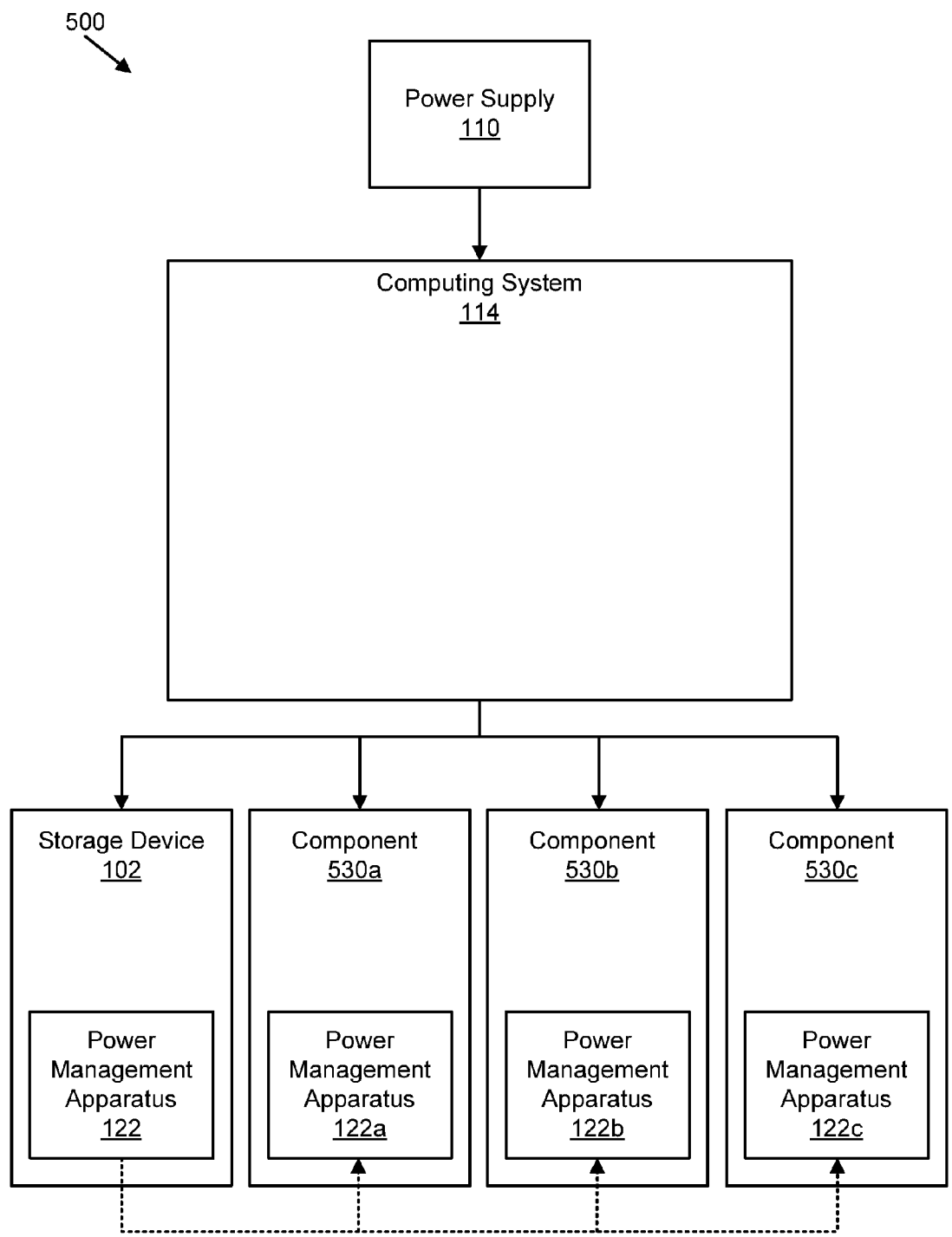
FIG. 5 is a schematic block diagram illustrating one embodiment of a system with multiple components having power management apparatus.

FIG. 5 depicts one embodiment of a system 500 for managing power consumption in a storage device 102 and in a plurality of components 530*a-c*. The system 500, in one embodiment, is substantially similar to the system 100 described above with regard to FIG. 1, with the addition of the plurality of components 530*a-c*. In the depicted embodiment, the storage device 102 includes a power management apparatus 122, and each of the components 530*a-c* includes a power management apparatus 122*a-c*. In another embodiment, a single power management apparatus 122 manages power consumption for the storage device 102 and the components 530*a-c*. The power management apparatus 122 is described in greater detail below with regard to FIG. 6.

While the power management apparatuses 122, 122*a-c*, in the depicted embodiment, are illustrated as part of the storage device 102 and the components 530*a-c*, in other embodiments, as described above with regard to FIG. 1, the power management apparatuses 122, 122*a-c* may be implemented as software drivers of the computing system 114, as a combination of software drivers and firmware/hardware/controllers of the storage device 102 and the components 530*a-c*, or the like. In one embodiment, the computing system 114 loads separate software drivers for each power management apparatus 122, 122*a-c*.

The power supply 112, in the depicted embodiment, provides electric power to the computing system 114 and, through it, the attached storage device 102 and components 530a-c. In certain embodiments, the computing system 114 distributes power to various components such as the storage device 102 and the components 530a-c shown. The power may be distributed via a number of different approaches; in one embodiment, the storage device 102 and the components 530a-c connect to a motherboard which provides the necessary power for the computing system 114. In other embodiments, the storage device 102 and/or one or more of the components 530a-c are remote from the computing system 114 and network attached.

The components 530a-c provide computing capabilities for the computing system 114. The components 530a-c may be additional storage devices, such as Flash memory, hard disk drives, optical drives, or the like; graphics processors; network cards; or other computer components. Those of skill in the art will appreciate the different types of components 530a-c that may be in a computing system 114. The storage device 102 and the components 530a-c may be internal or external to the computing system 114. In one embodiment, the components 530a-c are PCI or PCI-e cards that connect to the computing system 114. The components 530a-c may receive power through the computing system 114.

In certain embodiments, the power management apparatuses 122, 122a-c may dynamically adjust power allocations for the storage device 102 and the components 530a-c. The computing system 114 and/or the power management apparatuses 122, 122a-c may dedicate more or less power to a particular component 530a-c or the storage device 102 at a particular time based on power consumption rates of other components 530a-c and of the storage device 102. The computing system 114 and/or the power management apparatuses 122, 122a-c may thus dynamically change the allocation of power and send appropriate parameters to the storage device 102 and the components 530a-c.

In certain embodiments, the power management apparatuses 122, 122a-c monitor the activity of the storage device 102 and the components 530a-c to determine whether or not the storage device 102 and the components 530a-c are active. If a particular component 530a-c or the storage device 102 is inactive, the power management apparatus 122, 122a-c for that component 530a-c or storage device 102 may inform the other power management apparatuses 122, 122a-c that the component 530a-c or storage device 102 is inactive. For example, if a component 530a-c that is a wireless card is not currently connected to a wireless network, or if the wireless connection and/or card is powered off, the power management apparatus 122a-c on that component 530a-c may inform the other power management apparatuses 122, 122a-c, and correspondingly increase the power consumption target for any of the other active components 530a-c and/or the storage device 102.

In the depicted embodiment, the power management apparatuses 122, 122a-c are arranged in a master/slave relationship, with the power management apparatus 122 of the storage device 102 as the master. In other embodiments, the system 500 may include a single system power management apparatus 122 that manages power consumption rates for the storage device 102 and the components 530a-c, the power management apparatuses 122, 122a-c may operate independently, one of the component power management apparatuses 122a-c may serve as a master, or the like.

In one embodiment, the slave power management apparatuses 122a-c follow adjustments that the master power management apparatus 122 makes. For example, in one embodiment, instead of monitoring power consumption rates for the storage device 102 and each of the components 530a-c, the master power management apparatus 122 monitors the power consumption rate of a single component (the storage device 102, in the depicted embodiment) and the power management apparatuses 122, 122a-c each adjust operations on the storage device 102 and the components 530a-c based on the power consumption rate of the single component.

In certain embodiments, adjusting operations of the storage device 102 and the components 530a-c similarly, in parallel, may be more efficient than managing them separately. For example, in an embodiment where the storage device 102 and the components 530a-c comprise a storage array that is accessed in parallel, it may be inefficient to throttle or slow operations on a single storage device 102 without throttling or slowing operations on the other components 530a-c. In the example embodiment, power consumption rates may also be similar in the storage device 102 and the components 530a-c, due to parallel accesses, which also makes parallel adjustments efficient by allowing the power management apparatus 122 to monitor a single power consumption rate.

The master power management apparatus 122, in various embodiments, may communicate an adjustment to be made, a power consumption rate, a power consumption target, and/or other information to the slave power management apparatuses 122a-c. In another embodiment, instead of basing adjustments on a static master component or master power management apparatus 122, the power management apparatuses 122, 122a-c dynamically adjust operations based on any one of the power consumption rates failing to satisfy a power consumption target.

In one embodiment, either a master power management apparatus 122 or a single system power management apparatus 122 (not shown) dynamically adjusts operations on the storage device 102 and the components 530a-c based on a system power consumption target for the storage device 102 and the components 530a-c so that a total power consumption rate satisfies the system power consumption target. In one embodiment, using a system power consumption target allows the power management apparatus 122 to dynamically allocate and balance power from the power supply 110 between the storage device 102 and the components 530a-c, allowing greater power use for certain components 530a-c executing power intensive operations by lowering a power allocation of other components 530a-c, or the like.

In another embodiment, instead of having a master/slave arrangement, the power management apparatuses 122, 122a-c are arranged as peers. The power management apparatuses 122, 122a-c, in one embodiment, communicate information, such as power consumption rates, power consumption targets, operation adjustments, and/or other information, to other power management apparatuses 122, 122a-c. In a further embodiment, the power management apparatuses 122, 122a-c adjust operations, adjust a power consumption target, or the like based on power consumption rates reported by peer power management apparatuses 122, 122a-c. In a further embodiment, a power management apparatus 122, 122a-c may request an additional allocation of power from a master power management apparatus 122, a peer power management apparatus 122, 122a-c, or the like.

In one embodiment, the power management apparatuses 122, 122a-c manage thermal states of the storage device 102 and the components 530a-c. The power management apparatuses 122, 122a-c, in various embodiments, may manage the thermal states substantially as described above with regard to power consumption, as master/slave, as peers, or the like. For example, in various embodiments, a single system power management apparatus 122 may manage the thermal states for the storage device 102 and the components 530a-c, one power management apparatus 122 may be selected as a master while other power management apparatus 122a-c may be selected as slaves for thermal management, the power management apparatuses 122, 122a-c may be arranged as peers for thermal management purposes, or the like.

In one embodiment, the power management apparatuses 122, 122a-c (or a single system power management apparatus 122) may monitor a single temperature for the storage device 102 and the components 530a-c, instead of monitoring separate individual temperatures. The single temperature or system temperature, in one embodiment, may be a temperature of an enclosure that houses the storage device 102 and the components 530a-c. In another embodiment, the single temperature may be the temperature of a single one of the storage device 102 and the components 530. In a further embodiment, the power management apparatuses 122, 122a-c (or a single system power management apparatus 122) monitor individual temperatures for each of the storage device 102 and the components 530a-c. The power management apparatuses 122, 122a-c (or a single system power management apparatus 122), in various embodiments, may manage the thermal states (adjusting execution of operations, etc.) of each of the storage device 102 and the components 530 individually, in parallel, or some combination of the two.

In a further embodiment, the power management apparatuses 122, 122a-c manage both power consumption and thermal states of the storage device 102 and the components 530a-c. In one embodiment, the power management apparatuses 122, 122a-c combine adjustments made for power consumption with adjustments made for thermal management into a single adjustment to operations for each of the storage device 102 and the components 530a-c. For example, in one embodiment, adjusting execution of operations for the storage device 102 and/or for the components 530a-c may serve a dual purpose of adjusting power consumption, which, in certain embodiments, may also have a direct correlation to reducing thermal heating.

In one embodiment, a master power management apparatus 122 determines a system adjustment to make for power consumption, and each power management apparatus 122, 122a-c determines an individual thermal adjustment and separately combines the individual thermal adjustment with the system adjustment into a single, independent adjustment for each respective storage device 102 and component 530a-c. In such an embodiment, the power management apparatuses 122, 122a-c make adjustments for power consumption substantially identically while making adjustments for thermal management independently.

The power management apparatuses 122, 122a-c, in one embodiment, combine power consumption adjustments and thermal adjustments cumulatively, summing the adjustments. In other embodiments, the power management apparatuses 122, 122a-c may combine power consumption adjustments and thermal adjustments by selecting the largest adjustment for use, factoring in previous adjustments, and/or otherwise combining the adjustments.

Figure 6A:
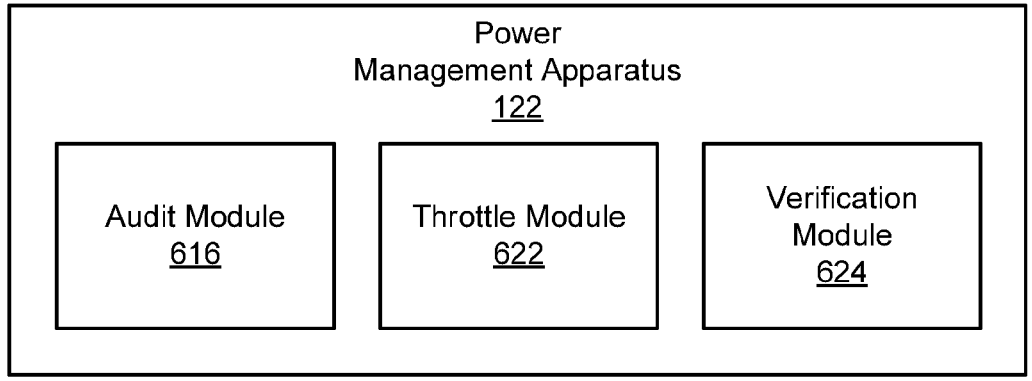
FIG. 6A is a schematic block diagram illustrating one embodiment of a power management apparatus.

FIG. 6A depicts one embodiment of the power management apparatus 122. The power management apparatus 122, in one embodiment, is substantially similar to the power management apparatus 122 described above with regard to FIG. 1 and/or the power management apparatuses 122, 122a-c described above with regard to FIG. 5. In the depicted embodiment, the power management apparatus 122 includes an audit module 616, a throttle module 622, and a verification module 624. Other embodiments of the power management apparatus 122, the audit module 616, the throttle module 622, and the verification module are described below with regard to FIG. 6B.

In general, the audit module 616 monitors a power consumption rate of a component 530, such as the storage device 102, relative to a power consumption target, the throttle module 622 adjusts operations on the component 530 in response to the power consumption rate failing to satisfy the power consumption target, and the verification module 624 verifies whether the power consumption rate of the component 530 satisfies the power consumption target in response to adjusting the execution of operations on the component 530. In a further embodiment, the audit module 616 monitors a temperature for a component 530, such as the storage device 102, relative to a thermal ceiling or other thermal target, the throttle module adjusts execution of operations on the component 530 in response to the temperature approaching the thermal ceiling, and the verification module 624 verifies whether the temperature is moving away from the thermal ceiling in response to adjusting the execution of the operations on the component 530.

The audit module 616, in one embodiment, monitors a power consumption rate of the associated component 530 relative to a power consumption target. In a further embodiment, the audit module 616 monitors a temperature for the associated component 530 relative to a thermal target, such as a thermal ceiling, or the like. Determining a power consumption target and/or a thermal target is described in greater detail below with regard to the target module 610 of FIG. 6B. In one embodiment, the audit module 616 determines whether or not the power consumption rate satisfies the power consumption threshold. In a further embodiment, the audit module 616 determines whether the temperature satisfies the thermal target.

The audit module 616, in one embodiment, receives power consumption and/or temperature information for the component 530 from one or more sensors, such as voltage sensors, current sensors, temperature sensors, and the like. The audit module 616, in one embodiment, determines a power consumption rate using a known or estimated voltage and a reading from a current sensor. For example, protocols such as PCI-e, Mini PCI-e, and the like often provide relatively stable voltage levels at 12V, 3.3V, 1.5V, and the like. The audit module 616, in one embodiment, uses provided voltage levels and measured current levels to determine a power consumption rate for the component 530.

In one embodiment, the audit module 616 monitors a power consumption rate that is an instantaneous power consumption rate based on current power usage of the corresponding component 530. In a further embodiment, the audit module 616 monitors a power consumption rate that is an average of power consumption over time, such as a decaying average, or the like. In one embodiment, a period of the average power consumption for the power consumption rate is selected to smooth spikes in power usage.

The audit module 616, in one embodiment, monitors a temperature for the corresponding component 530 based on a reading from a temperature sensor, such as a thermometer. In one embodiment, a controller, processor, FPGA, or other hardware of the component 530 includes a temperature sensor, and the audit module 616 accesses temperature readings from the hardware of the component 530. In a further embodiment, the component 530 includes a separate temperature sensor that provides the audit module 616 with a temperature for the component 530. Other embodiments of the audit module 616 are described below with regard to FIG. 6B.

The throttle module 622, in one embodiment, adjusts execution of operations on the corresponding component 530 in response to the power consumption rate for the component 530 failing to satisfy the power consumption target. As described above, in various embodiments, a power consumption rate fails to satisfy a power consumption target by approaching a power consumption ceiling defined by a power consumption target, exceeding a power consumption target or threshold set below a power consumption ceiling, being outside a range of allowable power consumption defined by a power consumption target, or the like.

In one embodiment, the throttle module 622 adjusts operations by throttling or slowing down operations on the component 530 to lower the power consumption rate of the component 530. In a further embodiment, the throttle module 622 adjusts operations by scheduling the operations so that power consumed by concurrently executed operations satisfies the power consumption target. Other ways that the throttle module 622 may adjust operations are described below with regard to FIG. 6B.

The throttle module 622, in one embodiment, adjusts operations on the corresponding component 530 by reducing a frequency with which the operations are executed on the component 530. In certain embodiments, the throttle module 622 reduces the frequency of operations by reducing a clock rate, clock speed, or clock frequency of a synchronous circuit of the component 530. In one embodiment, the throttle module 622 reduces the frequency of operations by setting a timer value specifying a frequency with which operations are submitted to the component 530 for execution. In another embodiment, the throttle module 622 reduces the frequency of operations by setting a timer value specifying a frequency with which hardware of the component 530 polls to verify that an operation has completed.

For example, in one embodiment, where the corresponding component 530 includes a nonvolatile solid-state storage device such as the storage device 102, the throttle module 622 may adjust a tPROG time for the component 530, and increasing the tPROG time reduces the frequency of program operations for the component 530. For nonvolatile solid-state storage, such as Flash memory, the tPROG time is the period of time between submitting a program command to a memory area (such as a die, a bank, a physical or logical page, or the like) and submitting a subsequent command to the same memory area. In certain embodiments, the subsequent command may be a status command, such as a READ STATUS command or the like, to verify that the program command has completed, was successful, or the like.

In a further embodiment, the power consumption target specifies a number of quanta or units that define an allowable amount of energy or power that the component 530 may use during a period of time. Operations on the component 530, in one embodiment, may also be assigned various amounts of quanta or units based on the amount of energy or power used to perform each operation. The throttle module 622, in one embodiment, adjusts execution of operations on the component 530 by scheduling the operations such that the quanta or units associated with concurrently executing operations satisfies the number of quanta or units permitted to satisfy the power consumption target. Assigning quanta to operations and scheduling the operations based on the quanta to satisfy a power consumption target is discussed in greater detail below with regard to FIG. 10.

In another embodiment, as described in greater detail below with regard to FIGS. 7A and 7B, the throttle module 622 adjusts execution of the operations on the component 530 by selecting operations from one or more queues of pending operations so that the power or energy used by concurrently executed operations satisfies the power consumption target. The throttle module 622, in certain embodiments, may adjust certain types of operations without adjusting other types of operations, may adjust different types of operations in different manners, or may otherwise dynamically or selectively adjust operations by type.

For example, in one embodiment, the throttle module 622 may adjust write (or program) operations but not erase operations, or vice versa. In another example embodiment, the throttle module 622 may adjust write (or program) operations differently than erase operations. In one embodiment, the throttle module 622 may ignore certain operations, such as read operations or the like, and may not adjust them at all. In a further example embodiment, the throttle module 622 may reduce a frequency of write (or program) operations by setting a timer, adjusting a tPROG time, or the like and may schedule erase operations to satisfy a power consumption target. Further embodiments of the throttle module 622 are described below with regard to FIG. 6B.

The verification module 624, in one embodiment, verifies whether the power consumption rate of the corresponding component 530 satisfies the power consumption target in response to the throttle module 622 adjusting execution of operations on the component 530. In another embodiment, the verification module 624 verifies whether the temperature of the component 530 satisfies the thermal target, is moving away from the thermal ceiling, or the like in response to the throttle module 622 adjusting execution of operations on the component 530.

The verification module 624, in one embodiment, is substantially similar to, is integrated with, is in communication with, cooperates with, and/or performs similar functions to the audit module 616. For example, in one embodiment, the verification module 624 may be part of or integrated with the audit module 616 and may compare a power consumption rate from prior to the adjustment of operations to a power consumption rate from after the adjustment of operations. In a further embodiment, the verification module 624 may compare a power consumption rate directly to the power consumption target to determine whether the power consumption rate satisfies the power consumption target. In one embodiment, the verification module 624 may verify that a temperature for the component 530 satisfies a thermal target in a similar manner.

In one embodiment, the verification module 624 waits a predefined period of time after the throttle module 622 adjusts the operations before verifying that the power consumption rate and/or the temperature of the component 530 satisfies the corresponding target. For example, in various embodiments, the predefined period of time may be selected to account for thermal inertia, throughput of the adjustments, or the like. In one embodiment, if the verification module 624 determines that the power consumption rate fails to satisfy the power consumption target, the throttle module 622 readjusts execution of subsequent operations on the component 530. Similarly, in a further embodiment, the throttle module 622 may readjust execution of subsequent operations on the component 530 in response to the verification module 624 determining that the temperature fails to satisfy the thermal target.

The power management apparatus 122, in one embodiment, is arranged in a system of a plurality of power management apparatuses 122, 122a-c as described above with regard to FIG. 5. Depending on whether the system is arranged with a single system power management apparatus 122, with master/slave power management apparatuses 122, 122a-c, with peer power management apparatuses 122, 122a-c, or in another arrangement, such a system may include one or more audit modules 616, one or more throttle modules 622, and/or one or more verification module 624, which may function as described above with regard to FIG. 5.

For example, in one embodiment, each power management apparatus 122, 122*a-c* may include an audit module 616, a throttle module 622, and a verification module 624. In a further embodiment, just a master or system power management apparatus may include an audit module 616, a throttle module 622, and a verification module 624. In another embodiment, a master power management apparatus 122 may include an audit module 616, a throttle module 622, and a verification module 624, and one or more slave power management apparatuses 122*a-c* may include just a throttle module 622, or the like. In view of this disclosure, one of skill in the art will recognize other arrangements and combinations of audit modules 616, throttle modules 622, and verification modules 624 suitable for use in a system with a plurality of components 530*a-c* as described above with regard to FIG. 5.

Figure 6B:
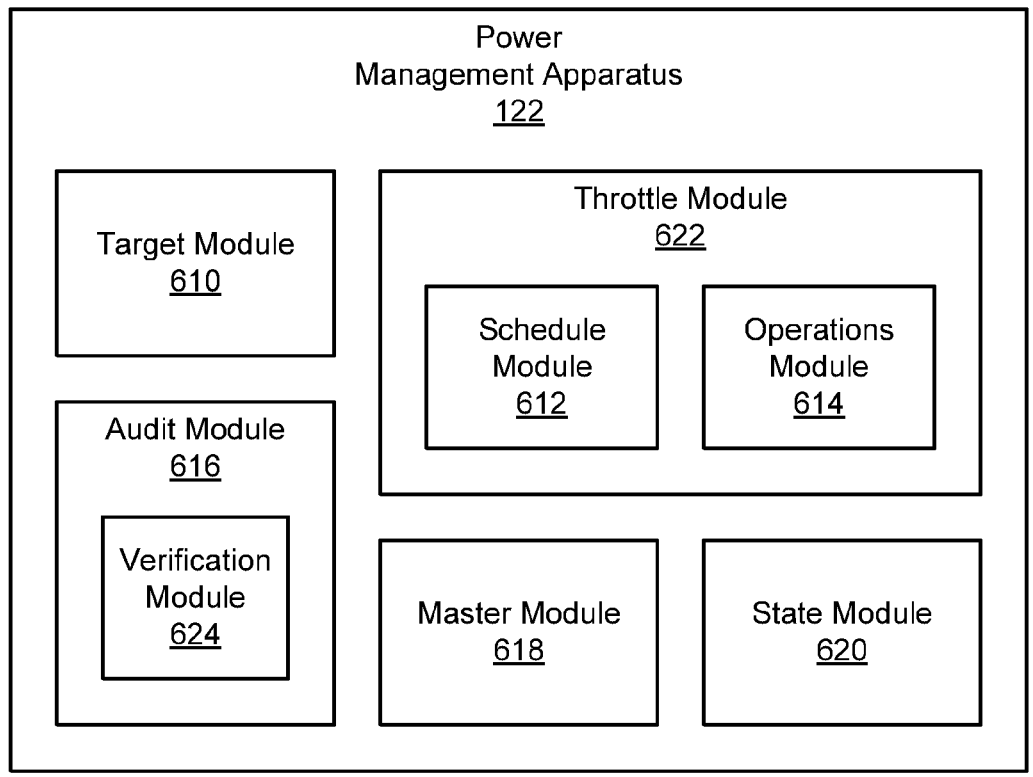
FIG. 6B is a schematic block diagram illustrating another embodiment of a power management apparatus.

FIG. 6B shows one embodiment of the power management apparatus 122. The power management apparatus 122 includes, in the depicted embodiment, a target module 610, the audit module 616, a master module 618, a state module 620, and the throttle module 622. The audit module 616, in the depicted embodiment, includes the verification module 624. The throttle module, in the depicted embodiment, includes a schedule module 612 and an operations module 614. In other embodiments, the power management apparatus may include a subset of the depicted modules, such as an audit module 616, a throttle module 622, and a verification module 624, or other combinations of the depicted modules.

In one embodiment, the target module 610 determines an appropriate power consumption target for the component 530 that the power management apparatus 122 is responsible for. As used herein, references to a component 530 include the storage device 102, which is a specific example of a component 530. The power consumption target sets the power limits for the component 530. In one embodiment, the power consumption target may be expressed in watts. The power consumption target may be a power consumption ceiling defining a maximum amount of power for the component 530, a power consumption threshold set below a power consumption ceiling, an average amount of power for the component 530 with allowances for deviation during burst operations, a range of allowable power consumptions levels for the component 530, or another manner of expressing the power limits for the component 530. Those of skill in the art will appreciate the other ways in which the power consumption target may be expressed, in view of this disclosure.

In another embodiment, the target module 610 determines an appropriate thermal target for the corresponding component 530. The target module 610, in one embodiment, may determine the thermal target in substantially the same manner as the power consumption target. The thermal target, in one embodiment, sets temperature limits for the component 530. The thermal target, in various embodiments, may be expressed as degrees Celsius, degrees Fahrenheit, Kelvin units, or the like. As described above with regard to the power consumption target, the thermal target, in various embodiments, may be a thermal ceiling defining a maximum allowable temperature or thermal rating for the component 530, a thermal threshold set below a thermal ceiling, an average temperature for the component 530 with allowances for deviation, a range of allowable temperatures for the component 530, or another manner of expressing temperature limits for the component 530.

In one embodiment, the thermal target includes a thermal ceiling and a thermal threshold below the thermal ceiling, to account for thermal inertia. In a further embodiment, if the temperature for the component 530 approaches the thermal ceiling by exceeding or passing the thermal threshold, the temperature fails to satisfy the thermal target, and the throttle module adjusts operations on the component 530. In one embodiment, setting a thermal threshold below a thermal ceiling provides the power management apparatus 122 time to account for thermal inertia so that a rate of change of the temperature slows and reverses before the temperature for the component 530 hits and/or exceeds the thermal ceiling.

For example, in one embodiment, a thermal rating for a consumer grade component 530 may be around about 85 degrees Celsius, or for an industrial grade component 530 around about 100 degrees Celsius. In one embodiment, the thermal ceiling for the component 530 is set at the thermal rating for the component 530. A thermal threshold, in various embodiments, may be set at a number of degrees below the thermal ceiling, such as about 1 to 15 degrees below the thermal ceiling. In one embodiment, a thermal threshold is set at about 7 degrees below the thermal ceiling, to account for thermal inertia. In the example embodiments, the thermal threshold for the consumer grade component 530 may be set at around 78 degrees Celsius and the thermal threshold for the industrial grade component 530 may be set at around 93 degrees Celsius, or the like.

In one embodiment, the power consumption target and/or the thermal target is communicated to a software driver by a user, another module, another power management apparatus 122, or the like, and the software driver sends the power consumption target and/or the thermal target to a physical card or device on which the component 530 is realized. The target module 610 may be part of the software driver, part of the physical card or device, or both. While the power consumption target is one parameter that the target module 610 may determine, the target module 610 may also determine other parameters; for example, the target module 610 may determine parameters specifying allowable burst limits and times, power ramping limits, the thermal target, and others.

In one embodiment, the target module 610 retrieves or otherwise determines the power consumption target and/or other parameters. These parameters may be stored in non-volatile storage within the power management apparatus 122, in RAM for a computing system 114, or on a persistent storage device such as a parameter file in a file system. For example, in certain embodiments, the power consumption target is coded into the power management apparatus 122 as a hardware defined value, software defined value, firmware defined value, and/or some combination thereof. The power consumption target and other parameters may be retrieved by the target module 610, or retrieved by the target module 610, during start up. In certain embodiments, updates may be made to the firmware or software on the power management apparatus 122 to change the power consumption target and other parameters directly. In such embodiments, the computing system 114 may not be aware, or have a need to be aware, of the power management activities on the components 530*a-c*.

In certain embodiments, the target module 610 may receive initial parameters from the BIOS of the computing system 114 when the computing system 114 is starting up. In one embodiment, the BIOS may provide a set of parameters that puts the component 530 into a mode that provides lower performance but is a "safe" setting, as that term is commonly used in the computing industry. The computing system 114 may update/revise the set of parameters at a later point in the initialization process.

In embodiments where the computing system 114 is aware of the power management apparatuses 122a-c on the components 530a-c, the computing system 114 may communicate with the power management apparatuses 122a-c. The target module 610 may receive the power consumption target and other parameters from the system itself, or it may receive the power consumption target and other parameters from other components 530a-c that are aware of the power management apparatus 122.

In certain embodiments, the power management apparatuses 122, 122a-c may share and communicate information with one another. The information may be shared in accordance with a protocol, as described below. The power management apparatus 122 may have a master module 618 described below to facilitate sharing this information. The power management apparatus 122 in the system may also be configured to act as a single logical power management apparatus 122. Such embodiments may allow certain components 530 to be given more power at a particular time by lowering the power allotment for other components 530 in the system. As noted above, this power allotment may be dynamic.

The power management apparatus 122 may respond to direction from a user indicating that the functions of one particular component 530 are more important than those of another. For example, a user may indicate that establishing a strong wireless connection is more important than storage performance at a particular time. Thus, a component 530 that is a wireless card may be allowed to operate at full power while the power allotted to the component 530 that is a storage device, such as the storage device 102, is decreased. In other embodiments, the dynamic reallocation of power may be initiated by other components 530 or processes transparently to the user. For example, a particular solid state storage device 102 may be falling behind in reclaiming storage space as part of garbage collection due to the restrictions on power. The power management apparatus 122 may allocate more power to that solid state storage device 102 for a period of time to allow it to catch up, while decreasing the power allocation to other components 530 during that period.

In one embodiment, the throttle module 622 uses the operations module 614 to adjust operations for the component 530. The operations module 614, in one embodiment, associates the power consumption target, and other parameters received by the target module 610, with performance limits on the component 530. Performance limits, in one embodiment, include the adjustments of operations described above with regard to the throttle module 622 of FIG. 6A. For example, a power consumption target of 25 watts may be associated with one set of performance limits (i.e. operation adjustments) on the component 530, while a power consumption target of 20 watts may be associated with another set of performance limits (i.e. operation adjustments) on the component 530.

The parameters may include any data that specifies limitations on or information on how the component 530 can use power. The operations module 614 selects performance limits for the component 530 that correspond to the power consumption target provided to the target module 610. Performance limits, as used herein, are values, operation modes, adjustments, and/or rules that manage, limit, control, or otherwise adjust the performance of the component 530 to a level that corresponds to the parameters received or otherwise determined by the target module 610. In certain embodiments, the operations module 614 uses tables, indexes, and other structures to determine the appropriate performance limits for the given parameter inputs to the target module 610. By determining appropriate performance limits for the given parameter inputs (such as the power consumption target, the thermal target, or the like), the operations module 614 identifies a level of performance for the component 530 that the operations module 614 determines will provide the desired power consumption and/or thermal state of the component 530.

In certain embodiments, the operations module 614 associates the power consumption target and/or the thermal target with timer values or counter values used in controlling the component 530, thus limiting the performance, power consumption, and temperature of the component 530. Timers, in certain embodiments, may be used to control when, after an operation is started on a storage device, the controller polls to determine if the prior operation completed and before sending a new operation. Timers, in other embodiments, may be used to control how frequently operations are submitted to a storage device for execution.

For example, a solid state storage device may use timers, such as the tPROG time discussed above, to control when the software polls the hardware of the solid state storage device (such as the banks discussed above) to verify that an operation has completed before initiating a new operation. In one embodiment, the operations module 614 provides an increased time between the polling such that the controller polls the hardware of the solid state storage device less frequently. This causes a reduction in the number of operations per unit time, and a corresponding decrease in power consumption per unit time. In one embodiment, reducing a frequency with which operations are executed introduces downtime on a communications bus of the component 530, reducing bandwidth, throughput, and/or other performance of the component 530 as a tradeoff for reducing power consumption and/or temperature. This is discussed in more detail in connection with FIG. 8.

The schedule module 612 executes operations on the component 530 according to the performance limits selected by the schedule module 612. As a result, the component 530 may not operate as effectively as it would if full power were available; for example, the component 530 may operate at a lower bandwidth. However, in one embodiment, the component 530 may also consume less power during operation than it would without the performance limits. In one embodiment, the performance limits are set such that the actual power consumed by the component 530 under the performance limits is within a tolerable range, either above or below, the power consumption target, satisfying the power consumption target.

Thus, if the power consumption target is 50 mW, the actual power consumed by the component 530 when operating under the performance limits associated with a power consumption target of 50 mW is within a tolerable range of 50 mW. For example, the timers controlling the polling of the banks may be slowed to a point where average power usage is approximately 50 mW. Those of skill in the art will appreciate how to specify a tolerable range; in one embodiment, the tolerable range allows for a difference of 4% (for example) above or below the power consumption target.

While this application discusses specific approaches to reducing bandwidth on a storage device 102, those of skill in the art, in view of this disclosure, will appreciate that there are other ways to reduce bandwidth of a storage device 102 in a predictable fashion such that the power consumption of the storage device 102 may be reduced. Slowing timers and clocks, scheduling operations, and other approaches discussed herein are examples of approaches to achieve power management.

In certain embodiments, the power management apparatus 122 may also include the audit module 616. The audit module 616, in one embodiment, measures and/or monitors the actual power consumed by the component 530 and compares the actual power with a projected or expected power consumption of the component 530 that is a predicted amount of power that the component 530 uses when executing operations in accordance with the performance limits or other adjustments. The projected power consumption may be the power consumption target. In other embodiments, the projected power consumption is based on the power consumption target and the other parameters or adjustments governing the component 530. For example, the operations module 614 may determine that a first set of performance limits are appropriate for the parameters provided to the target module 610, and that the component 530 operating under the first set of performance limits will have a projected power consumption of 50 mW.

In one embodiment, the audit module 616 measures the actual power and compares it with the projected power consumption to determine whether the actual power consumption of the component 530 is within an allowable tolerance of the projected power consumption of the component 530 as specified by the power management apparatus 122, i.e. whether the actual power consumption satisfies the power consumption target. The actual power may be a measured power value; in other embodiments the actual power is an approximation based on at least one measurement. For example, assuming that voltage provided to the component 530 is constant, current measurements alone may be sufficient to determine an actual power value.

In one embodiment, the audit module 616 communicates with the throttle module 622 and makes appropriate adjustments and optimizations to bring the actual power usage of the component 530 closer to the projected power usage of the component 530 and/or closer to satisfying the power consumption target. For example, if the audit module 616 determines that the component 530 is consistently using more power than the power allocated to it, the audit module 616 may provide this information to the throttle module 622. The throttle module 622 may then adjust the performance limits and/or the operations of the component 530 to account for the discrepancy between the actual power and the projected power. For example, the throttle module 622 may use the operations module 614 to decrease the frequency of polling to reduce the actual power consumed by the device. The throttle module 622, in one embodiment, may store the adjustments such that, in the future, the performance limits selected for the particular set of parameters are the adjusted performance limits.

Thus, the audit module 616 may be used to ensure that the actual power usage of the component 530 is sufficiently close to the power usage that the power management apparatus 122 estimates to match the selected performance limits. The audit module 616 may also be used to allow the performance limits and/or operations of the component 530 to be adjusted and/or corrected during the life of the component 530, as the power consumption characteristics of components 530 often change over the life of the component 530. In the depicted embodiment, the audit module 616 includes the verification module 624. As described above with regard to FIG. 6B, in certain embodiments, the verification module 624 works with the audit module 616 to verify that specific adjustments to operations of the component 530 bring the power consumption rate within the power consumption target and/or bring the temperature of the component 530 away from the thermal ceiling.

In one embodiment, the power management apparatus 122 may also include a master module 618. The master module 618 allows the power management apparatus 122 to share and receive information from other power management apparatuses 122, 122a-c in the system. In certain embodiments, the master module 618 may assign operations to other power management apparatuses 122, 122a-c, and receive operations for execution from other power management apparatuses 122, 122a-c in the system. The master module 618 may also receive operations for execution from the computing system 114. The master module 618 may also manage priorities for operations in the system and dynamically reconfigure priorities. The master module 618 may dynamically adjust the power consumption target for the component 530 if there are changes in the power consumption or the power consumption needs of other components 530 in the system.

The master module 618 may also maintain a global or system power consumption target for the set of components 530a-c, not just the component 530a on which the master module 618 is operating. The master module 618 may apportion the global or system power consumption target among the components 530a-c, and change the local power consumption targets dynamically while ensuring that the components 530a-c do not cumulatively exceed the global power consumption target. As described herein, in certain embodiments, the components 530a-c may include the storage device 102 and/or each component 530a-c may comprise a storage device 102.

In certain embodiments, there is only one master module 618 that manages all of the power management apparatus 122 in the system. In other embodiments, the master module 618 is distributed across the power management apparatuses 122a-c, which master modules 618 share information. In certain embodiments, the power management apparatuses 122a-c use a default set of settings if the master module 618 goes offline or is otherwise unavailable for cooperative power management.

The master module 618 may also be used to coordinate power allocation within a single component 530. For example, as noted above, a solid state storage device may include multiple DIMMs, and the master module 618 may coordinate power allocation between the multiple DIMMs. The master module 618 may dynamically reallocate the power made available to each DIMM while ensuring that the component 530 itself does not exceed the power consumption target.

In one embodiment, the power management apparatus 122 includes a state module 620 that specifies various possible modes of operation for the component 530 for which the power management apparatus 122 is responsible. For example, one state may be a power disruption state, which causes the power management apparatus 122 to manage operations on the component 530 to manage the power disruption. Another state may be a power reduction state in which the power management apparatus 122 throttles performance to achieve power savings (i.e., when a computing system hosting the power management apparatus 122 moves to operate on battery power or other secondary power sources). Another state may be a thermal reduction state in which the power management apparatus 122 throttles performance to reduce the temperature of the component 530, the temperature output of the component 530, or the temperature of the enclosure housing the component 530.

While the above discussion has been directed primarily to power, given the relationship between power and thermal energy, the modules discussed above may be tailored to allow for thermal monitoring and to allow performance throttling as a thermal management tool for managing thermal temperature levels affected by the component 530. For example, the audit module 616 may also include the necessary hardware (i.e. sensors, temperature sub-systems, and the like) to monitor temperature on the component 530, as described above. In other embodiments, the audit module 616 monitors the temperature of an enclosure that contains the components 530a-c. The audit module 616, in certain embodiments, may use thermistors or other known hardware to monitor the temperature.

If temperature detected by the audit module 616 is greater than a temperature threshold value or otherwise does not satisfy the thermal target, the state module 620 may put the component 530 in a temperature reduction state. In certain embodiments, the throttle module 622 may also store data that describes the thermal characteristics of operations; for example, the operations module 614 may define the average amount of heat given off during an erase operation, a read operation, or a program operation. The throttle module 622 may use the thermal characteristics to adjust or schedule execution of the operations on the component 530, as described above.

Those of skill in the art will appreciate that, given the close relationship between power consumption and heat, the techniques described in this application in connection to power management based on reducing power consumption may be effectively applied to reduce the thermal energy radiated by the component 530. In some cases, the application of these techniques may require an inverse adjustment such as activating a cooling system instead of, or in addition to, terminating certain operations, and/or adjusting the operating speed in completing queued operations. Similarly, the audit module 616 may monitor the actual temperature and adjust the thermal characteristics as necessary to ensure the component 530 is providing the expected level of thermal energy for the given thermal characteristics.

Figure 7A:
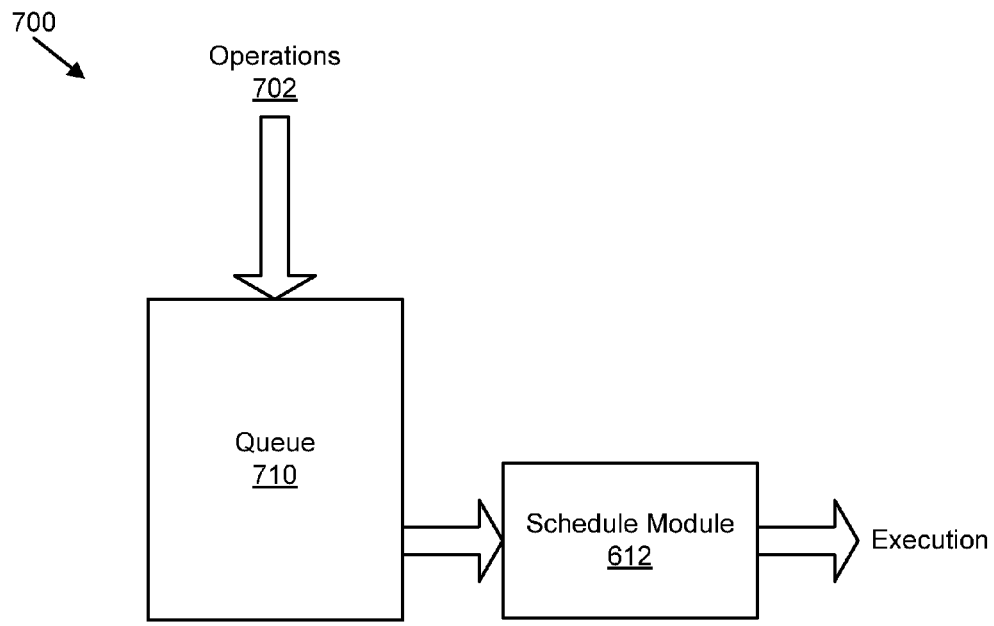
FIG. 7A is a schematic block diagram illustrating one approach to scheduling operations for improved power management.
Figure 7B:
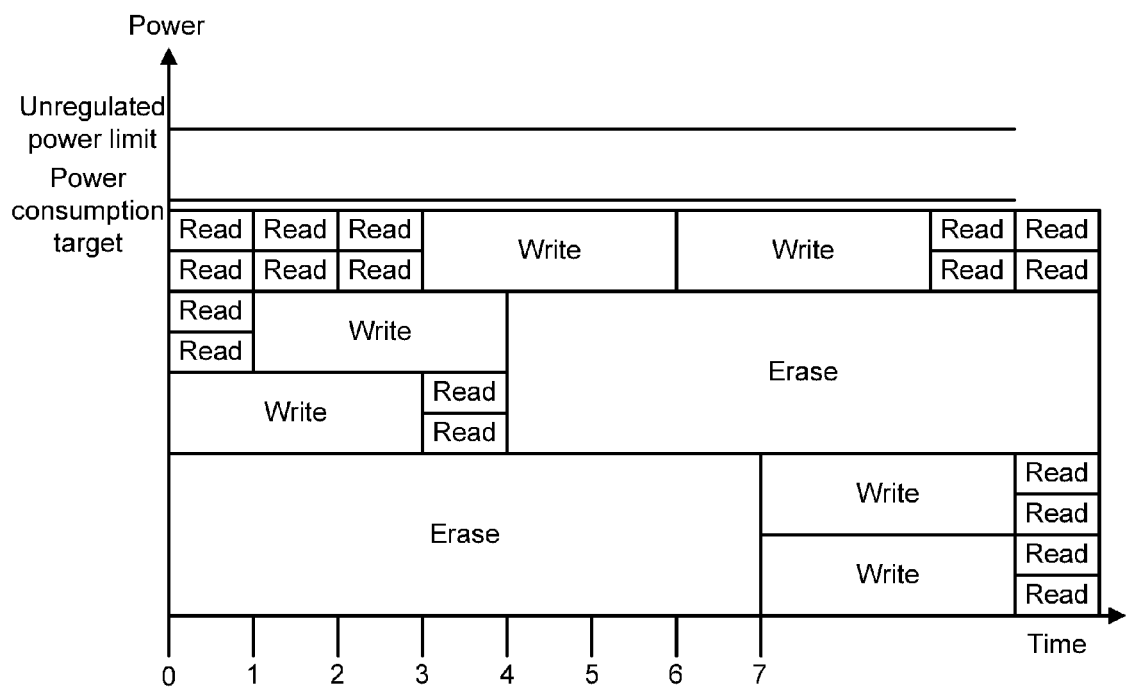
FIG. 7B is a schematic block diagram illustrating one approach to scheduling operations for improved power management.

FIGS. 7A and 7B show one embodiment 700 of a power management apparatus 122 managing the power consumption by a component 530. In the depicted embodiment, the component 530 is a solid state storage device. As shown in FIG. 7A, operations 702 for the particular component 530 may be placed in a queue 710 for execution. Other data structures than a queue 710 may also be used. The operations 702 may be, for example, write operations, read operations, erase operations, and others. In certain embodiments, the power management apparatus 122 only concerns itself with the operations that account for a bulk of the power usage in the component 530. For example, in one embodiment, while many varied types of operations may occur in a solid state storage device, the power management apparatus 122 only concerns itself with erase, write, and read operations, with just erase operations, with just write operations, or the like. The power management apparatus 122 may assume that other operations provide a relatively constant power draw that remains relatively stable regardless of device usage, and account for this constant power draw appropriately.

The schedule module 612 of the throttle module 622 may manage the queue 710 and select operations 702 from the queue 710 for execution. The schedule module 612 may use the information about the energy and time requirements for particular operations 702, which information may be provided by the operations module 614, in selecting and scheduling operations 702 for execution. In typical embodiments, the schedule module 612 selects operations 702 such that the power consumed by the component 530 in performing the operations 702 is at or below the power consumption target, or otherwise satisfies the power consumption target.

In certain embodiments, the schedule module 612 uses a credit or token system to manage the queue 710. In one embodiment, the schedule module 612 may receive a credit when an operation 702 is placed in the queue 710, and delete a credit when an operation 702 is removed from the queue 710 for execution, or the like. The schedule module 612 may stop accepting operations 702 when the number of credits reaches or exceeds a predetermined amount. Other approaches to managing the size of the queue 710 may be used. Other approaches to queue management may also be used. The credit approach may be used for scheduling the start of operations.

In certain embodiments, the schedule module 612 may communicate the credit status of the queue 710 with the computing system 114 or with other components 530. In such embodiments, the entity receiving the credit status (for example, the number of credits held by the schedule module 612, the number of credits in a pool, or the like) may dynamically assign operations 702 based on the credit status. Such an embodiment may be particular useful where more than one component 530 can execute the particular operation 702. In certain embodiments, each component 530 has its own queue 710. In other embodiments, where the power management apparatus 122a-c may communicate with one another, the queue 710 may be shared across components 530a-c.

For example, there may be multiple components 530a-b that are storage devices configured as a RAID mirror. In such an embodiment, a read request can be handled by either storage device. The power management apparatus 122 operating on the storage device components 530 may communicate their credit status. The credit status may be the number of credits held by the respective schedule modules 612, a message stating whether the queues 710 are full or not full, or other approach to indicating the status of the queue 710. The computing system 114 may use this information to balance the workload and send requests to the component 530 with the most available processing capability. Balancing may occur across multiple dual in-line memory modules ("DIMMs"), multiple components 530, or, in certain embodiments, across multiple systems. In other embodiments, the workload balancing is managed by a master module 618 described below.

In a further embodiment, the schedule module 612 may provide a provide a pool of a predetermined number of credits or tokens to one or more queues 710 or other sources of operations 702 (such as bank controllers 418, bank read queues 410, bank write queues 412, bank erase queues 414, bank management queues 416, control queues 342, or the like). Each queue 710 or other source of operations 702, in one embodiment, may access a shared pool of credits or tokens. In a further embodiment, the schedule module 612 grants each queue 710 or other source of operations 702 credits or tokens individually. Credits or tokens, in one embodiment, are a logical construct that the schedule module 612 uses to track, schedule, and/or monitor concurrently executing operations on the component 530.

The schedule module 612, in one embodiment, receives a token for each concurrently executing operation 702, and prevents other pending operations 702 from executing once the predetermined number of credits or tokens have been used. In one embodiment, a credit or token has an associated duration, after which the schedule module 612 returns the credit or token to the pool. In one embodiment, the associated duration is about equal to an amount of time that it takes for an operation of a predefined type to execute. In a further embodiment, the associated duration is shorter than an amount of time that it takes for an operation of the predefined type to execute, such that execution of sets of operations of the predefined type overlap, or are staggered. Certain types of operations, such as the erase operation described below with regard to FIG. 10, may require a greater amount of power toward a beginning of an operation than toward an end of the operation, or may otherwise have nonlinear power consumption over time during execution. Staggering and/or overlapping such operations may decrease or prevent a spike in power consumption that would otherwise occur if all of the operations were started concurrently.

In a further embodiment, the schedule module 612 does not receive or distribute credits or tokens, but uses a counter, or the like, to schedule operations 702 in a similar manner. For example, in one embodiment, the schedule module 612 receives a set of concurrent operations for execution on a component 530, such as the storage device 102. The schedule module 612, in various embodiments, may receive the set of concurrent operations from the depicted queue 710 and/or from one or more other sources of operations 702, such as the bank controllers 418, the bank read queues 410, the bank write queues 412, the bank erase queues 414, the bank management queues 416, the control queues 342, or the like.

Each operation in the set, in one embodiment, has an associated operation type, such as erase, write/program, read, or the like. The operations, in one embodiment, have a plurality of different operation types. In another embodiment, the operations have a single operation type. For example, in one embodiment, the set of concurrent operations come from a queue of a single type of operations, such as erase operations, or the like.

The schedule module 612, in one embodiment, determines a type for at least two operations in the set of concurrent operations. The schedule module 612, in a further embodiment, schedules two or more concurrent operations from the set of concurrent operations for execution based on the type of the operations, so that the power consumption rate of the component 530 does not exceed a power consumption ceiling while the component 530 is executing the concurrent operations.

The schedule module 612, in one embodiment, maintains a count of what types of operations are currently executing on a component 530. The schedule module 612, in a further embodiment, may access stored definitions of allowable sets of concurrently executable combinations of operation types to determine which operations from the set of concurrent operations to schedule for execution. As depicted in FIG. 7B, and described below, different types of operations may use different amounts of power or energy during execution, and may have different durations. The schedule module 612, in one embodiment, dynamically schedules concurrently executing operations to satisfy the power consumption target.

In a further embodiment, the schedule module 612 schedules certain types of operations separately or independently, or may ignore certain types of operations. In one embodiment, the schedule module schedules no more than a predefined number of erase operations to start concurrent execution on a component 530. Once the predefined number of erase operations have started, in one embodiment, the schedule module 612 delays execution of other erase operations for at least a predefined duration before allowing the other erase operations to execute. As described above with regard to the tokens or credits, the predefined duration, in one embodiment, is less than an execution time for the operation, causing sequential sets of concurrently started operations to stagger or overlap. For an erase operation, in certain embodiments, the predefined duration is sized such that execution of an erase operation consumes more power during the predefined duration than after the predefined duration. Such sizing of the predefined duration, in certain embodiments, prevents the power consumption rate from spiking above the power consumption target while still allowing for concurrently executing operations.

In one embodiment, the schedule module 612 may include or be in communication with a bus arbiter, such as the bus arbiter 420, and may schedule operations for execution on the component 530 by allowing the operations to be performed on a bus, as described above with regard to FIG. 4. The bus and/or the bus arbiter may control access to two or more banks or other components of a storage device 102. For example, in one embodiment, the bus may be a storage control bus and individual storage components, such as banks, dies, or other storage elements, may receive commands for operations over the storage control bus. One example of a storage control bus is the storage control bus 212 of FIGS. 2, 3, and 4. In other embodiments, the schedule module 612 may schedule operations for execution by placing them in a queue or buffer, sending them to the component 530, or the like.

FIG. 7B shows one graphical embodiment of how the schedule module 612 may schedule operations 702 such that power consumption is kept below a power consumption target. The relevant operations on the component 530 may be expressed in terms of time and power that specify the amount of time required to execute the operation, and the amount of power to complete the operation. FIG. 7B, for example, shows read operations, write operations, and erase operations. While not to scale, FIG. 7B shows that, typically, erase operations require a considerable amount of power for a significant period of time compared to other operations, that write operations require less power and time, and that read operations typically require the least amount of power and time during execution. Based on the type of component 530, the schedule module 612 may schedule different types of operations other than read, write, and erase operations, and operations may have different relative power and time consumptions.

As noted above, the operations module 614 may store information concerning the time and power necessary for particular operations 702 for the component 530. The power and time characteristics of the particular operations 702 may be part of the performance limits or other adjustments by the throttle module 622. The schedule module 612 may use this information in controlling the flow of operations 702 on the component 530.

As shown in FIG. 7B, the schedule module 612 may schedule an erase operation at time unit 0, along with a write operation, and four read operations. Even if the component 530 has the ability to perform more read, write, or erase operations, the operations cannot be performed without exceeding the power consumption target. As a result, the component 530 may use less than the unregulated power limit for the component 530, and experience a corresponding decrease in performance.

FIG. 7B further shows that two erase operations and a write may occur simultaneously, but that further activity may not be allowed in order to ensure that the power consumption target is not exceeded. Thus, regardless of the physical ability to perform more operations than those shown for any particular time unit, the schedule module 612 may ensure that the power consumption target is not exceeded.

In certain embodiments, the schedule module 612 does not verify that the operations 702 have completed before removing additional operations from the queue 710. The schedule module 612 may assume that the operations 702 will complete in the time specified by the operations module 614. As noted above, the audit module 616 may conduct audits to verify the accuracy of the timing operations and the energy consumption of particular operations, or may monitor the power consumption rate of the component 530. In addition, the operations module 614 may adjust the energy and timing characteristics of operations 702 as the component 530 ages based on information about how the age of the component 530 affects its performance.

As a result, the schedule module 612 may ensure that the component 530 does not exceed the power consumption target based on the information provided by the operations module 614. In addition, the schedule module 612 may select operations 702 from the queue 710 according to priorities. For example, in certain embodiments, read operations may be given the highest priority, followed by writes, and finally by erase operations. The schedule module 612 may maintain these priority values.

In addition, priorities may change dynamically based on the nature of the queue 710. For example, the schedule module 612 may give write operations the highest priority if the component 530 is running out of volatile storage capacity to hold the data before it is written; the schedule module 612 may determine that executing the write operations will free up necessary volatile storage. The schedule module 612 may also determine that the component 530 is approaching a situation where a secondary power supply for the component 530 will have insufficient energy to move the data into solid-state storage media 110 in the event of a power failure.

The schedule module 612 may increase the priority of write operations and keep the priority at the higher level until the amount of data is reduced to an acceptable level that does not put data at risk. If the component 530 is running low on available space in the solid-state storage media 110, the schedule module 612 may increase the priority of erase operations that allow the component 530 to recover storage. Those of skill in the art will appreciate other situations in which it may be advantageous to dynamically alter a priority scheme for operations 702 on a component 530 in response to conditions on the component 530.

In certain embodiments, when certain operations 702 are continuously delayed or aborted due to lack of priority, the schedule module 612 may report to a user, or to another module such as a master module 618, that additional resources are required if the continuously delayed operations 702 are to execute. This may be used to prevent what is commonly referred to as starvation. For example, a groomer on a storage device may not be able to recover storage area in the storage device because erase operations are continuously being delayed or aborted. The schedule module 612 may alert the user, the master module 618, the computing system 114, or all of them, of the consequences if additional resources are not allocated to the storage device.

In certain embodiments, the schedule module 612 may establish priorities for operations 702 based on parameters provided to the target module 610. For example, the schedule module 612 may establish different priorities for operations 702 based on the computing system 114 originating the operation 702. The schedule module 612 may establish priorities based on the traffic type of the operation 702; for example, different priorities may apply to system read and write operations in comparison to application read and write operations. Priority may also be based on the nature of the storage (such as partition or volume), and/or function; for example, areas acting as a cache may have a different priority scheme than those acting as static storage. In addition, different priorities may be established for background processes such as data grooming, deduplication, progressive RAIDing, or others. Those of skill in the art will recognize other advantageous basis for establishing priorities for operations 702.

In other embodiments, the schedule module 612 may provide information concerning the queue 710 to the relevant computing system 114 or to other components 530. As noted above, multiple power management apparatus 122 operating on multiple components 530 may act as a logical power management apparatus 122 and communicate information and dynamically adjust loads on components 530. One or more of the power management apparatus 122 may include a master module 618 that can receive information from the other power management apparatus 122 in the computing system 114. The master module 618 may adjust the power consumption targets of the various components 530 based on the information provided by the schedule modules 612.

For example, the schedule module 612 may determine that the queue 710 is filling rapidly and request a higher allocation of power. The master module 618 may increase the power consumption target for one component 530 and reduce the power consumption target for another. If the queue 710 is far below an acceptable level, the schedule module 612 may inform the master module 618. The master module 618 may determine that the associated component 530 does not need the entire power consumption target allocated and reduce it in response to a request from another component 530 requesting a larger power allotment.

The schedule module 612 may provide other information to the master module 618; for example, the schedule module 612 may inform the master module 618 that the component 530 is running out of storage because erase operations cannot be executed. The schedule module 612 may inform the master module 618 that write operations cannot be executed quickly enough and that the queue 710 is filling and approaching overflow. The schedule module 612 may inform the master module 618 that it is approaching a point where there is more data in the volatile memory 114 on the component 530 than a secondary power supply can move to solid-state storage media 110 in the event of a power failure. The master module 618 may dynamically adjust power allocations among the components 530 in the system based on the information.

In certain embodiments, the schedule module 612 can interrupt operations 702 that are executing to allow higher priority operations 702 to execute. The schedule module 612 may interrupt operations 702 by canceling them and then moving them back into the queue 710 or pausing them and resuming them once the higher priority operation 702 is complete. For example, at time unit 5 in FIG. 7B, the component 530 may receive an operation 702 (such as a critical write) with a priority level that requires immediate execution. The schedule module 612 may choose to cancel one of the two erase operations, or both erase operations, to create availability for the critical write operation.

In one embodiment, when the schedule module 612 must interrupt an existing operation 702, the schedule module 612 chooses the currently executing operation 702 with the lowest priority. In the event that two currently executing operations 702 have the same priority, the schedule module 612 may choose the operation 702 that is farthest from completion to cancel.

Figure 8:
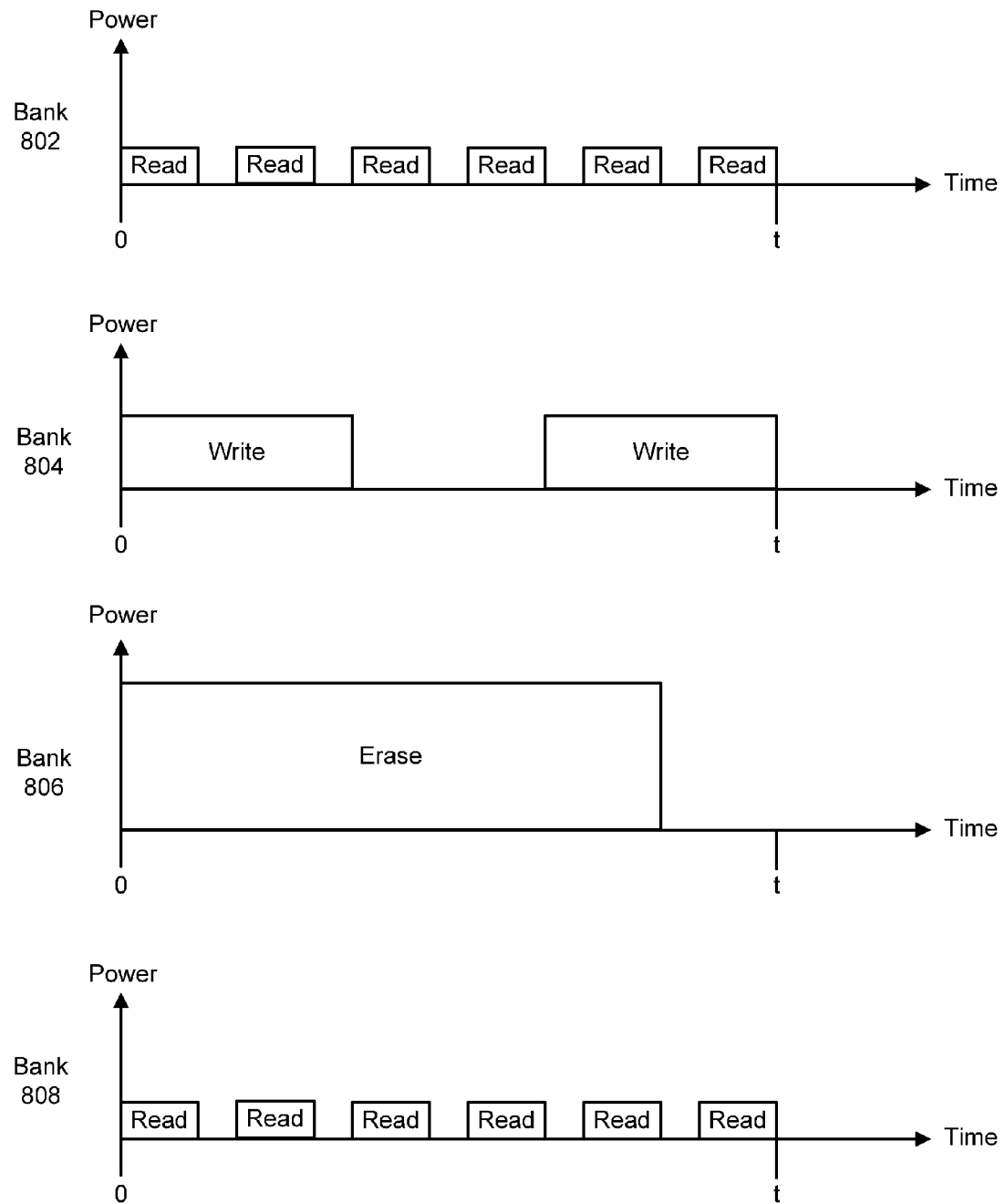
FIG. 8 is another diagram illustrating an approach to scheduling operations for improved power management.

FIG. 7B shows one approach to scheduling operations 702 to ensure that the component 530 does not exceed the power consumption target for the component 530. In certain embodiments, the schedule module 612 may also manage the sequential timing of the operations 702 on the component 530. FIG. 8 shows one example of sequential management of operations 702. The component 530 may be a storage device capable of executing N number of operations 702 in a given time period t. For example, the bank 804 shows two write operations occurring during the time period t; however, three may be possible. Similarly, bank 802 may be capable of performing eight read operations during an interval t, but only performs six.

In such embodiments, the schedule module 612 may stagger the execution of the operations 702 during the time period t such that less than the maximum amount of operations occur, but such that the component 530 does not exceed the power consumption target t for that time period. This approach may also be used in conjunction with the scheduling of operations 702 in parallel as shown in FIG. 7B, which combination of scheduling operations is shown in FIG. 9.

The staggered execution may be implemented by increasing the period of time that the controller waits before verifying that a bank (such as bank 802) has completed an operation. For example, at full speed, a bank 802 may be given a read operation, and after a wait period of 3 microseconds, poll to ensure that the read operation completed, and send another read operation. In one embodiment, the schedule module 612 increases the wait period from 3 microseconds to 4 microseconds. As a result, fewer reads occur, and less power is used. Similar delays may be introduced to erase and write operations to obtain similar power savings. As described above, one embodiment of a wait period for write/program operations is the tPROG value.

In certain embodiments, and as shown in FIG. 8, the component 530 may be a solid state storage device with banks 802, 804, 806, and 808. In a storage device with interleaved controllers for the banks 802, 804, 806 and 808, as described in the Bank Interleave Application referenced above, the storage device can process multiple read, write, and erase operations simultaneously as the banks can act in parallel. In one embodiment, the banks 802 and 808 perform read operations while the bank 804 performs write operations, and the bank 806 performs an erase operation. In the depicted embodiment, the banks 802, 804, 806 and 808 may perform less than the maximum number of operations possible during the time period t if there were no constraint on power usage for the storage device. For example, bank 804 may perform only two writes, as shown, instead of the three possible writes, during the time period t.

In certain embodiments, the schedule module 612 coordinates the execution of operations 702 on the banks 802, 804, 806 and 808. For example, the schedule module 612 may assign the bank 806 to perform one or more erase operations in the queue 710 and have bank 802 clear out as many read operations as possible while awaiting the bank 806 to complete the erase operation. The schedule module 612 may coordinate the activities of the banks 802, 804, 806 and 808 to ensure that the total operations for the component 530 do not exceed the power consumption target.

The performance of the component 530 may also vary depending on the operations of the schedule module 612 and the nature of the workload. For example, if the schedule module 612 is managing only read operations from the queue 710 in a component 530 that is a solid state storage device, the component 530 may be able to operate at full bandwidth; that is, the component 530 may be able to perform reads as quickly as possible because read operations require less energy. The same component 530 may operate at less than full bandwidth when performing write operations, and may operate at even less than full bandwidth if the component 530 has numerous erase operations, to the extent that write and erase operations need to be scheduled as described above in order to ensure that the component 530 does not exceed the power consumption target.

In a further embodiment, operations associated with certain types of workloads may be given priority, such as reading or writing a video file, or other real-time workloads of the component 530. To satisfy the power consumption target, in one embodiment, operations not associated with a priority workload may be adjusted or throttled to provide power to process the operations associated with the priority workload at full speed, or the like.

In certain embodiments, the operations 702 executing on one bank are relevant to what operations 702 may execute on another bank in the component 530. The schedule module 612 may schedule operations 702 using an algorithm based on allowable combinations of operations 702 for a particular power consumption target. For example, all banks 802, 804, 806 and 808 may be able to execute read operations simultaneously. As noted above, this situation may not require any limiting on the number of read operations if the component 530 can execute read operations without exceeding the power consumption target. In one embodiment, the banks 802, 804, and 806 may all be able to execute write operations while the bank 808 performs read operations. Two banks, such as 802 and 804, may be able to read while two banks 806 and 808 erase. Those of skill in the art, in view of this disclosure, will appreciate how operations can be organized on a per bank basis to keep the component 530 below a power consumption target.

FIG. 9 shows a representation of operations on various banks of a solid state storage device, how those operations affect power, and how the operations may be scheduled to ensure that the storage device complies with a power consumption target. In FIG. 9, the bar graph represents the operations on the storage device, the time and energy consumed by the operations, and the bank associated with the particular operation. The legend below identifies the operations for each bank 902, 904, 906, and 908, during the time period shown in the bar graph, and also indicates the operations executed on the particular banks.

In FIG. 9, the power consumption target may be set to the value 10. At time 0, the bank 902 begins an erase operation, bank 904 begins a program, and banks 906 and 908 begin read operations. In one time unit, the read operations on banks 906 and 908 complete. In certain embodiments, as discussed above, the timers are configured such that the banks 906 are not polled to determine whether or not the read operations completed until time 2. As a result, the banks 906 and 908 may not begin new read operations until time 2. Similarly, at time 3 the completion of the program operation on bank 904 and the read operations on banks 906 and 908 are detected. Bank 904 may initiate a new program operation, bank 906 a new read operation, and bank 908 a new program operation.

During the time period from 4 to 5, and from 6 to 7, the cumulative power used by the storage device is more than the power consumption target of 10. However, in certain embodiments, the solid state storage device is allowed to operate above the power consumption target for brief bursts so long as the total power used by the storage device over a set amount of time is kept below the power consumption target on average. Thus, for example, the power consumption target is exceeded during the time periods from 4 to 5, 6 to 7, and 14 to 21. However, the total area of the power used by the solid state storage device during time 0 to 22 is still less than the area below the power consumption target line; thus, the momentary bursts above the power consumption target, in certain embodiments, are permissible since, on average, the storage device is using less than the power consumption target. In a further embodiment, the audit module 616 determines that the power consumption between time 4 and time 7 exceeds the power consumption target, and the throttle module 622 adjusts execution of operations as described above.

In certain embodiments, one or more banks sit idle in order to ensure that the power consumption target is not exceeded; for example, at time 14, banks 904 and 908 begin erase operations. Due to the large power requirements of the erase operations, the banks 902 and 906 are kept idle until the erase operations on the other banks complete, so that the power consumption target is not exceeded.

While FIG. 9 shows a period of inactivity after each operation by a bank, in certain embodiments, there is no period of inactivity. In certain embodiments, the schedule module 612 may actively manage the sequential execution of the operations as well (as contrasted with systems that use a parallel or simultaneous execution of operations) and provide pauses when necessary. For example, the schedule module 612 may arrange the operations such that there are only sufficient pauses in sequential execution to ensure that the area of the operations in FIG. 9 is equal to the area under the power consumption target. Thus, fewer pauses may be introduced, and the schedule module 612 may dynamically manage when pauses are introduced and for what period of time.

FIG. 9 thus illustrates how operations scheduling may be combined with purposeful, adjustable delay to manage the power consumption of a component 530 such as a storage device. As discussed above, either scheduling or delay may be used alone or in combination to ensure that a particular device operates at a desired power level. While this application has discussed lowering power consumption of a device by lowering device performance, those of skill in the art will appreciate that these techniques may be used to increase device performance by increasing the power allotment to components 530. For example, additional power may be available if only one component 530 is used in a multi-slot bus.

FIG. 10 shows one example of a scheme to characterize operations of a component 530 in terms of power. FIG. 10 shows a read operation 1012 and an erase operation 1010. The read operation 1012 and the erase operation 1010, in the depicted embodiment, are characterized in terms of quanta or other units. Although other operations 702 (such as a write operation) are not shown, the scheme shown in FIG. 10 may be equally applicable to other operations 702.

Each quantum shown in FIG. 10 represents a given amount of power used over an increment of time in connection with operations 702 on the component 530. In one embodiment, the quantum is a lowest common denominator in terms of energy for all of the operations 702 that are represented in terms of quanta. The quantum may also be a lowest common denominator in terms of time for all operations 702. The operations 702 may be divided into time periods, and each time period may be assigned one or more quanta to represent the amount of power required by the operation 702 during that particular time period.

For example, a read operation 1012 may use the least amount of energy of all operations 702 and may be the fastest operation. One half of a read operation 1012 may be the lowest common denominator in terms of power for the operations 702. The read operation 1012 may take the least amount of time and the period of time for the read operation 1012 may represent the least common denominator for the operations 702 in terms of time. Thus, the read operation 1012 may be represented as two quanta during a time period 1, as shown in FIG. 10.

In contrast, more complicated operations 702 may be expressed using different number of quanta over a number of time periods. Thus, the erase operation 1010 shown in FIG. 10 may last a total of 8 time periods. It should be noted that the number of quanta illustrated and the number of quanta per time period are used only for illustration. Certain embodiments of the invention may require a different number of quanta for each operation and the number of quanta for each unit of time may vary depending on a number of factors not included in this example for the sake of clarity. During the time period 1, the erase operation 1010 may use 12 quanta of energy. During the second and third time period of the example erase operation shown, the erase operation 1010 requires 9 quanta. Five quanta are required for each of the fourth and fifth time units, 2 quanta for the sixth and seventh, and 9 for the eighth time unit.

Such an approach may allow for a more granular analysis and treatment of various operations 702 on the component 530 than is obtained by treating each operation 702 as a single unit as shown in connection with FIG. 8. As a result, the schedule module 612 may adjust the performance of the component 530 more effectively using the more detailed breakdown of the energy requirements of particular operations and how they change over time. One of skill in the art will appreciate how FIG. 10, for example, could be modified to show the more granular picture of power usage and how this might affect operations scheduling and the sharing/distribution of power among multiple components 530.

The quanta characteristics of operations 702 may be hard coded into the component 530, or stored in software, or firmware. In certain embodiments, the quanta characteristics (such as the power requirements, the time periods, and the make up of operations in terms of quanta) may be changed over time. For example, the quanta characteristics may be updateable through firmware updates, downloads, or other techniques. In certain embodiments, the audit module 616 may adjust the quanta values (such as the time and energy values of the quanta) and the quanta characteristics of operations 702 (such as the number of quanta per time period, number of time periods per operation) based on the results of audits.

In certain embodiments, the operations 702 may be managed through use of a credit or token system, as described above with regard to FIGS. 7A and 7B. Banks (such as banks 802-808) in a storage device may be allocated a certain amount of credits for use during a predetermined period of time. Operations 702 may require a certain number of credits to execute; for example, each quantum in an operation, as illustrated in FIG. 10, may be one credit. Once a bank has used the credit allocated for the time period, the bank waits for a new time period to begin with a corresponding new allocation of credits. In such an embodiment, the total power consumption of the banks may periodically exceed the power consumption target, but the average power consumption for the banks during the time period will be equal to or less than the power consumption target.

A credit system may be used to effectively reduce or stop power consumption by removing or reallocating credits to another component 530. For example, certain banks may be given more credits than others, and certain components 530 may be given more credits than others. In one embodiment, the power disruption procedure discussed above is initiated by removing all credits for a particular component 530. In certain embodiments, the allocation of credits is tracked to help prevent starvation.

The power management apparatus 122 may communicate with its peers, with the computing system 114, and with others using a power protocol that enables communications between relevant components that need to send and receive information concerning power with participants in the power management system. The power protocol may specify the rules by which information is communicated between participants in the system. For example, the computing system 114 may pack the power consumption target and other parameters according to the power protocol and send the package to the target module 610. The target module 610 may receive the packet and unpack the power consumption target and other parameters.

In certain embodiments, the power protocol provides a discovery routine which allows the power management apparatus 122 to discover its peers, and to enable the computing system 114 to communicate with the power management apparatus 122. In other embodiments, this information is provided by a user. Various approaches may be taken to establish communications between the components of the power management system.

The power protocol may provide an Application Programming Interface ("API") that dictates the manner in which information is exchanged. The API may provide method and routines which may be invoked to facilitate power management. The power protocol may allow components to read base requirements and understand configuration options, allow adjustments to be made to parameters and operational information (such as, for example, the energy and time requirements of particular operations), allow components to read and report status, and to provide status to interested parties such as a user.

Figure 11:
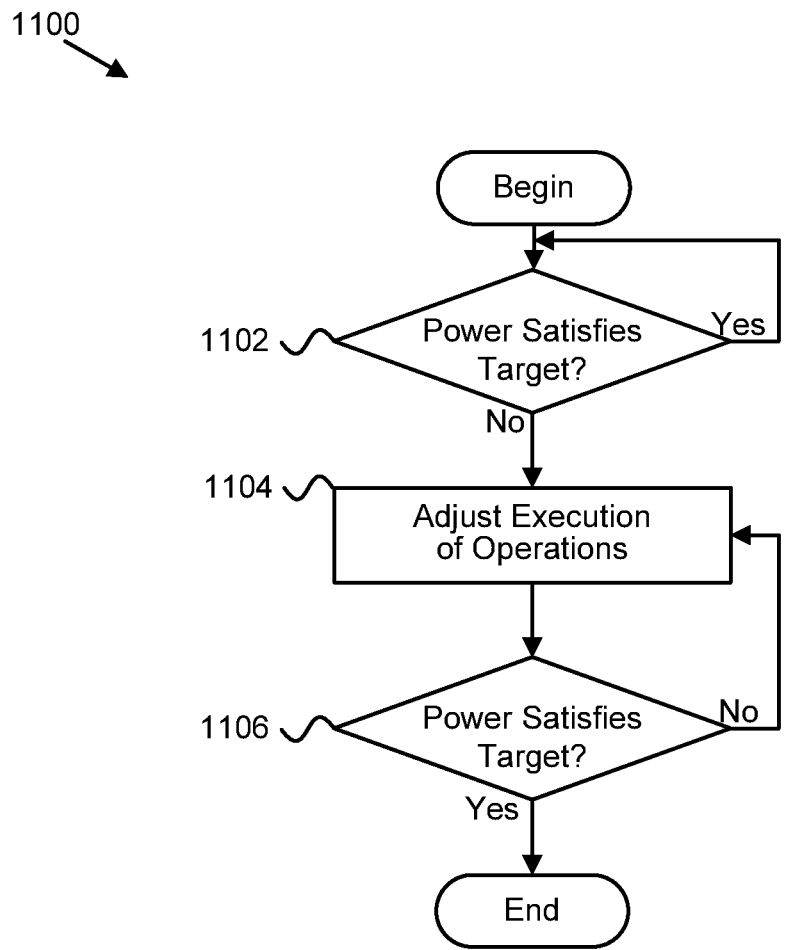
FIG. 11 is a schematic flow chart diagram illustrating one embodiment of a method for managing power consumption in a storage device.

FIG. 11 depicts one embodiment of a method 1100 for managing power consumption in a storage device 102. The method 1100 begins, and the audit module 616 monitors 1102 a power consumption rate of the data storage device 102 relative to a power consumption target. In the depicted embodiment, if the audit module 616 determines 1102 that the power consumption rate satisfies the power consumption target, the audit module 616 continues to monitor 1102 the power consumption rate of the storage device 102.

In the depicted embodiment, if the audit module 616 determines 1102 that the power consumption rate fails to satisfy the power consumption target, the throttle module 622 adjusts 1104 execution of one or more operations on the storage device 102. The verification module 624, in the depicted embodiment, verifies 1106 whether the power consumption rate of the storage device 102 satisfies the power consumption target in response to the throttle module 622 adjusting 1104 execution of operations.

In the depicted embodiment, if the verification module 624 determines 1106 that the power consumption rate fails to satisfy the power consumption target, the throttle module 622 readjusts 1104 execution of operations on the storage device 102 and the method 1100 continues. If the verification module 624, in the depicted embodiment, verifies 1106 that the power consumption rate satisfies the power consumption target, the method 1100 returns to the monitoring step 1102, and the audit module 616 continues to monitor 1102 the power consumption rate of the data storage device 102 relative to the power consumption target.

Figure 12:
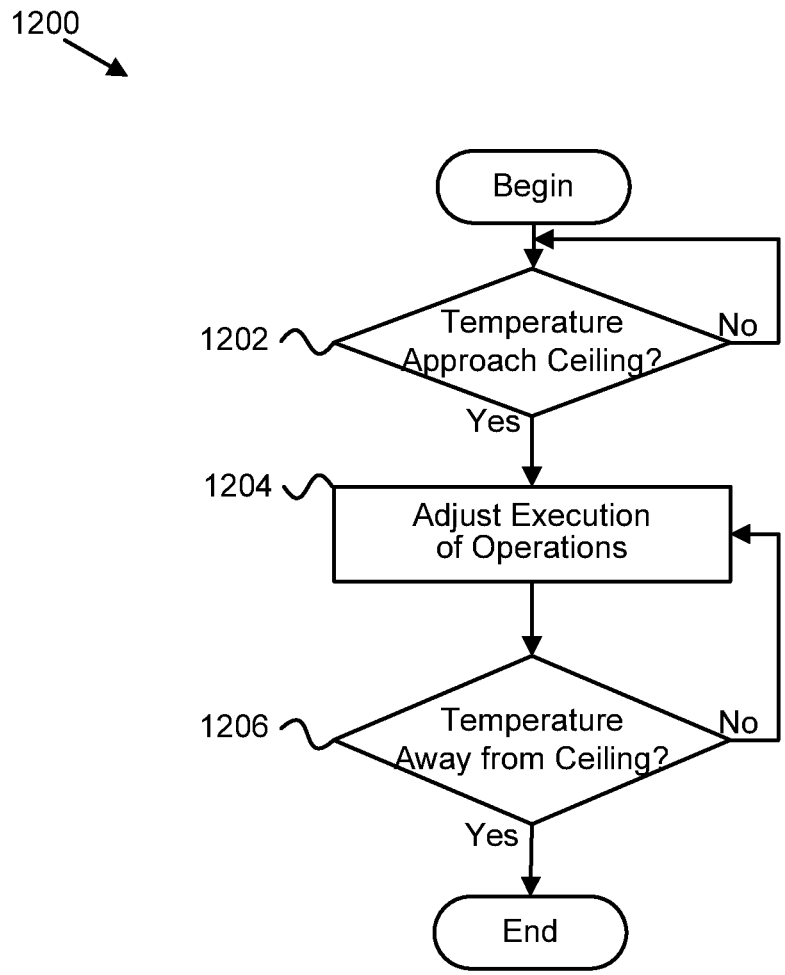
FIG. 12 is a schematic flow chart diagram illustrating one embodiment of a method for managing a thermal state of a storage device.

FIG. 12 depicts one embodiment of a method 1200 for managing a thermal state of a storage device 102. The method 1200 begins, and the audit module 616 monitors 1202 a temperature for the data storage device 102 relative to a thermal ceiling. In the depicted embodiment, if the audit module 616 determines 1202 that the temperature is not approaching the thermal ceiling, the audit module 616 continues to monitor 1202 the temperature for the storage device 102.

In the depicted embodiment, if the audit module 616 determines 1202 that the temperature is approaching the thermal ceiling, the throttle module 622 adjusts 1204 execution of one or more operations on the storage device 102. The verification module 624, in the depicted embodiment, verifies 1206 whether the temperature for the storage device 102 is moving away from the thermal ceiling in response to the throttle module 622 adjusting 1204 execution of operations.

In the depicted embodiment, if the verification module 624 determines 1106 that the temperature for the storage device 102 is not moving away from the thermal ceiling, the throttle module 622 readjusts 1204 execution of operations on the storage device 102 and the method 1200 continues. If the verification module 624, in the depicted embodiment, verifies 1206 that the temperature is moving away from the thermal ceiling, the method 1200 returns to the monitoring step 1202, and the audit module 616 continues to monitor 1102 the temperature for the data storage device 102 relative to the thermal ceiling.

Figure 13:
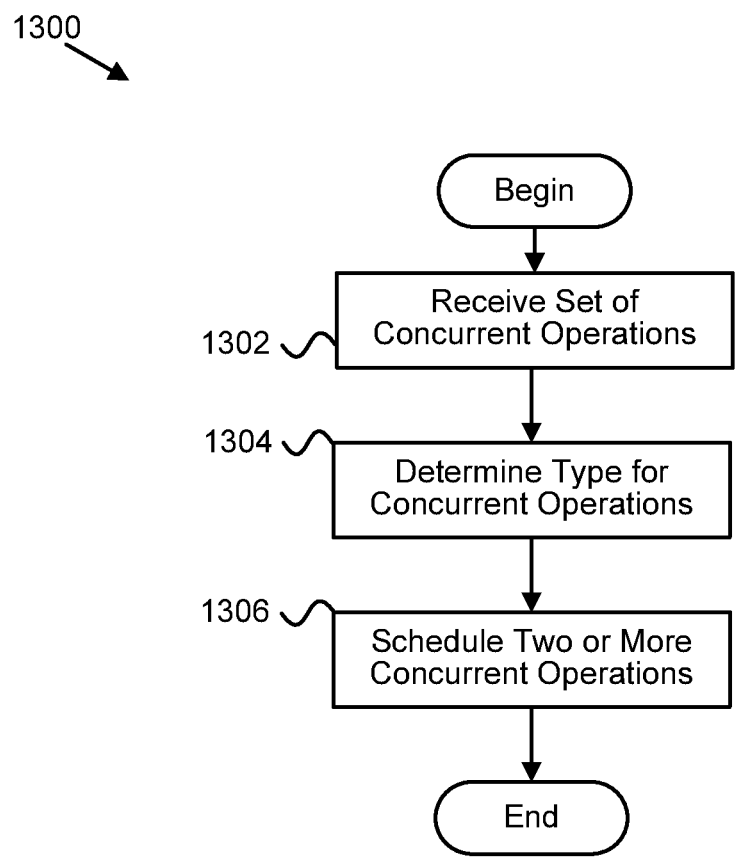
FIG. 13 is a schematic flow chart diagram illustrating another embodiment of a method for managing power consumption in a storage device.

FIG. 13 depicts another embodiment of a method 1300 for managing power consumption in a storage device 102. The method 1300 begins and the schedule module 612 receives 1302 a set of concurrent operations for execution on the storage device 102. The schedule module 612, in the depicted embodiment, determines 1304 a type for at least two operations in the set of concurrent operations. In a further embodiment, the schedule module 612 may determine 1304 types for each operation in the set of concurrent operations.

The schedule module 612, in the depicted embodiment, schedules 1306 two or more concurrent operations from the set of concurrent operations based on the type of the operations and the method ends. The two or more scheduled 1306 concurrent operations, in one embodiment, have the same type. In a further embodiment, the two or more scheduled 1306 concurrent operations have a plurality of types.

In various embodiments, the method 1100 of FIG. 11, the method 1200 of FIG. 12, and/or the method 1300 of FIG. 13 may be combined into a single system, method, or apparatus. For example, in one embodiment, the method 1200 for managing a thermal state of a storage device 102 may be used in conjunction with the method 1100 and/or the method 1300 for managing power consumption in the same storage device 102. In another embodiment, the method 1100 may be used to manage power consumption of one or more types of operations on a storage device 102, while the method 1300 may be used to manage power consumption for one or more other types of operations on the same storage device 102. For example, the method 1100 may manage power consumption for write or program operations and the method 1300 may be used to manage power consumption for erase operations, or the like. In view of this disclosure, one of skill in the art will recognize other combinations of the methods 1100, 1200, 1300 for managing power consumption and/or a thermal state of a storage device 102.

Figure 14:
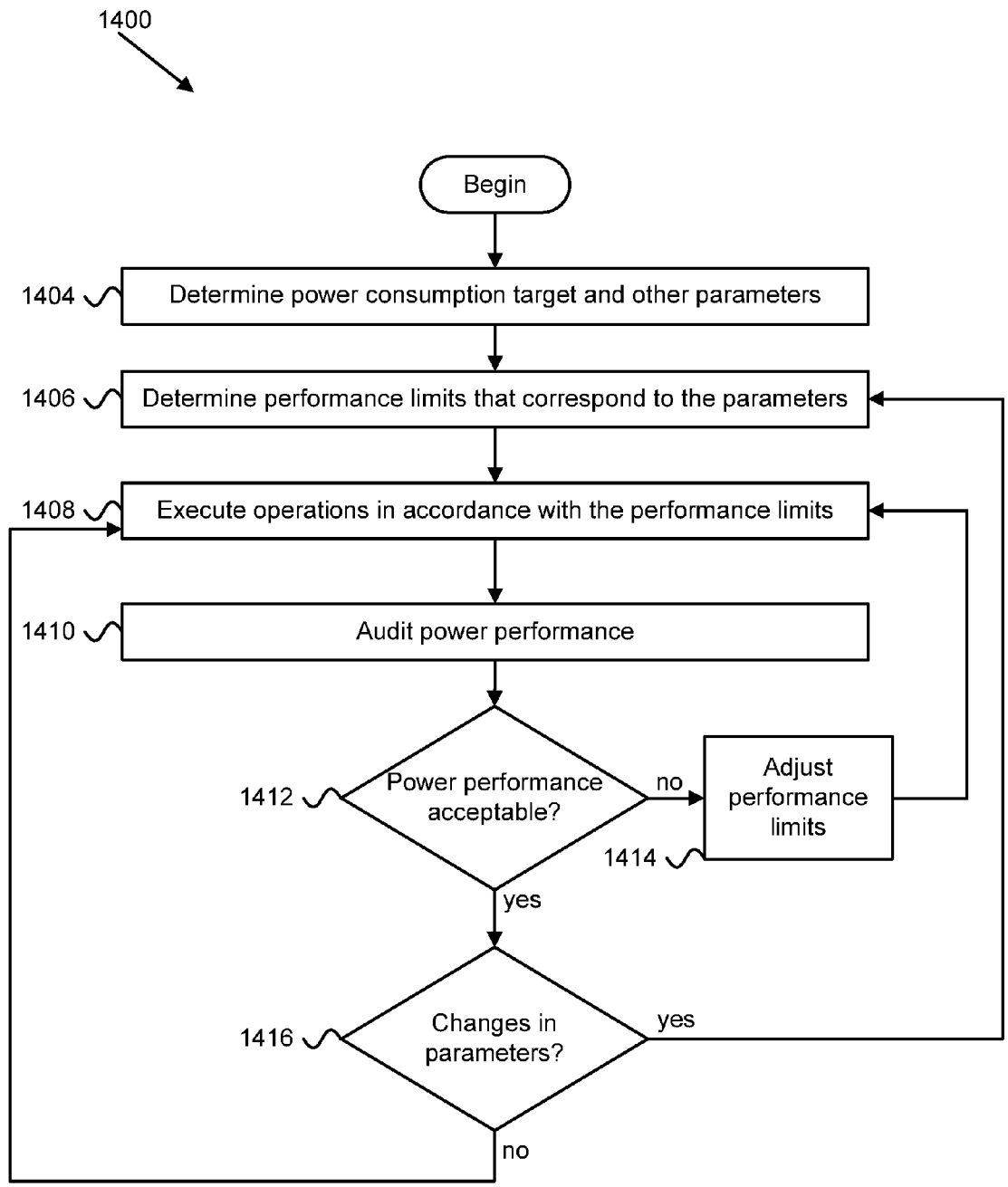
FIG. 14 is a schematic flow chart diagram illustrating one embodiment of a method for managing power consumption of a component.

FIG. 14 shows one embodiment of a method 1400 for relating a power consumption target with operation adjustments or other performance limits. The method 1400 begins with determining 1404 a power consumption target and any other parameters that may be necessary for determining the amount of power to be consumed by components 530 and how that power will be allocated among the components 530. In one embodiment, this is done by the computing system 114 and is done with user input. In some embodiments, the master module 618 determines one or more of the parameters. The parameters may be set based on user input, loaded from a predetermined source (such as the BIOS), some combination thereof, or through another approach. As noted above, the parameters may be communicated using a power protocol that enables sharing this information. As noted above, in certain embodiments, the parameters are not received from sources external to the component 530; the parameters may be available locally on the component 530 such that the target module 610 retrieves the locally saved parameters. The retrieval may be done, for example, during start up of the component 530.

The method also includes determining 1406 the performance limits that correspond to the power consumption target and the other parameters. In certain embodiments, the operations module 614 determines which performance limits correspond to the parameters. In certain embodiments, the performance limits are specified in terms of timing and/or polling values that slow the execution of operations 702 on the component 530. The performance limits may be specified in terms of the energy requirements and time requirements for particular operations 702. As discussed above, each operation may be defined as taking a certain amount of time and using a certain amount of energy during that time. Operations may also be defined in terms of quanta. Those in the art will appreciate other approaches to setting performance limits for a component 530.

The method may also include executing 1408 the operations 702 on the component 530 in accordance with the performance limits. In one embodiment, the schedule module 612 schedules the operations 702 such that the operations 702 are executed in accordance with the performance limits, as described above. In certain embodiments, the performance limits decrease the performance and bandwidth of the component 530; in other embodiments, the performance limits may be sufficiently high that the performance of the component 530 is not affected.

As a result, the component 530 executes operations 702 in such a way that the power used by the component 530 is sufficiently close to the power consumption target. In certain embodiments, the method also includes auditing 1010 the power performance of the component 530. The audit module 616 may audit the device and compare the actual power consumption of the component 530 with the projected power consumption at the particular performance limits being used. If the audit module 616 determines 1012 that the actual power consumption of the component 530 is sufficiently close to the projected power consumption, the power performance is deemed acceptable. The audit module 616 may allow some tolerance of variations above the power consumption target. If the power performance is unacceptable (for example, the actual power consumption is too far above or below the projected power consumption) the audit module 616 may adjust 1014 the performance limits for the component 530 to more accurately reflect the power performance of the component 530.

The method may also include determining 1416 whether or not there are any changes in the parameters. As noted above, the parameters (such as the power consumption target) may be altered dynamically by the computing system 114, the power management apparatus 122 in the system, or others. If the parameters are altered, the method begins again with determining 906 the performance limits that correspond to the changed parameters. The performance of the component 530 may thus be changed dynamically to account for changes in the demands on the component 530, user preference, and other changes.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method to manage power consumption in a data storage device, the method comprising:
monitoring a power consumption rate of a data storage device relative to a power consumption target;
adjusting execution of one or more operations on the data storage device in response to the power consumption rate of the data storage device failing to satisfy the power consumption target by reducing a frequency with which the one or more operations execute on the data storage device;
verifying whether the power consumption rate of the data storage device satisfies the power consumption target in response to adjusting the execution of the one or more operations; and
wherein the reducing the frequency with which one or more operations execute comprises setting a timer value specifying a frequency with which hardware of the data storage device polls to verify that an operation has completed.

2. The method of claim 1, wherein the power consumption target comprises a power consumption ceiling defining an allowed upper bound for the power consumption rate of the data storage device, and wherein failing to satisfy the power consumption target comprises the power consumption rate approaching the power consumption ceiling.

3. The method of claim 1, further comprising readjusting execution of one or more subsequent operations on the data storage device in response to verifying that the power consumption rate fails to satisfy the power consumption target in response to adjusting the execution of the one or more operations.

4. The method of claim 1, further comprising,
monitoring a temperature for the data storage device relative to a thermal ceiling;
adjusting execution of the one or more operations on the data storage device in response to the temperature approaching the thermal ceiling; and
verifying whether the temperature is moving away from the thermal ceiling in response to adjusting the execution of the one or more operations.

5. The method of claim 4, further comprising combining the adjustment of execution of the one or more operations in response to the power consumption rate with the adjustment of execution of the one or more operations in response to the temperature into a single adjustment.

6. The method of claim 1, wherein the data storage device comprises a nonvolatile solid-state storage device and the timer value comprises a tPROG time specifying a period of time between submitting a program command to a memory area of the data storage device and submitting a status command to the same memory area of the data storage device to verify that execution of the program command has completed.

7. The method of claim 1, wherein reducing the frequency with which the one or more operations execute comprises setting a timer value specifying a frequency with which the one or more operations are submitted to the data storage device for execution.

8. The method of claim 1, wherein the power consumption target comprises a number of quanta that defines an amount of energy to be used during a period of time and the one or more operations on the data storage device are assigned quanta based on an amount of energy used to perform an operation.

9. The method of claim 8, wherein adjusting the execution of the one or more operations comprises scheduling the one or more operations based on the assigned quanta.

10. The method of claim 9, wherein each operation of the one or more operations is divided into time periods and each time period of the operation is assigned one or more quanta based on an amount of energy used to perform the operation during the time period.

11. The method of claim 1, wherein adjusting execution of the one or more operations comprises selecting operations from one or more queues of operations to be executed such that an amount of energy used to execute the selected operations satisfies the power consumption target.

12. A method to manage a thermal state of a data storage device, the method comprising:
  monitoring a temperature for a data storage device relative to a thermal ceiling;
  adjusting execution of one or more operations on the data storage device in response to the temperature approaching the thermal ceiling by reducing a frequency with which the one or more operations execute on the data storage device;
  verifying whether the temperature is moving away from the thermal ceiling in response to adjusting the execution of the one or more operations; and
  wherein the reducing the frequency with which one or more operations execute comprises setting a timer value specifying a frequency with which hardware of the data storage device polls to verify that an operation has completed.

13. The method of claim 12, further comprising readjusting execution of one or more subsequent operations on the data storage device in response to verifying that the temperature fails to move away from the thermal ceiling in response to adjusting the execution of the one or more operations.

14. The method of claim 12, further comprising,
  monitoring a power consumption rate of the data storage device relative to a power consumption target;
  adjusting execution of the one or more operations on the data storage device in response to the power consumption rate of the data storage device failing to satisfy the power consumption target; and
  verifying whether the power consumption rate of the data storage device satisfies the power consumption target in response to adjusting the execution of the one or more operations.

15. The method of claim 14, further comprising combining the adjustment of execution of the one or more operations in response to the temperature with the adjustment of execution of the one or more operations in response to the power consumption rate into a single adjustment.

16. A system to manage power consumption in a plurality of data storage devices, the system comprising:
  a plurality of data storage devices receiving electric power from a power source;
  one or more audit modules configured to monitor a power consumption rate of at least one of the plurality of data storage devices relative to a power consumption target;
  one or more throttle modules configured to adjust execution of operations on the plurality of data storage devices in response to the power consumption rate of the at least one of the plurality of data storage devices failing to satisfy the power consumption target by reducing a frequency with which the operations execute on the data storage device;
  one or more verification modules configured to verify whether the power consumption rate of the at least one of the plurality of data storage devices satisfies the power consumption target in response to adjusting the execution of the operations; and
  wherein the one or more throttle modules are further configured to reduce the frequency with which the operations execute by setting a timer value specifying a frequency with which hardware of the data storage device polls to verify that one of the operations has completed.

17. The system of claim 16, wherein the one or more throttle modules adjust execution of the operations substantially identically for each of the plurality of data storage devices in response to the power consumption rate of a single one of the plurality of data storage devices failing to satisfy the power consumption target.

18. The system of claim 16, wherein the power consumption target comprises a system power consumption target for the plurality of data storage devices and the one or more throttle modules adjust execution of the operations on each of the plurality of data storage devices dynamically such that a total power consumption rate of the plurality of data storage devices satisfies the system power consumption target.

19. The system of claim 16, wherein,
  the one or more audit modules are further configured to monitor temperatures of the plurality of data storage devices relative to a thermal ceiling;
  the one or more throttle modules are further configured to adjust execution of the operations on a data storage device from the plurality of data storage devices in response to the temperature of the data storage device from the plurality of data storage devices approaching the thermal ceiling; and
  the one or more verification modules further configured to verify whether the temperature of the data storage device from the plurality of data storage devices is moving away from the thermal ceiling in response to adjusting the execution of the operations.

20. The system of claim 19, wherein the one or more throttle modules adjust execution of the operations substantially identically for each of the plurality of data storage devices in response to the power consumption rate of the at least one of the plurality of data storage devices failing to satisfy the power consumption target and adjust execution of the one or more operations independently for each individual data storage device of the plurality of data storage devices in response to the temperature of the corresponding individual data storage device approaching the thermal ceiling.

21. A system to manage thermal states for a plurality of data storage devices, the system comprising:
  a plurality of data storage devices;
  one or more audit modules configured to monitor a temperature of at least one of the plurality of data storage devices relative to a thermal ceiling;
  one or more throttle modules configured to adjust execution of operations on the plurality of data storage devices in response to the temperature of the at least one of the plurality of data storage devices approaching the thermal ceiling by reducing a frequency with which the operations execute on the data storage device;
  one or more verification modules configured to verify whether the temperature of the at least one of the plurality of data storage devices is moving away from the thermal ceiling in response to adjusting the execution of the operations; and
  wherein the one or more throttle modules are further configured to reduce the frequency with which the operations execute by setting a timer value specifying a frequency with which the hardware of the data storage device polls to verify that one of the operations has completed.

22. The system of claim 21, wherein, the one or more audit modules are further configured to monitor a power consumption rate of one or more of the plurality of data storage devices relative to a power consumption target;

the one or more throttle modules are further configured to adjust execution of the operations on the plurality of data storage devices in response to the power consumption rate of the one or more of the plurality of data storage devices failing to satisfy the power consumption target; and the one or more verification modules further configured to verify whether the power consumption rate of the one or more of the plurality of data storage devices satisfies the power consumption target in response to adjusting the execution of the operations.

\* \* \* \* \*